(12) United States Patent  
Zhu

(10) Patent No.: US 11,361,799 B2  
(45) Date of Patent: Jun. 14, 2022

(54) SEMICONDUCTOR MEMORY DEVICE, METHOD OF MANUFACTURING THE SAME, AND ELECTRONIC DEVICE INCLUDING THE SEMICONDUCTOR MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 232 days.

(21) Appl. No.: 16/957,468

(22) PCT Filed: Sep. 21, 2018

(86) PCT No.: PCT/CN2018/107021  
§ 371 (c)(1),  
(2) Date: Jun. 24, 2020

(87) PCT Pub. No.: WO2020/042253  
PCT Pub. Date: Mar. 5, 2020

(65) Prior Publication Data  
US 2021/0074334 A1 Mar. 11, 2021

(30) Foreign Application Priority Data  
Aug. 28, 2018 (CN) .......................... 201810992029.0

(51) Int. Cl.  
*G11C 5/06* (2006.01)  
*H01L 27/11556* (2017.01)  
(Continued)

(52) U.S. Cl.  
CPC .............. *G11C 5/063* (2013.01); *G11C 16/08* (2013.01); *G11C 16/24* (2013.01);  
(Continued)

(58) Field of Classification Search  
CPC ......... G11C 5/063; G11C 16/08; G11C 16/24; G11C 7/12; G11C 8/14; H01L 29/0649;  
(Continued)

(56) References Cited

U.S. PATENT DOCUMENTS

| 8,503,213 B2 * | 8/2013 | Chen ................. H01L 27/11578 365/185.17 |
| 2013/0161730 A1 * | 6/2013 | Pan .................... H01L 27/10876 257/E27.06 |
| 2016/0049201 A1 * | 2/2016 | Lue ................... H01L 27/11551 365/185.11 |

FOREIGN PATENT DOCUMENTS

| CN | 101090117 A | 12/2007 |
| CN | 101673744 A | 3/2010 |
| CN | 106992182 A | 7/2017 |

\* cited by examiner

*Primary Examiner* — Galina G Yushina  
(74) *Attorney, Agent, or Firm* — Christensen, Fonder, Dardi & Herbert PLLC

(57) ABSTRACT

A semiconductor memory device including a substrate; an array of memory cells arranged in rows and columns on the substrate, each memory cell comprising a vertical pillar-shaped active region having upper and lower source/drain regions and a channel region, and a gate stack formed around the channel region; a plurality of bit lines on the substrate, each bit line located below a column of memory cells and electrically connected to the lower source/drain regions of the memory cells; and a plurality of word lines on the substrate, each word line extending in a row direction and connected to gate conductors of the memory cells in a row of memory cells, each word line comprising first (Continued)

portions extending along peripheries of the memory cells and second portions extending between the first portions, the first portions of the word line extending in a conformal manner with sidewalls of the upper source/drain regions.

52 Claims, 42 Drawing Sheets

(51) Int. Cl.
*H01L 27/11582* (2017.01)
*H01L 29/06* (2006.01)
*H01L 29/78* (2006.01)
*G11C 16/08* (2006.01)
*G11C 16/24* (2006.01)
*H01L 27/11524* (2017.01)
*H01L 27/11529* (2017.01)
*H01L 27/1157* (2017.01)
*H01L 27/11573* (2017.01)

(52) U.S. Cl.
CPC .... *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01); *H01L 29/0649* (2013.01); *H01L 29/7827* (2013.01)

(58) Field of Classification Search
CPC ........... H01L 29/7827; H01L 27/11582; H01L 27/115297; H01L 27/10873; H01L 27/11526; H01L 27/11592; H01L 27/11524; H01L 27/11529; H01L 27/11556; H01L 27/2257; H01L 27/11573
See application file for complete search history.

SEMICONDUCTOR MEMORY DEVICE, METHOD OF MANUFACTURING THE SAME, AND ELECTRONIC DEVICE INCLUDING THE SEMICONDUCTOR MEMORY DEVICE

CROSS-REFERENCE TO RELATED APPLICATION(S)

This application is a U.S. national phase application of PCT Application No. PCT/CN2018/107021, filed on Sep. 21, 2018, entitled "SEMICONDUCTOR STORAGE DEVICE AND MANUFACTURING METHOD THEREFOR, AND ELECTRONIC DEVICE COMPRISING STORAGE DEVICE" which claims priority to Chinese Patent Application No. 201810992029.0, filed on Aug. 28, 2018, entitled "SEMICONDUCTOR MEMORY DEVICE, METHOD OF MANUFACTURING THE SAME, AND ELECTRONIC DEVICE INCLUDING THE SEMICONDUCTOR MEMORY DEVICE", which are incorporated herein by reference in their entirety.

TECHNICAL FIELD

The present disclosure relates to the field of semiconductors, and more particularly, to a semiconductor memory device based on a vertical device, a method of manufacturing the same, and an electronic device including the semiconductor memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device. A nanowire or nano sheet Vertical Gate-all-around Field Effect Transistor (V-GAAFET) is one of candidates for future integrated devices with high performance and high density.

However, for the vertical device, it is difficult to control a gate length thereof, especially for one with a single-crystalline channel material. In addition, it is difficult to build a buried bit line below a vertical transistor, and it is also difficult to form bit lines with high density. Further, in an array of memories, word lines and bit lines still have large footprints.

SUMMARY

In view of the above, the present disclosure aims to provide, among others, a semiconductor memory device, a method of manufacturing the same, and an electronic device including the semiconductor memory device, which have improved characteristics.

According to an aspect of the present disclosure, there is provided a semiconductor memory device, comprising: a substrate; an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region between the source/drain regions, and each of the memory cells further comprises a gate stack formed around a corresponding channel region; a plurality of bit lines formed on the substrate, wherein each of the bit lines is located below a corresponding one of the columns of memory cells and is electrically connected to the lower source/drain regions of the respective memory cells in the corresponding column; and a plurality of word lines formed on the substrate, wherein each of the word lines extends in a row direction and is electrically connected to gate conductors in the gate stacks of the respective memory cells in a corresponding row of memory cells, wherein each of the word lines comprises first portions extending along peripheries of the respective memory cells in the corresponding row of memory cells and second portions extending between the respective first portions, wherein the first portions of the word line extend in a substantially conformal manner with at least a portion of sidewalls of at least the upper source/drain regions of the respective memory cells.

According to another aspect of the present disclosure, there is provided a method of manufacturing a semiconductor memory device, comprising: providing a stack of a sacrificial layer, a first source/drain layer, a channel layer, a second source/drain layer and a hard mask layer on a substrate; patterning the stack to define a plurality of pillar-shaped active regions arranged in rows and columns in the first source/drain layer, the channel layer and the second source/drain layer; removing the sacrificial layer and forming a plurality of bit lines extending below respective columns of active regions in a space left due to the removal of the sacrificial layer; forming gate stacks around a periphery of the channel layer; forming a dielectric layer on the substrate to fill gaps in the stack; and forming a plurality of word lines in the dielectric layer, wherein each of the word lines extends in a row direction and is electrically connected to gate conductors in gate stacks of respective memory cells in a corresponding row of memory cells, wherein each of the word lines comprises first portions extending along peripheries of the respective memory cells in the corresponding row of memory cells and second portions extending between the respective first portions, wherein the first portions of the word line extend in a substantially conformal manner with at least a portion of sidewalls of at least the upper source/drain regions of the respective memory cells.

According to yet another aspect of the present disclosure, there is provided an electronic device comprising the semiconductor memory device described above.

The semiconductor memory device according to embodiments of the present disclosure is based on vertical devices such as V-GAAFETs. The active region, particularly the channel region therein, may include a single-crystalline semiconductor material, and thus may have high mobility of carriers and low leakage current, thereby improving the device performance. The word lines may be formed between respective rows of memory cells in a conformal manner with the rows of memory cells, which may save area. In addition, buried bit lines may be formed below the active regions. The configuration of the buried bit lines facilitates an integration of the vertical device and thus saves area.

According to embodiments of the present disclosure, at least one of the buried bit lines and the word lines may be formed in a self-alignment manner. This can facilitate manufacturing process and helps to save the area.

BRIEF DESCRIPTION OF THE DRAWINGS

The above and other objects, features, and advantages of the present disclosure will become more apparent from following descriptions on embodiments thereof with reference to attached drawings, in which.

Throughout the attached drawings, the same or similar reference numbers denote the same or similar elements.

DETAILED DESCRIPTION

Figure 1:
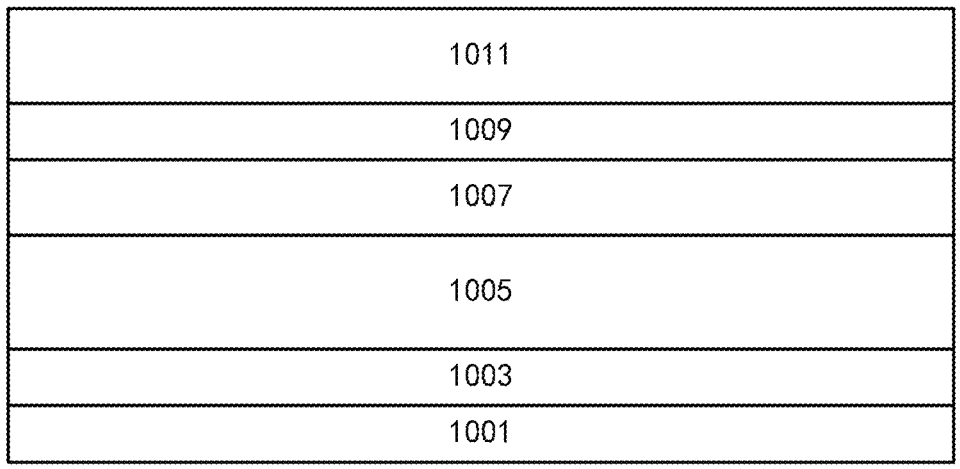
FIGS. 1-23(b) are schematic views showing a flow of manufacturing a semiconductor memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be provided directly on the further layer/element, or otherwise there may be an intervening layer/element interposed therebetween. Further, if a layer/element is "on" a further layer/element in an orientation, then the layer/element can be "under" the further layer/element when the orientation is turned.

A semiconductor memory device according to an embodiment of the present disclosure is based on vertical devices. The vertical device may include a pillar-shaped (for example, cylindrical or hexahedral, i.e., having a circular or quadrangular, such as square or rectangular sectional view) active region which extends vertically. When the active region has a small diameter or side length, such a vertical device may constitute a nano V-GAAFET. The active region each may include source/drain regions at upper and lower ends respectively and a channel region between the source/drain regions.

According to an embodiment of the present disclosure, the active region may be provided by epitaxial growth. The source/drain regions and the channel region may advantageously be provided by different semiconductor layers. For example, a first source/drain layer, a channel layer, and a second source/drain layer may be grown respectively to have the lower source/drain region, the channel region, and the upper source/drain region formed therein, respectively. The respective layers may be contiguous to each other, although there may also be other semiconductor layers therebetween, for example, a leakage suppression layer or an On current enhancement layer (i.e., a semiconductor layer having a band gap greater than or less than that of adjacent layers). There may be a clear crystal interface between at least one pair of the adjacent layers, because they are epitaxially grown separately. In addition, the respective layers may be doped respectively so that there may be a doping concentration interface between the at least one pair of the adjacent layers.

According to an embodiment of the present disclosure, the channel layer or the channel region may include single-crystalline semiconductor material to improve the device performance. Certainly, the source/drain layers or the source/drain regions may also include single-crystalline semiconductor material. Thus, the entire active region may be made of single-crystalline semiconductor material(s). The single-crystalline semiconductor material of the channel layer or the channel region and the single-crystalline semiconductor material of the source/drain layers or the source/drain regions may be a cocrystal. Mobility of electrons or holes in the single-crystalline semiconductor material of the channel layer or the channel region may be greater than that of the first and second source/drain layers or the first and second source/drain regions. Further, a forbidden band gap of the first and second source/drain layers or the first and second source/drain regions may be greater than that of the single-crystalline semiconductor material of the channel layer or the channel region.

According to an embodiment of the present disclosure, the single-crystalline semiconductor material of the channel layer or the channel region may have the same crystal structure as the first and second source/drain layers or the first and second source/drain regions. In this case, a lattice constant of the first and second source/drain layers or the first and second source/drain regions without being strained may be greater than that of the single-crystalline semiconductor material of the channel layer or the channel region without being strained. Thus, mobility of carriers in the single-crystalline semiconductor material of the channel layer or the channel region may be greater than the mobility of carriers therein if without being strained, or an effective mass of lighter carriers in the single-crystalline semiconductor material of the channel layer or the channel region may be less than the effective mass of lighter carriers therein if without being strained, or a concentration of the light carriers in the single-crystalline semiconductor material of the channel layer or the channel region may be greater than the concentration of the light carriers therein if without being strained. Alternatively, the lattice constant of the first and second source/drain layers or the first and second source/drain regions without being strained may be less than that of the single-crystalline semiconductor material of the channel layer or the channel region without being strained. Thus, mobility of electrons in the single-crystalline semiconductor material of the channel layer or the channel region may be greater than if without being strained, or an effective mass of electrons in the single-crystalline semiconductor material of the channel layer or the channel region may be less than the effective mass of electrons if without being strained, for example, when a <110> direction of the single-crystalline semiconductor material of the channel layer is parallel to a current density vector between the source and the drain.

The vertical device may further comprise a gate stack formed around a periphery of the active region, particularly the channel region. The gate stack is formed in a self-alignment manner. A gate length may be determined by a thickness of the channel region itself, rather than the time-consuming etching as in the conventional art. As described above, the channel layer having the channel region formed therein may be formed by epitaxial growth, and thus the thickness thereof can be well controlled. Therefore, the gate length can be well controlled. The gate stack may be substantially coplanar with the channel layer (channel region). In this way, overlapping of the gate stack with the source/drain regions may be reduced or even avoided, which helps to reduce parasitic capacitance between the gate and the source/drain. According to an embodiment of the present disclosure, the channel layer may include a semiconductor material different from that of the first and second source/drain layers, and the first and second source/drain layers may include the same semiconductor material.

According to an embodiment of the present disclosure, the vertical device may be a conventional Field Effect Transistor (FET). In a case of the conventional FET, the source and drain regions may have the same conductivity type of doping (for example, n-type doping or p-type doping). A conduction channel may be formed by the channel region between the source and drain regions at opposite ends of the channel region. Alternatively, such a semiconductor device may be a tunneling FET. In a case of the tunneling FET, the source and drain regions on the opposite sides of the channel region may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conductive mechanisms, they both exhibit an electrical property that the gate controls whether there is a conduction or not between the source and drain regions. Therefore, for both the conventional FET and the tunneling FET, descriptions are made by collectively using the terms "source/drain layer (source/drain region)" and "channel layer (channel region)", although there is no common "channel" in the tunneling FET.

Such a vertical device may act as a switch device in a memory cell, and the memory cell may further include a storage element (for example, a capacitor) connected to the switch device (resulting in, for example, a 1T1C configuration). Alternatively, the memory cell may be entirely based on the vertical device. For example, the gate stack may include a memory configuration such as a floating gate configuration or a charge trapping layer or a ferro-electric material or the like. Those skilled in the art can conceive of other memory cell configurations. Such memory cells may be arranged in an array in rows and columns. The memory cells based on vertical devices are relatively easy for three dimension (3D) integration. In particular, planar arrays of memory cells may be stacked in multiple layers so as to form a 3D array of memory cells. Those memory cells may constitute a Dynamic Random Access Memory (DRAM).

According to an embodiment of the present disclosure, bit lines may be buried below the active regions, more specifically, below the lower source/drain regions. For example, each of the bit lines may extend along a direction of a corresponding one of the columns of memory cells to be aligned with the lower source/drain regions of the respective memory cells in the corresponding column. This configuration facilitates electrical connection of the bit line to the lower source/drain regions of the memory cells. For example, the memory cells may have their respective active regions directly stacked on the corresponding bit line, and thus the lower source/drain regions thereof are in direct contact with the bit line and therefore electrically connected to the bit line. This configuration of the buried bit lines facilitates the integration of the memory cells.

According to an embodiment of the present disclosure, the bit lines may be formed based at least partly on a self-alignment technique. For example, lower portions of lower source/drain regions of the respective memory cells in the same column of memory cells may extend integrally, and bit lines are formed by a metal semiconductor compound which is produced by a reaction of a surface portion of the lower portions with a metal element. The bit lines do not occupy extra area because the bit lines are aligned below the memory cells.

According to an embodiment of the present disclosure, the word lines may also be formed in a self-alignment manner. More specifically, the word lines may extend in a direction of a row of memory cells. Each of the word lined may comprise first portions extending along a periphery of a memory cell in a corresponding row of memory cells and second portions extending between the respective first portions. The first portions may extend substantially in a conformal manner with at least a portion of sidewalls of at least upper source/drain regions of the respective memory cells. Due to this conformal manner, the word lines can be better aligned with the respective rows of memory cells. Thus, the word lines may not occupy extra area. The gate stacks, particularly gate conductors therein, may comprise extensions extending towards corresponding word lines, and the word lines may extend downwards to be in contact with the gate stacks, particularly the gate conductors therein, so as to be electrically connected to the gate conductors.

According to an embodiment of the present disclosure, such conformal word lines are formed along memory cells in a corresponding row of memory cells, for example. For effective electrical isolation, isolation layers may further be provided between the respective word lines and memory cells in the respective rows of memory cells. The word lines may extend at least partially in a conformal manner with the respective isolation layers. As a favorable conformal implementation, at least one of each of the word lines and each of the isolation layers may be in a form of spacer. A first portion of each of the word lines may extend substantially in a conformal manner around at least a portion of sidewalls of upper source/drain regions of corresponding memory cells. In particular, in a case where a spacing between the respective columns of memory cells is less than a spacing between the respective rows of memory cells, each of the word lines may even completely surround at least the sidewalls of the upper source/drain regions of the corresponding memory cells.

Each row of memory cells may have at least one corresponding word line. For example, each row of memory cells may have one corresponding word line formed on one side thereof, or may have two (parallel) word lines formed on opposite sides thereof. Due to the conformal manner, word lines between rows of memory cells may appear in pairs. For example, between at least one pair of adjacent rows of memory cells, there may be two word lines respectively corresponding to two rows of memory cells in each of the at least one pair of adjacent rows of memory cells. Certainly, there may be no word line between certain adjacent rows of memory cells. For example, when a row of memory cells has only one word line on one side thereof, there may be no word line on the other side of the row of memory cells.

Such a semiconductor memory device may be manufactured, for example, as follows. Unlike in the conventional art, a bit line layer is not firstly formed on a substrate, since it is difficult to obtain channel regions or a channel layer of a single-crystalline material on a bit line layer of a conductive material (for example, metal). To this end, according to an embodiment of the present disclosure, a stack of a sacrificial layer, a first source/drain layer, a channel layer, a second source/drain layer and a hard mask layer may be provided on a substrate. Here, the hard mask layer is provided for convenience of patterning. For example, the stack may be provided by epitaxial growth. Thus, the channel layer may be formed of a single-crystalline material (Certainly, the source/drain layers may also be formed of a single-crystalline material).

Active regions may be defined in the stack, particularly in the first source/drain layer, the channel layer, and the second source/drain layer. For example, the hard mask layer, the second source/drain layer, the channel layer and the first source/drain layer may be selectively etched in sequence into a desired shape. In general, the active regions may be in a pillar (for example, cylindrical or hexahedral) shape. In order to form the array of memory cells, an array of pillar-shaped active regions arranged in rows and columns may be defined.

The underlying sacrificial layer may be exposed between the active regions. The sacrificial layer may be removed to form bit lines extending below the respective columns of active regions in a space left due to the removal of the sacrificial layer. For example, the sacrificial layer may be removed, a conductive material may be filled in the space left due to the removal of the sacrificial layer, and the conductive material may be patterned into a plurality of bit lines. In this way, buried bit lines may be formed.

According to an embodiment of the present disclosure, a conductive metal semiconductor compound may be produced by a reaction of a semiconductor element in active regions, particularly in the underlying first source/drain layer, with a metal element, to form bit lines. In order to ensure that the bit lines extend continuously below the respective columns of active regions, when the first source/drain layer is patterned, it may be patterned into a plurality of strips which correspond to the respective columns of active regions and extend continuously.

In this case, for the first source/drain layer, on the one hand, lower source/drain regions of the respective memory cells need to be formed, and on the other hand, continuous strips corresponding to the respective columns need to be formed. Therefore, the patterning of the first source/drain layer may be performed in different steps. For example, upper portions of the first source/drain layer may be patterned using a mask defining the array, and the lower portions of the first source/drain layer may be patterned using a mask defining the bit lines.

Patterning of the lower portions of the first source/drain layer may be performed in a self-alignment manner. In this case, a mask layer may be formed on the stack, wherein the mask layer comprises a plurality of openings extending in the column direction. The respective openings expose regions between the respective columns of active regions, and expose partially opposing sidewalls of portions of the hard mask layer on active regions in adjacent columns of active regions. Due to the exposure of the portion of the sidewalls of the hard mask layer, when the first source/drain layer is selectively etched, the exposed portion of the sidewalls of the hard mask layer may define shapes of cuts in the first source/drain layer together with the mask layer. Accordingly, boundaries of the bit lines defined by the cuts may be defined by the sidewalls of the hard mask layer. The hard mask layer is self-aligned with the underlying active regions, and therefore the bit lines may also be self-aligned below the columns of active regions. For example, the mask layer may include strip patterns extending above the respective columns of active regions, and the strip patterns expose, on opposite sides thereof, a portion of sidewalls of the hard mask layer on active regions in corresponding columns of active regions respectively.

When the first source/drain layer is patterned, the same mask layer may be used to cut off the sacrificial layer to form cuts in the sacrificial layer. The sacrificial layer may then be processed through these cuts, so that the sacrificial layer is removed.

Since the bottom of the first source/drain layer may be suspended due to the removal of the sacrificial layer, a hold layer may be provided to hold the first source/drain layer, the channel layer and the second source/drain layer, to prevent them from collapsing during the manufacturing process. To this end, every two adjacent columns of active regions may be taken as a group, and a hold layer (of a dielectric material) is formed at a position between two columns of active regions in each group. In addition, a hold layer may not be formed between respective groups to expose the sacrificial layer, so that the sacrificial layer is processed. Thus, the sacrificial layer may be selectively etched through the exposed portions of the sacrificial layer to remove the sacrificial layer. Bit lines extending in a direction of the respective columns of active regions may be formed in a space left due to the removal of the sacrificial layer.

After the bit lines are formed, gate stacks may be formed around a periphery of the channel layer. For example, the periphery of the channel layer may be recessed inwardly with respect to the periphery of the hard mask layer so as to define spaces for accommodating the gate stacks. For example, this may be done by selective etching. In this case, the gate stacks may be formed in the recesses and may include portions which extend outwards from the recesses, to realize electrical connections to the word lines. The word lines may be formed between the respective rows of active regions to be electrically connected to gate stacks of memory cells in the corresponding rows of memory cells respectively.

In a case where the bit lines are formed by reaction of the first source/drain layer with a metal element, in order to prevent a semiconductor element in the channel layer from reacting with the metal element as well, a sacrificial gate may firstly be formed around the channel layer. Similarly, sidewalls of the channel layer may be recessed inwardly with respect to sidewalls of the hard mask layer by selectively etching the channel layer, so as to define a space for accommodating the sacrificial gate. The sacrificial gate may be formed in this space. The sacrificial gate may prevent the channel layer from coming into contact and thus reacting with the metal element. The sacrificial gate is then replaced with the gate stacks using an alternative gate technique.

Similarly, a protection layer may be formed around sidewalls of the second source/drain layer and the upper portions of the first source/drain layer (which are patterned to correspond to the respective memory cells). For example, the sidewalls of the second source/drain layer and the first source/drain layer may be recessed inwardly with respect to the sidewalls of the hard mask layer by selective etching, so as to define a space for accommodating the protection layer.

The protection layer may be formed in this space. The protection layer may prevent the second source/drain layer and the upper portions of the first source/drain layer from coming into contact and thus reacting with the metal element.

According to an embodiment of the present disclosure, in order to more easily define extensions of the gate stacks, when the stack is patterned, bridge portions which extend between opposing active regions in the column direction may further be formed between at least one pair of adjacent rows of active regions.

In a case where the bridge portions exist, when the channel layer is relatively recessed as described above, an amount of selective etching may cause the bridge portions of the channel layer to be removed, and then the channel layer of the respective memory cells is separated. In addition, when the sacrificial gate is formed, the sacrificial gate may still have bridge portions due to the presence of the source/drain layers at the upper and lower ends, which define the extensions of the gate stacks.

Similarly, when the source/drain layers are relatively recessed as described above, the amount of selective etching may cause their respective bridge portions to be removed, and then the source/drain layers of the respective memory cells are separated (especially the second source/drain layer is separated, and the first source/drain layer in the same column may be connected together).

According to an embodiment of the present disclosure, the word lines may be formed in a conformal manner. For example, a dielectric layer may be formed on the substrate to fill the gaps in the stack, and a plurality of word lines may be formed in the dielectric layer, each of the word lines extends in the row direction and is electrically connected to gate conductors in gate stacks of respective memory cells in a corresponding row of memory cells. Each of the word lines includes first portions extending along a periphery of a memory cell in a corresponding row of memory cells and second portions extending between the respective first portions. The first portions of the word line extend substantially in a conformal manner with at least a portion of sidewalls of at least upper source/drain regions of the respective memory cells.

As an example, such word lines may be formed as follows. Trenches extending in the row direction may be formed between the rows of active regions in the dielectric layer. Sidewalls of the trenches may include first portions extending between the respective rows of active regions and defined by the dielectric layer, and second portions surrounding a periphery of active regions in the corresponding rows and extending substantially in a conformal manner with at least a portion of the sidewalls of the second source/drain layer. The gate stacks (for example, extensions thereof) in the corresponding rows may be exposed in the trenches for subsequent electrical connection with the word lines formed in the trenches. The word lines may be formed in the trenches in a conformal manner with the sidewalls of the trenches.

The trenches may be formed in a self-alignment manner. In this case, a mask layer may be formed on the dielectric layer. The mask layer includes a plurality of openings extending in the row direction. The respective openings expose positions between adjacent rows of active regions, and may expose partially opposing sidewalls of portions of the hard mask layer on active regions in the adjacent rows of active regions. Due to the exposure of the portion of the sidewalls of the hard mask layer, when the dielectric layer is etched, the exposed portion of the sidewalls of the hard mask layer may define, together with the mask layer, shapes of the trenches in the dielectric layer. Accordingly, second portions of sidewalls of the trenches may be defined by the sidewalls of the hard mask layer. The hard mask layer is self-aligned with its underlying active regions, and therefore the sidewalls of the trenches may also extend substantially in a conformal manner with the sidewalls of the second source/drain layer.

The word lines may be formed on the sidewalls of the trenches in a conformal manner. For example, the word lines may be formed in a form of spacers. For a purpose of electrical isolation, isolation layers may be formed on the sidewalls of the trenches. The isolation layers may also be formed in a form of spacers. The gate stacks, particularly the gate conductors therein, may be etched using the word lines as a mask so as to disconnect gate conductors between different memory cells.

According to an embodiment of the present disclosure, in a case where a spacing between columns of memory cells is less than that between rows of memory cells, the word lines may be formed as follows. The dielectric layer may be etched back so that the dielectric layer has its top surface below bottom surfaces of the gate stacks so as to expose at least top surfaces of the gate stacks. Then, the word lines may be formed, in a form of conductive spacers, on vertical sidewalls above the top surface of the dielectric layer, wherein the conductive spacers are aggregated with each other between adjacent memory cells in the column direction.

In a case where storage elements such as capacitors are additionally formed, a dielectric layer may be formed to cover the stack and the word lines, and the storage elements electrically connected to the second source/drain layer in the respective active regions may be formed in the dielectric layer. An electrical connection between the storage elements and the second source/drain layer may be formed by replacing the hard mask layer with conductive plugs.

The technology of the present disclosure may be implemented in various ways, some of which are exemplified in the following with reference to the drawings.

FIGS. 1-23(b) are schematic views showing a flow of manufacturing a semiconductor memory device according to an embodiment of the present disclosure.

In the following description, materials of the respective layers are exemplified. The selection of the different materials primarily aims to provide desired etching selectivity. The following expression "selectively etching B (against A)" means that an etching recipe used may primarily act on B without substantially affecting or less affecting A or other material layers which are exposed to the etching recipe when B is etched (in a case where A is not explicitly mentioned or only a portion of the material layers is mentioned). Based on these descriptions, those skilled in the art will understand how to select materials of the respective layers, instead of selecting only the materials exemplified herein.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for the convenience of description.

On the substrate 1001, a sacrificial layer 1003, a first source/drain layer 1005, a channel layer 1007, and a second source/drain layer 1009 may be formed in sequence by, for example, epitaxial growth. For the convenience of etching as described below, etching selectivity may be provided between adjacent ones of the layers by, for example, making the adjacent layers from different semiconductor materials. For example, the sacrificial layer 1003 may include SiGe (with an atomic percentage of Ge being about 10-35%) with a thickness of about 10-40 nm; the first source/drain layer 1005 may include Si with a thickness of about 50-200 nm; the channel layer 1007 may include SiGe (with an atomic percentage of Ge being about 10-35%) with a thickness of about 10-50 nm; and the second source/drain layer 1009 may include Si with a thickness of about 20-100 nm. A gate length may then be defined by a thickness of the channel layer 1007. Here, the first source/drain layer 1005 has a relatively large thickness since bit lines may be formed by silicidation reaction in the present embodiment as described below.

The first source/drain layer 1005 and the second source/drain layer 1009 may be in-situ doped while being grown. For example, for an n-type device, n-type doping may be performed on the first source/drain layer 1005 and the second source/drain layer 1009 with a doping concentration of about $1E17$-$1E20$ cm$^{-3}$; and for a p-type device, p-type doping may be performed on the first source/drain layer 1005 and the second source/drain layer 1009 with a doping concentration of about $1E17$-$1E20$ cm$^{-3}$. In addition, the channel layer 1007 may also be doped in-situ to adjust a threshold voltage ($V_t$) of the device. For example, for an n-type device, p-type doping may be performed on the channel layer 1007 with a doping concentration of about $1E15$-$1E19$ cm$^{-3}$; and for a p-type device, n-type doping may be performed on the channel layer 1007 with a doping concentration of about $1E15$-$1E19$ cm$^{-3}$.

In addition, for a junctionless device, the same type of doping may be performed on the first source/drain layer 1005, the channel layer 1007, and the second source/drain layer 1009. For a tunneling device, different types of doping may be performed on the first source/drain layer 1005 and the second source/drain layer 1009. For example, p-type doping may be performed on the first source/drain layer 1005 and n-type doping may be performed on the second source/drain layer 1009, or vice versa.

A hard mask layer 1011 may be provided above the stack of the semiconductor layers. The hard mask layer 1011 may then be used to define a shape of the active regions, (etch or planarize) a stop layer, and protect the underlying semiconductor layers, or the like. For example, the hard mask layer 1011 may include nitride (for example, silicon nitride) with a thickness of about 20-150 nm.

Next, active regions may be defined. Here, in order to form an array of memory cells, an array of active regions may be formed. According to an embodiment of the present disclosure, a pattern transfer technique may be used. Here, the transfer is performed using a spacer pattern. The limitations on lithography may be alleviated and size control of the pattern may be enhanced using this pattern transfer technique. For example, this can be done as follow.

Figure 2A:
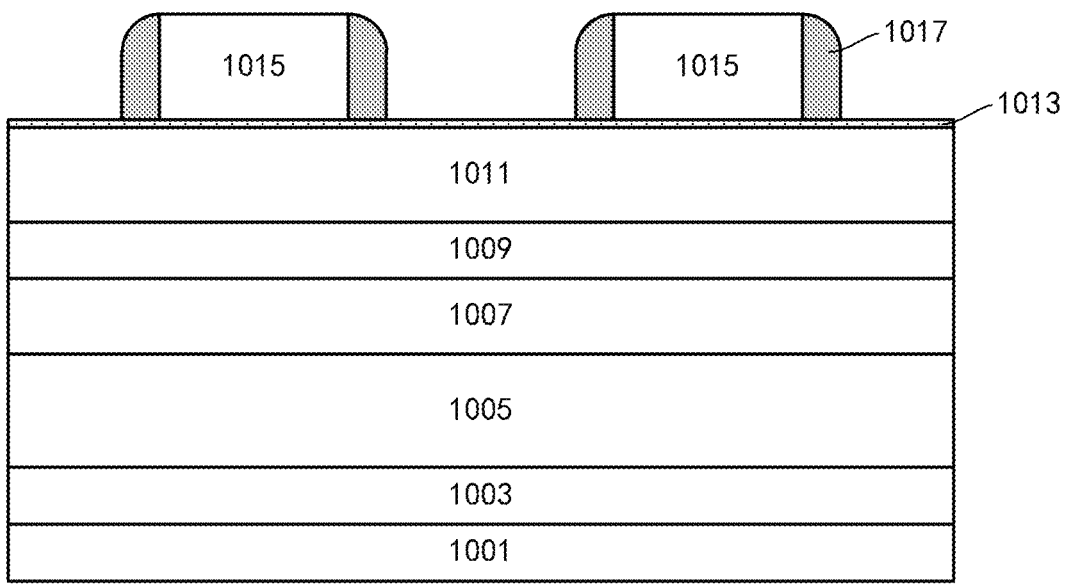
Figure 2B:
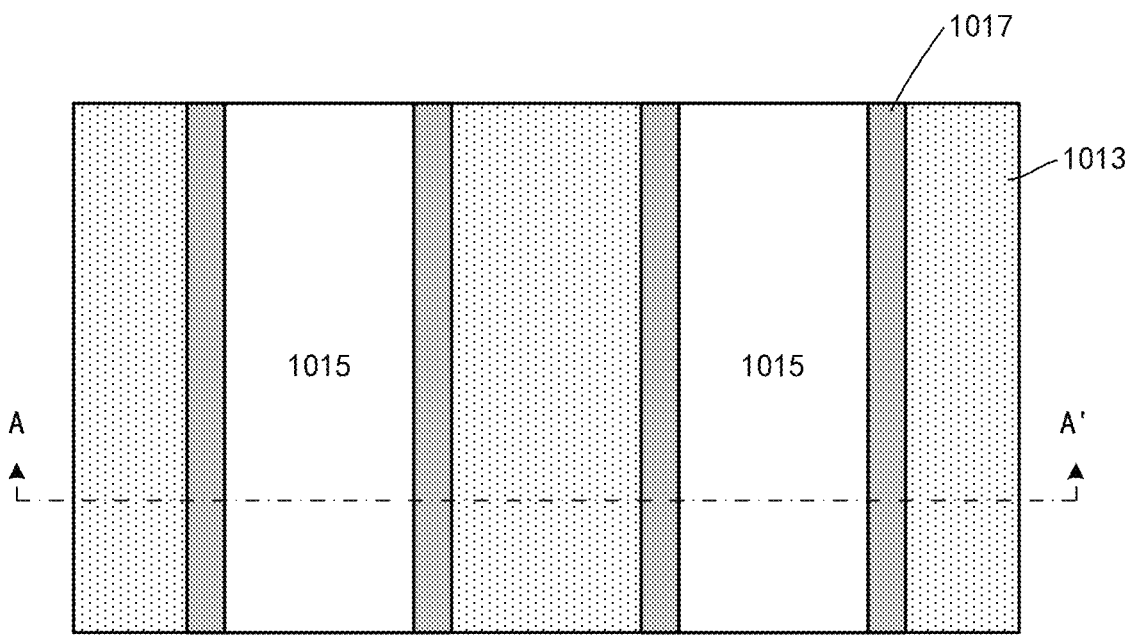

As shown in FIGS. 2(a) and 2(b) (FIG. 2(a) is a sectional view, and FIG. 2(b) is a top view with line AA' indicating a position where the sectional view in FIG. 2(a) is taken), in order to form the spacer pattern, a sacrificial layer 1015 may be formed (for example, deposited) on the stack shown in FIG. 1 and may be patterned (by, for example, Reactive Ion Etching (ME)) to have vertical sidewalls extending in a first direction (for example, a direction of columns of memory cells, such as a direction perpendicular to a plane of the paper in FIG. 2(a), or a vertical direction in FIG. 2(b)) to provide vertical surfaces required for the formation of spacers. In order to provide suitable etching selectivity, the sacrificial layer 1015 may include amorphous silicon. In addition, for the purpose of etching stop or the like, an etching stop layer 1013 of, for example, oxide (for example, silicon oxide), with a thickness of about 1-10 nm, may be formed (for example, deposited) before the sacrificial layer 1015 is formed.

First spacers 1017 may be formed on the vertical sidewalls of the sacrificial layer 1015 using a spacer formation technique. For example, the first spacers 1017 may include SiC, with a thickness of about 3-20 nm. This formation may be done by depositing a SiC layer, with a thickness of about 3-20 nm, on the stack on which the sacrificial layer 1015 is formed in a substantially conformal manner, and then selectively etching the SiC layer by, for example, RIE, in a direction substantially perpendicular to a substrate surface to remove a lateral extension portion thereof and leave a vertical extension portion thereof. The RIE of the SiC layer may be stopped at the etching stop layer 1013.

As shown in the top view of FIG. 2(b), the first spacers 1017 thus formed extend in the first direction.

Figure 3A:
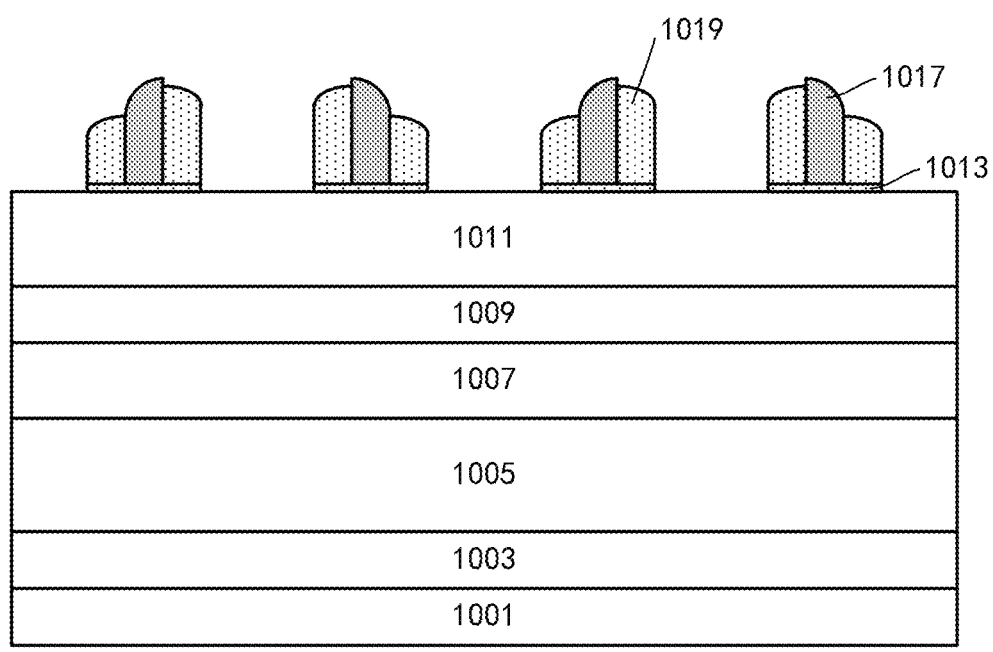
Figure 3B:
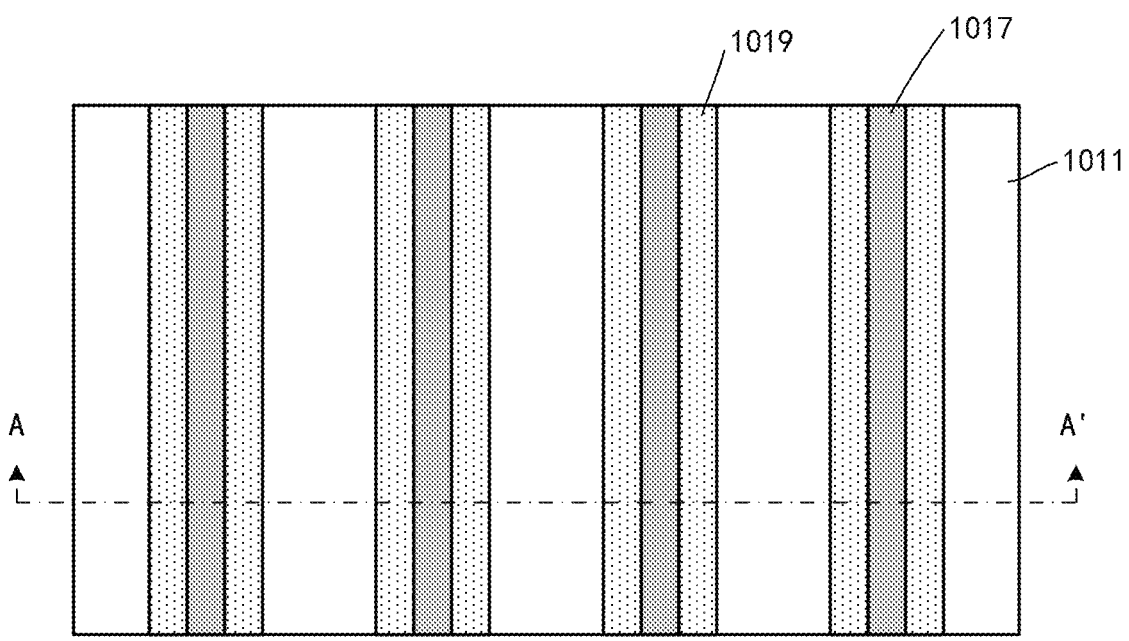

After that, as shown in FIGS. 3(a) and 3(b) (FIG. 3(a) is a sectional view, and FIG. 3(b) is a top view with line AA' indicating a position where the sectional view in FIG. 3(a) is taken), the sacrificial layer 1015 (of amophous silicon here) may be removed by selective etching (for example, wet etching using a TMAH solution) against the etching stop layer 1013 (of oxide here) and the first spacers 1017 (of SiC here). Thus, the first spacers 1017 extending in the first direction are left on the stack. Then, second spacers 1019 are similarly formed on opposite vertical sidewalls of the respective first spacers 1017 using the spacer formation technique. For example, the second spacers 1019 may include oxide, with a thickness of about 3-30 nm. The etching of the oxide may be stopped at the hard mask layer 1011 when the spacers are formed.

As shown in the top view of FIG. 3(b), the second spacers 1019 thus formed are attached to opposite sides of the respective first spacers 1017 and extend in the first direction. The first spacers 1017 and the respective second spacers 1019 together define positions of columns of memory cells.

Next, positions of rows of memory cells may be similarly defined by spacers.

Figure 4A:
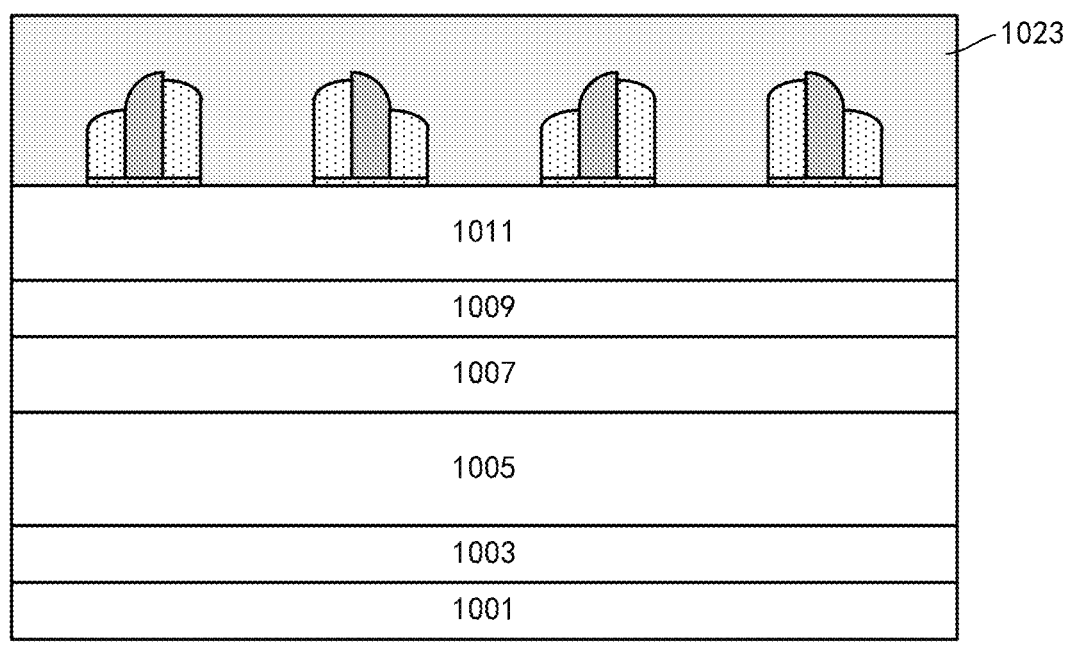
Figure 4B:
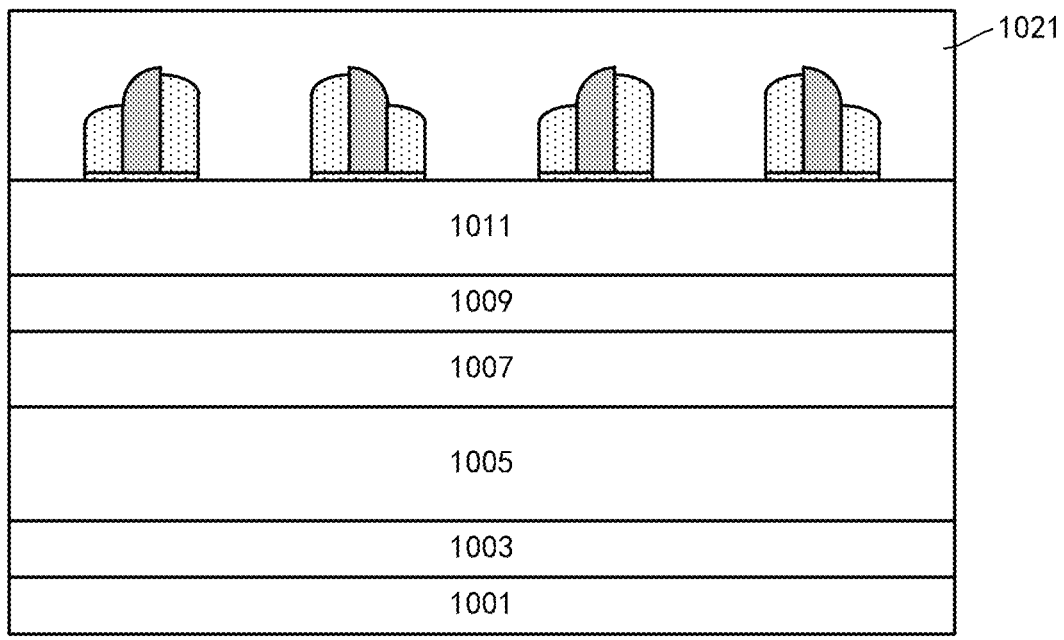
Figure 4C:
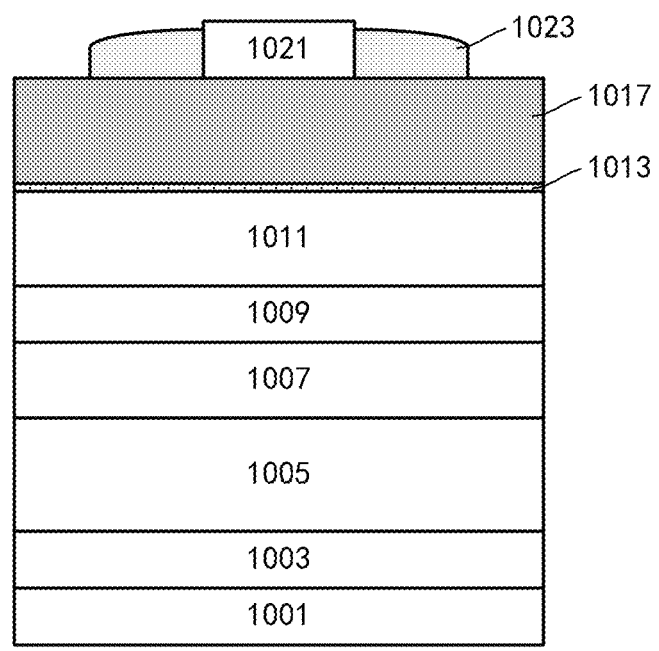
Figure 4D:
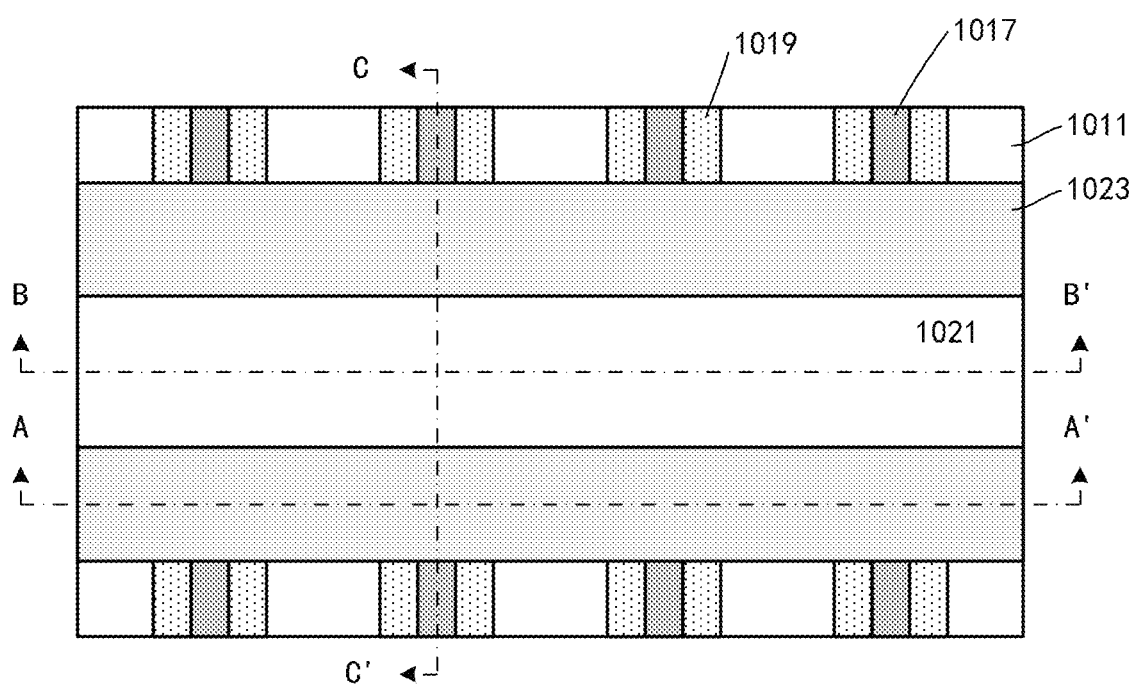
Figure 5A:
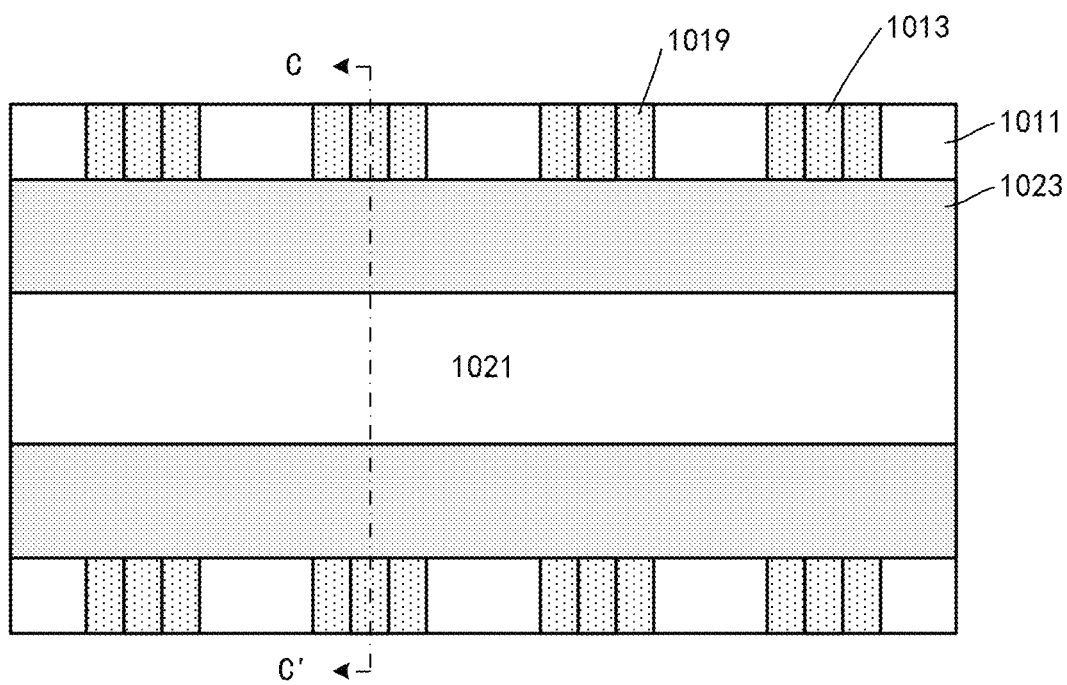
Figure 5B:
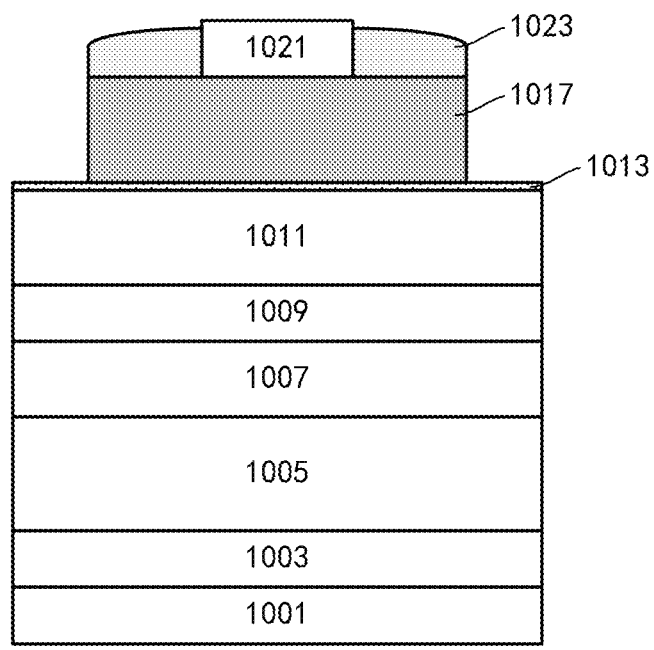

As shown in FIGS. 4(a), 4(b), 4(c) and 4(d) (FIG. 4(a), FIG. 4(b) and FIG. 4(c) are sectional views, and FIG. 4(d) is a top view with line AA' indicating a position where the sectional view in FIG. 4(a) is taken, line BB' indicating a position where the sectional view in FIG. 4(b) is taken, and line CC' indicating a position where the sectional view in FIG. 4(c) is taken), another sacrificial layer 1021 may be formed (for example, deposited) on the structure shown in FIGS. 3(a) and 3(b) and may be patterned (by, for example, RIE) to have vertical sidewalls extending in a second direction (for example, a direction of rows in the array of memory cells, such as a horizontal direction in FIGS. 4(a), 4(b) and 4(d) or a direction perpendicular to a plane of the paper in FIG. 4(c)) which intersects (for example, is perpendicular to) the first direction. The two sidewalls may have a spacing of about 20-100 nm therebetween. Before the sacrificial layer 1021 is patterned, the sacrificial layer 1021 may be planarized by, for example, Chemical Mechanical Polishing (CMP). In order to provide suitable etching selectivity, the sacrificial layer 1021 may include polycrystalline SiGe. Similarly, for the purpose of etching stop or the like, an etching stop layer (of, for example, oxide, not shown here) may be formed before the sacrificial layer 1021 is formed. Third spacers 1023 may be formed on sidewalls of the sacrificial layer 1021 using the spacer formation technique. For example, the third spacers 1023 may include polysilicon, with a thickness of about 10-30 nm.

Since the first spacers 1017 (of SiC here) and the second spacers 1019 (of oxide here) may be selectively etched as compared to the underlying hard mask layer 1011 (of nitride here), selective etching of the sacrificial layer 1021 (of polycrystalline SiGe here) and the third spacers 1023 (of polysilicon here) is feasible.

As shown in the top view of FIG. 4(*d*), the third spacers 1023 thus formed extend in the second direction and define positions of the rows of memory cells. The memory cells (or their active regions) are defined at positions where the rows (defined by the third spacers 1023) intersect the columns (defined by the first spacers 1017 and the second spacers 1019). In addition, the bridge portions may be defined at positions where the sacrificial layer 1021 intersects the first spacers 1017. This will be explained in further detail below.

As shown in FIGS. 5(*a*) and 5(*b*) (FIG. 5(*a*) is a top view and FIG. 5(*b*) is a sectional view taken along line CC' in FIG. 5(*a*)), the first spacers 1017 (of SiC here) may be selectively etched by, for example, RIE, with respect to the second spacers 1019 (of oxide here), the etching stop layer 1013 (of oxide here) and the hard mask layer 1011 (of nitride here) by using the sacrificial layer 1021 (of polycrystalline SiGe here) and the third spacers 1023 (of polysilicon here) as a mask.

Figure 6A:
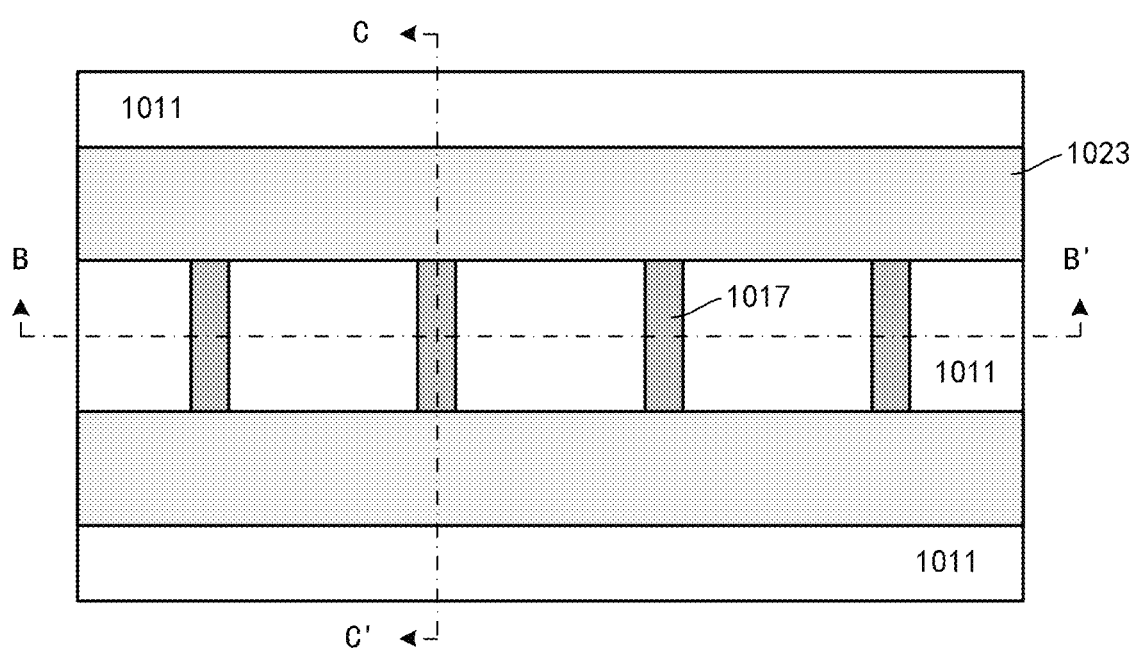
Figure 6B:
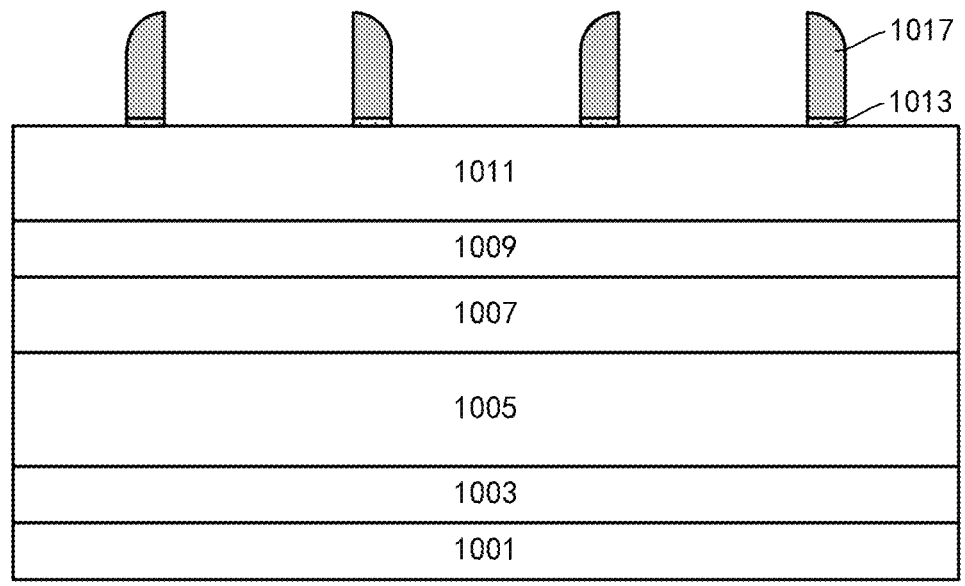
Figure 6C:
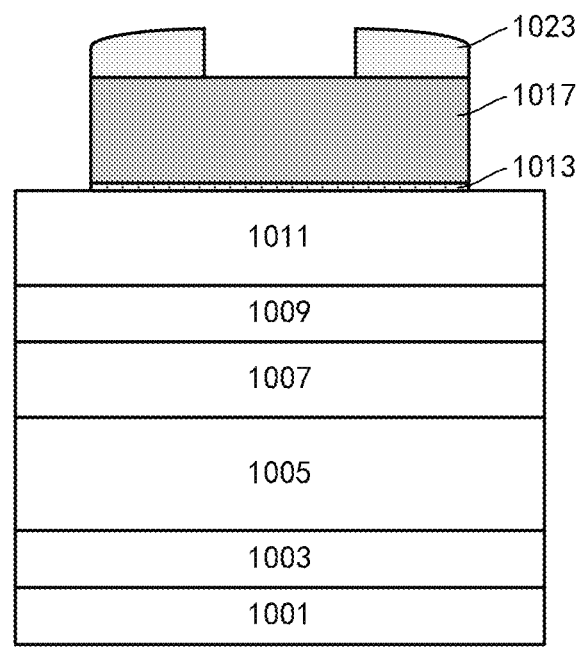

As shown in FIGS. 6(*a*), 6(*b*) and 6(*c*) (FIG. 6(*a*) is a top view, FIG. 6(*b*) is a sectional view taken along line BB' in FIG. 6(*a*), and FIG. 6(*c*) is a sectional view taken along line CC' in FIG. 6(*a*)), the sacrificial layer 1021 (of polycrystalline SiGe here) may be removed by selectively etching with respect to the third spacers 1023 (of polysilicon here) (and the etching stop layer 1013 of oxide, the second spacers 1019 of oxide, the hard mask layer 1011 of nitride, and the first spacers 1017 of SiC). Then, the second spacers (of oxide here) are selectively etched by, for example, RIE, with respect to the first spacers (of SiC here) and the hard mask layer 1011 (of nitride here) using the third spacers 1023 (of polysilicon here) as a mask. In this example, the etching stop layer 1013 and the second spacers 1019 all include oxide, and therefore, when the second spacers 1019 are subjected to RIE, the etching stop layer 1013 is also etched.

Subsequently, as shown in a top view of FIG. 7(*a*), the third spacers 1023 (of polysilicon here) may be removed by selectively etching with respect to the first spacers 1017 (of SiC here), the second spacers 1019 (of oxide here), and the hard mask layer 1011 (of nitride here).

After the process described above is performed, the second spacers 1019 remain only at positions where the rows intersect the columns. Further, the first spacers 1017 further extend between two adjacent ones of the rows, and may then define the bridge portions. As shown by a dashed circle in FIG. 7(*a*), the first spacers 1017 and the second spacers 1019 together define the positions of the memory cells (or their active regions) at positions where the rows intersect the columns. In addition, the first spacers 1017 define bridge portions which extend in the first direction (for example, the column direction in the array of memory cells), between two adjacent ones of the rows.

Figure 7A:
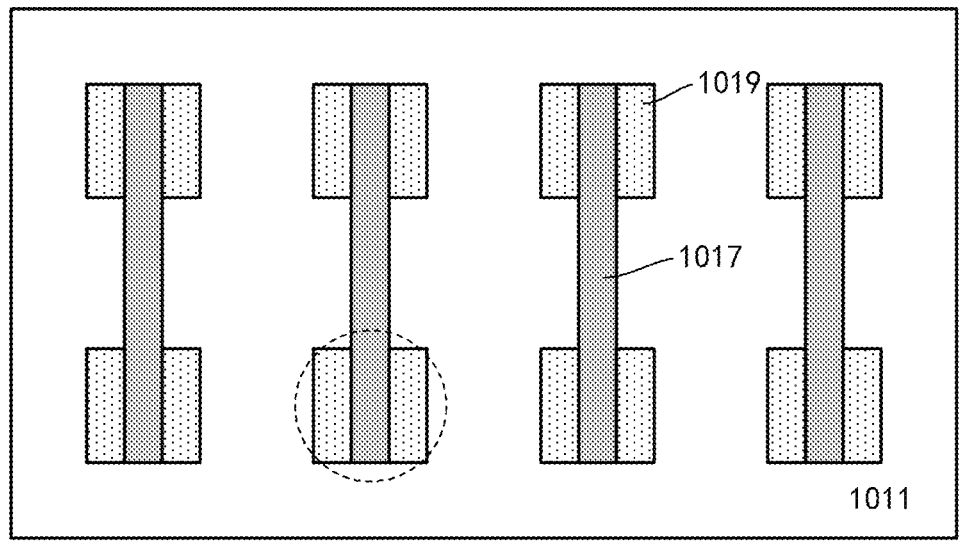
Figure 7B:
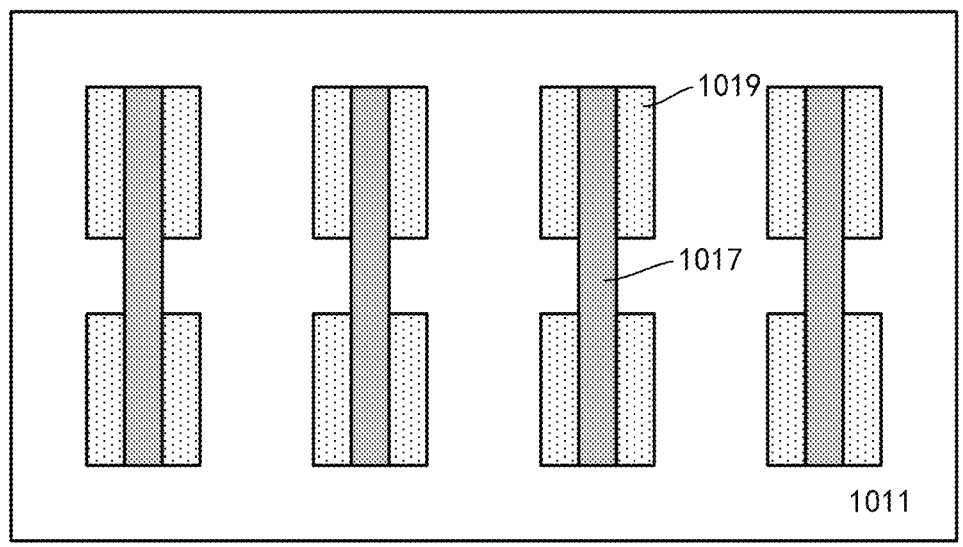
Figure 8A:
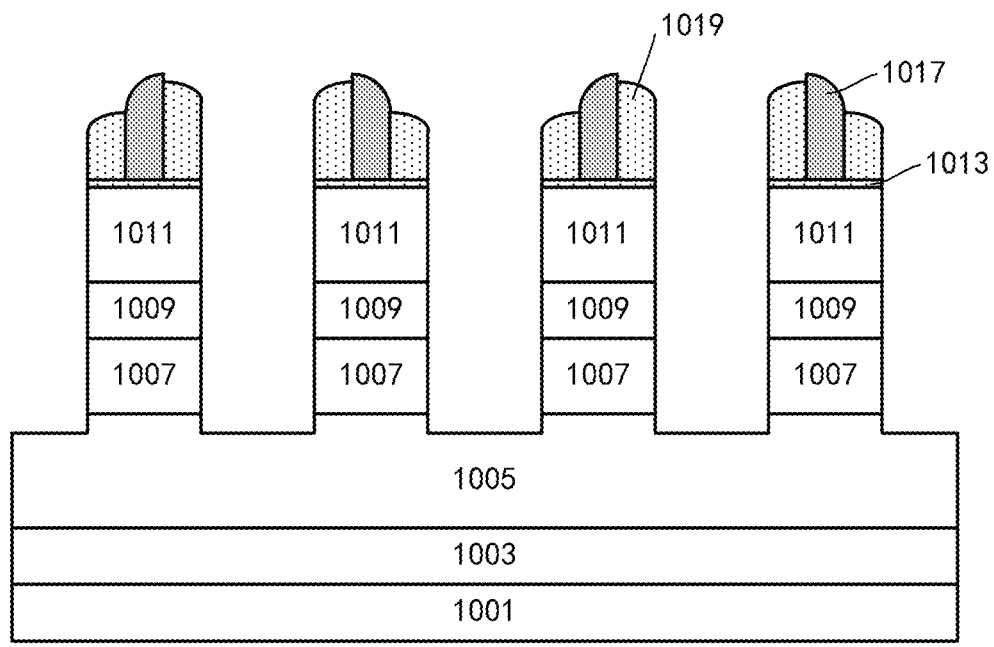
Figure 8B:
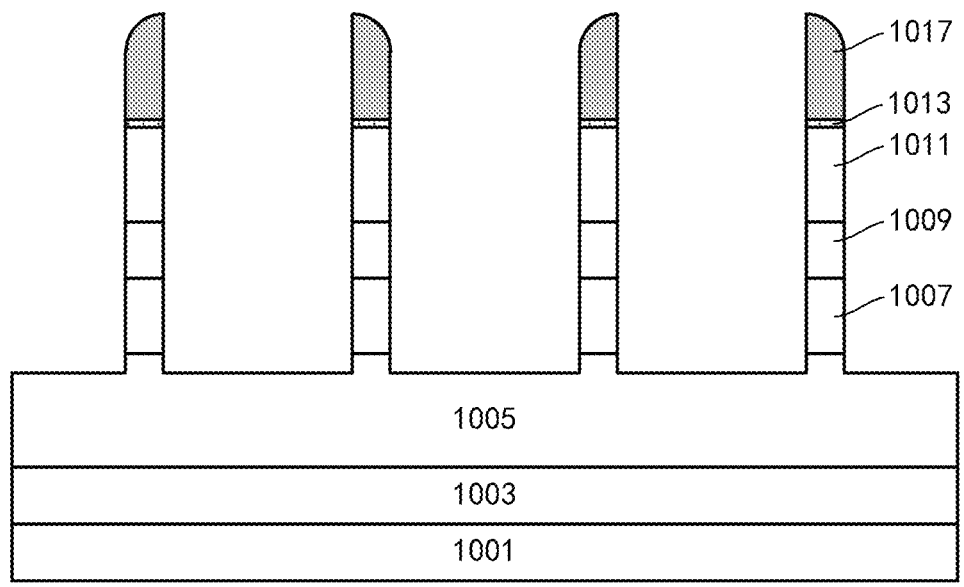
Figure 8C:
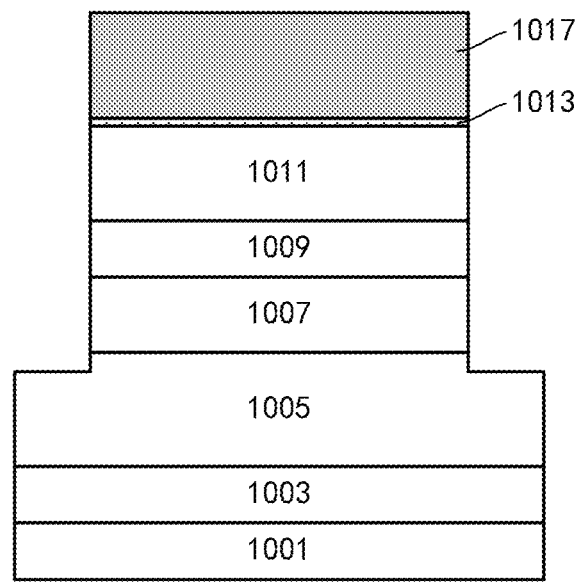
Figure 8D:
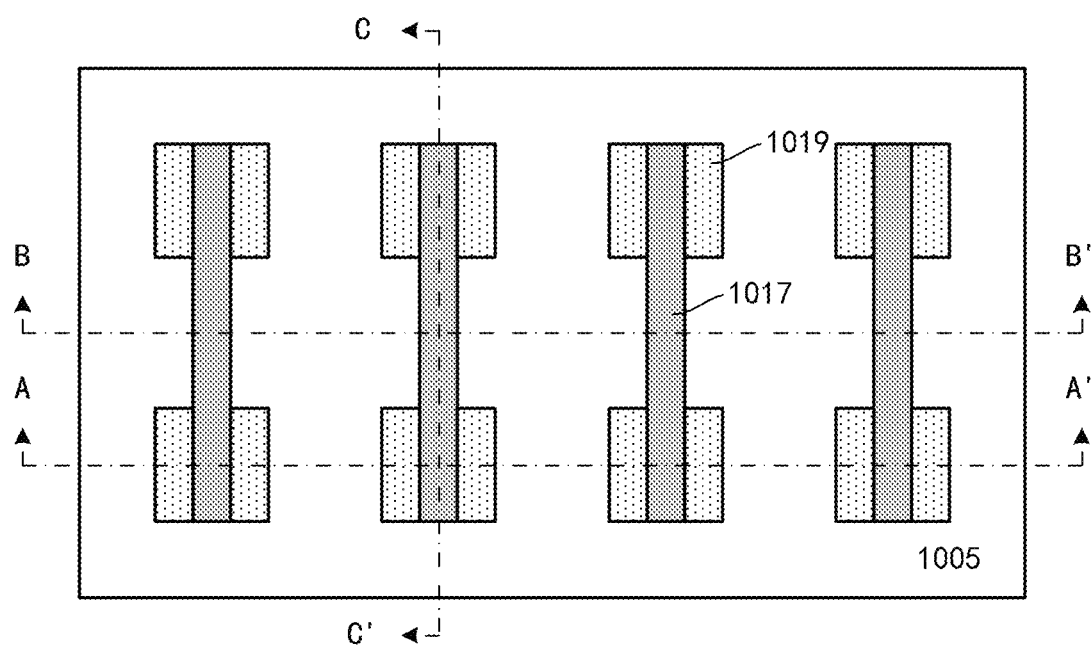

In an example of FIG. 7(*a*), the defined memory cells have a substantially square shape, in which case a nanowire device may then be formed. According to another example, as shown in FIG. 7(*b*), the defined memory cells have a substantially rectangular shape, in which case a nano sheet device may then be formed. The defined shape may be adjusted by adjusting sizes of the first spacers to the third spacers.

In the above example, a case where there are two rows and two columns is illustrated, but the present disclosure is not limited thereto. According to an embodiment of the present disclosure, more rows or more columns may be included. This may be achieved by increasing a number of the spacers.

In addition, the bridge portions are mainly used to define extensions of the gate stacks. In the above example, every two rows may be taken as a group, and there are bridge portions between opposing memory cells in the group; and there may be no bridge portion between groups. That is, the bridge portions are not continuous in the column direction. In the column direction, there is a bridge portion between one memory cell and an adjacent memory cell on one side, and there is no bridge portion between the memory cell and an adjacent memory cell on an opposite side. In this case, as described below, one word line may be formed for each row.

Alternatively, the bridge portions may be continuous in the column direction (this may be achieved by, for example, omitting the operation of selectively etching the first spacers 1017 described above in conjunction with FIGS. 5(*a*) and 5(*b*)). In this case, word lines may be formed at opposite sides of each row respectively, so as to reduce contact resistance.

In addition, the bridge portions may even not be formed. In this case, when the gate stacks are formed, the extensions of the gate stacks may be defined using a photolithography technique.

Different word line formation strategies may be adopted for different rows of memory cells as needed.

Further, although the memory cells or their active regions are defined here using the pattern transfer technique, the present disclosure is not limited thereto. For example, patterns may be defined using a mask such as photoresist. Certainly, in this case, the patterns are not limited to squares or rectangles defined by the spacers, but may be other shapes such as circles or polygons or the like.

Then, the patterns formed as described above may be transferred to the underlying layers.

As shown in FIGS. 8(*a*), 8(*b*), 8(*c*) and 8(*d*) (FIGS. 8(*a*), 8(*b*) and 8(*c*) are sectional views, and FIG. 8(*d*) is a top view with line AA' indicating a position where the sectional view in FIG. 8(*a*) is taken, line BB' indicating a position where the sectional view in FIG. 8(*b*) is taken, and line CC' indicating a position where the sectional view in FIG. 8(*c*) is taken), the hard mask layer 1011 (of nitride here), the second source/drain layer 1009 (of Si here), the channel layer 1007 (of SiGe here) and the first source/drain layer 1005 (of Si here) may be selectively etched by, for example, RIE in sequence using the first spacers 1017 (of SiC here) and the second spacers 1019 (of oxide here) as a mask. Here, the RIE of the first source/drain layer 1005 is not carried out into a bottom surface of the first source/drain layer 1005, but is stopped therein. Thus, lower portions of the first source/drain layer 1005 remain integrally extended on the substrate 1001.

Thus, the etched second source/drain layer 1009, the etched channel layer 1007, and the etched first source/drain layer 1005 (upper portions thereof) form pillar-shaped (in this example, square pillar-shaped) active regions. These active regions are arranged in an array shown in FIG. 7(*a*) or 7(*b*) in the top view, and bridge portions (which will be removed later) may exist. The RIE may be performed, for example, in a direction substantially perpendicular to the substrate surface, so that these pillar-shaped active regions therein are also substantially perpendicular to the substrate surface.

Figure 9A:
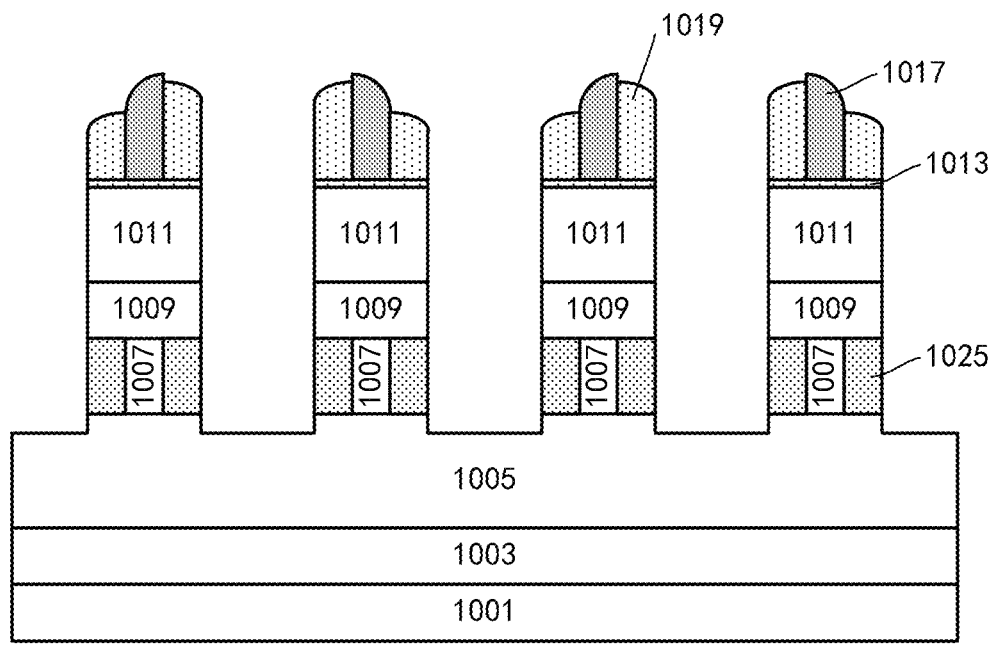
Figure 9B:
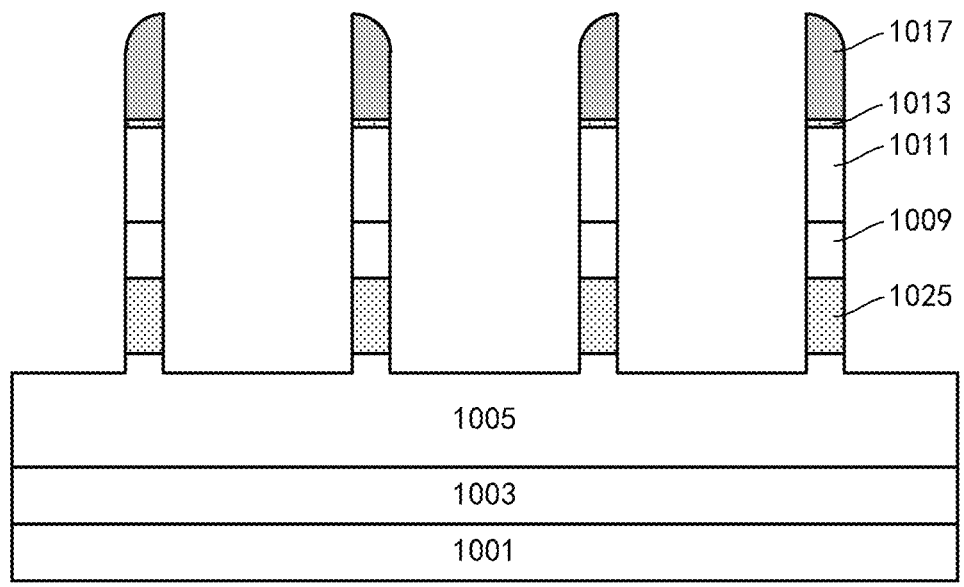
Figure 9C:
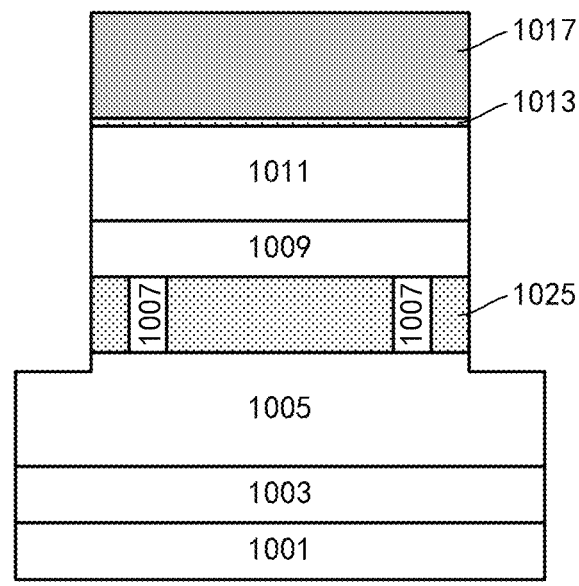

According to an embodiment of the present disclosure, in order to separate the active regions, as shown in FIGS. 9(a), 9(b) and 9(c) (FIGS. 9(a), 9(b) and 9(c) are sectional views taken along lines AA', BB' and CC'), the channel layer 1007 (of SiGe here) may be selectively etched, particularly isotropically etched, against the first source/drain layer 1005 and the second source/drain layer 1009 (both of Si here). An amount of etching may be controlled, so that the channel layer 1007 may be removed at the bridge portions. Thus, the channel layer 1007 is separated into portions at the respective memory cells, and these portions may form nanowires. In order to facilitate the control of the amount of etching, Atomic Layer Etching (ALE) or digital etching may be used.

In addition, the selective etching of the channel layer 1007 causes the channel layer 1007 to have sidewalls recessed with respect to sidewalls of the first source/drain layer 1005 (the upper portions thereof) and the second source/drain layer 109 or with respect to sidewalls of the hard mask layer 1011 (in this example, recessed in a lateral direction substantially parallel to the substrate surface). Due to the relative recess of the channel layer 1007, space which is self-aligned with the channel layer 1007 is left, a gate stack may then be formed in the space, and the gate stack thus formed may be self-aligned with the channel layer 1007. The space may be occupied by a sacrificial gate 1025 to prevent subsequent processes from affecting the channel layer 1007 and the space. In order to provide desired etching selectivity, the sacrificial gate 1025 may include, for example, oxynitride (for example, silicon oxynitride). For example, the sacrificial gate 1025 may be filled in the spaces by depositing nitrogen oxide and performing back-etching. Alternatively, a thin etching stop layer (not shown) of oxide may further be formed before the oxynitride is deposited.

As shown in FIGS. 9(a), 9(b) and 9(c), the sacrificial gate 1025 includes not only portions surrounding the channel layer 1007 but also bridge portions extending in the second direction.

Figure 10A:
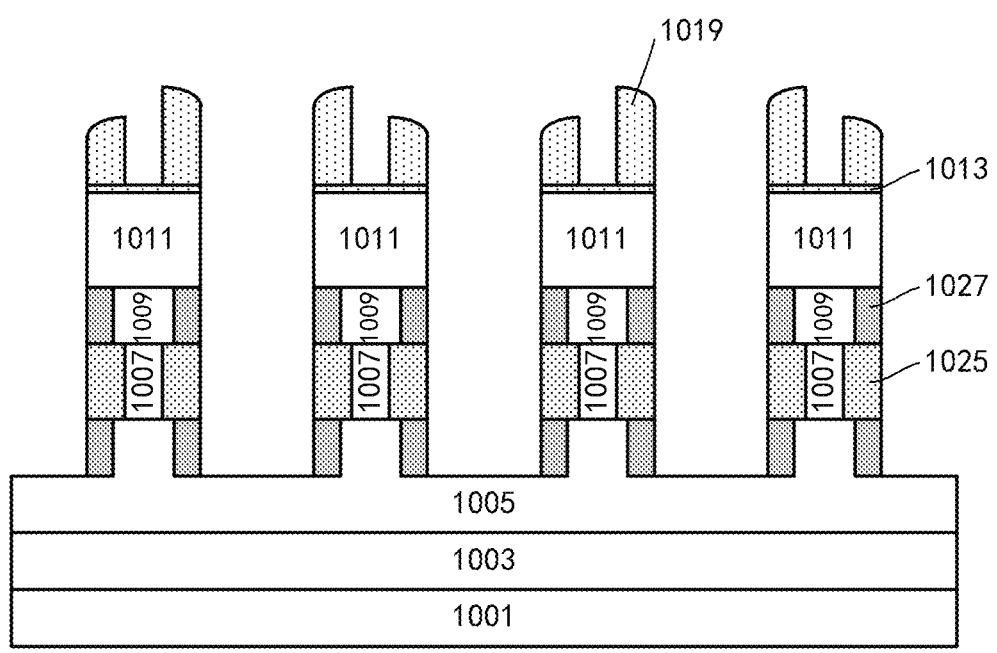
Figure 10B:
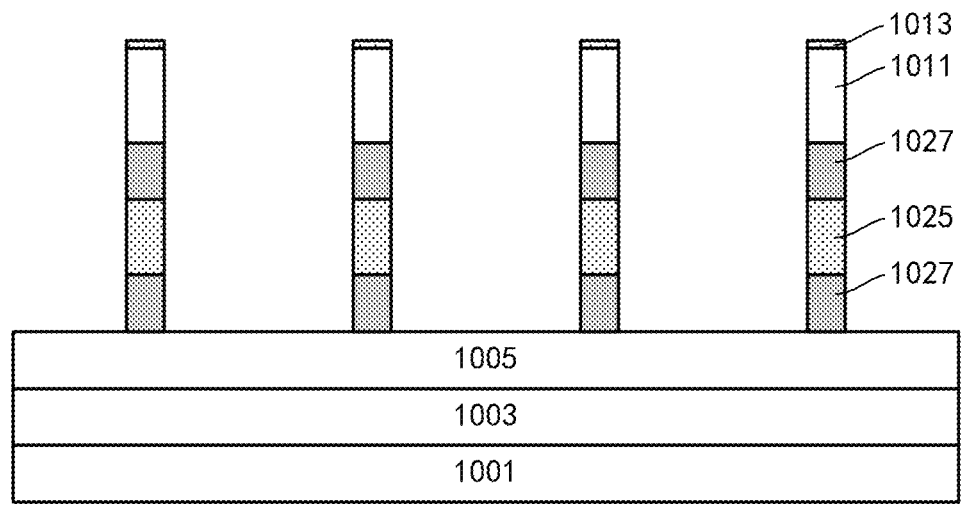
Figure 10C:
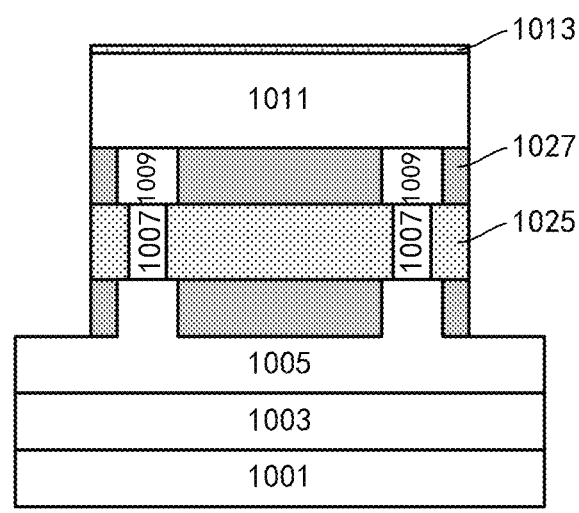

Similarly, the first source/drain layer 1005 and the second source/drain layer 1009 may be separated. As shown in FIGS. 10(a), 10(b) and 10(c) (FIGS. 10(a), 10(b) and 10(c) are sectional views taken along lines AA', BB' and CC' respectively), the first source/drain layer 1005 and the second source/drain layer 1009 (both of Si here) may be selectively etched, particularly, isotropically etched, with respect to the channel layer 1007 (of SiGe here). An amount of etching may be controlled, so that the first source/drain layer 1005 and the second source/drain layer 1009 may be removed at the bridge portions. Thus, the first source/drain layer 1005 and the second source/drain layer 1009 are separated into portions at the respective memory cells, and these portions may form nanowires. In order to facilitate the control of the amount of etching, ALE or digital etching may be used.

Here, an example in which the etched first source/drain layer 1005 and the etched second source/drain layer 1009 are still thicker than the channel layer 1007 is illustrated, but the present disclosure is not limited thereto. For example, the etched first source/drain layer 1005 and the etched second source/drain layer 1009 may have substantially the same size as that of the channel layer 1007 or may be thinner than the channel layer 1007.

In order to maintain the spaces of the gate stacks and protect the source/drain layers or the like, a protection layer 1027 may be filled in spaces formed by the first source/drain layer 1005 and the second source/drain layer 1009 being recessed with respect to the hard mask layer 1011 due to the selective etching. The filling may be achieved by, for example, deposition and then back-etching. In order to provide desired etching selectivity, the protection layer 1027 may include, for example, low-k silicon carbide. In this case, the first spacers 1017 of SiC may be removed during the back-etching process.

Similarly, as shown in FIGS. 10(a), 10(b) and 10(c), the protection layer 1027 includes not only portions surrounding the source/drain layers but also bridge portions extending in the second direction.

After the process described above is performed, the channel layer and the source/drain layers, as the active regions, have been substantially separated into separate pillar-shaped portions corresponding to the respective memory cells, but the lower portions of the first source/drain layer 1005 remain integrally extended. As described above, in the present embodiment, the bit lines are formed by a silicidation process with respect to the first source/drain layer 1005. To this end, the first source/drain layer 1005 (particularly the lower portions thereof) may be patterned into strips extending below the respective columns of memory cells.

Figure 11A:
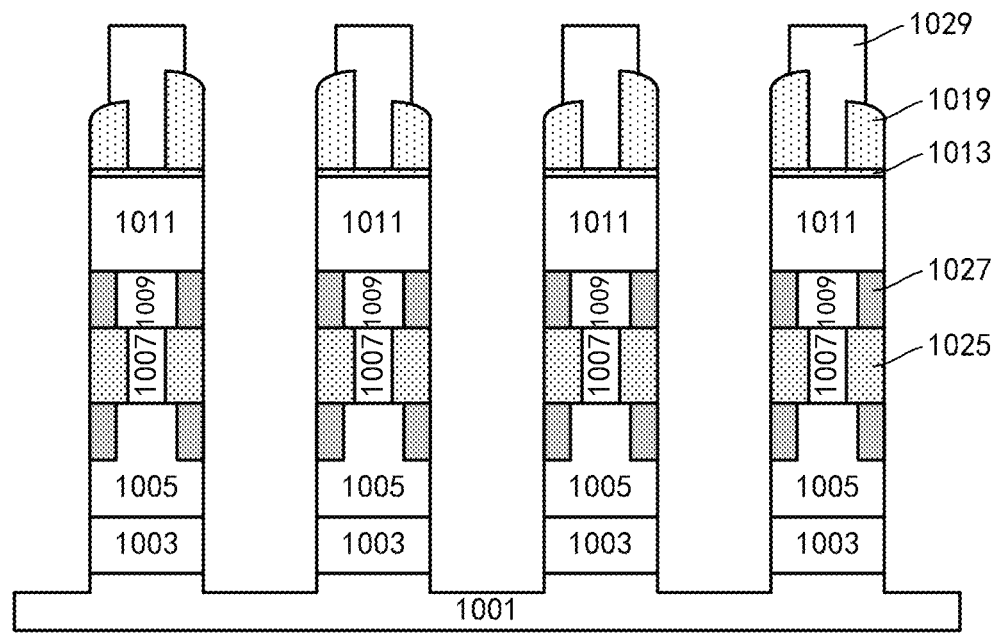
Figure 11B:
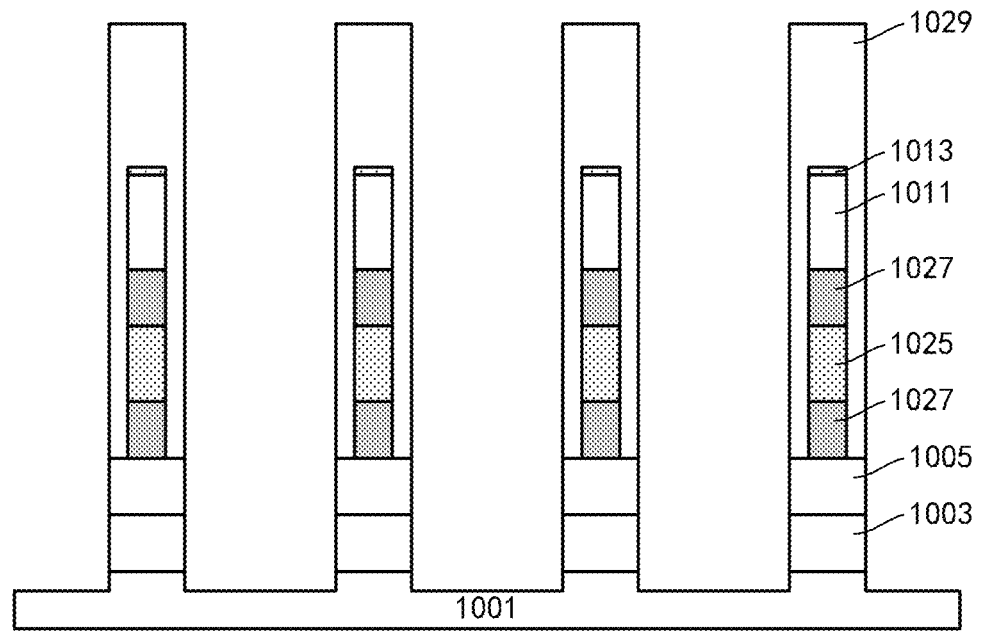
Figure 11C:
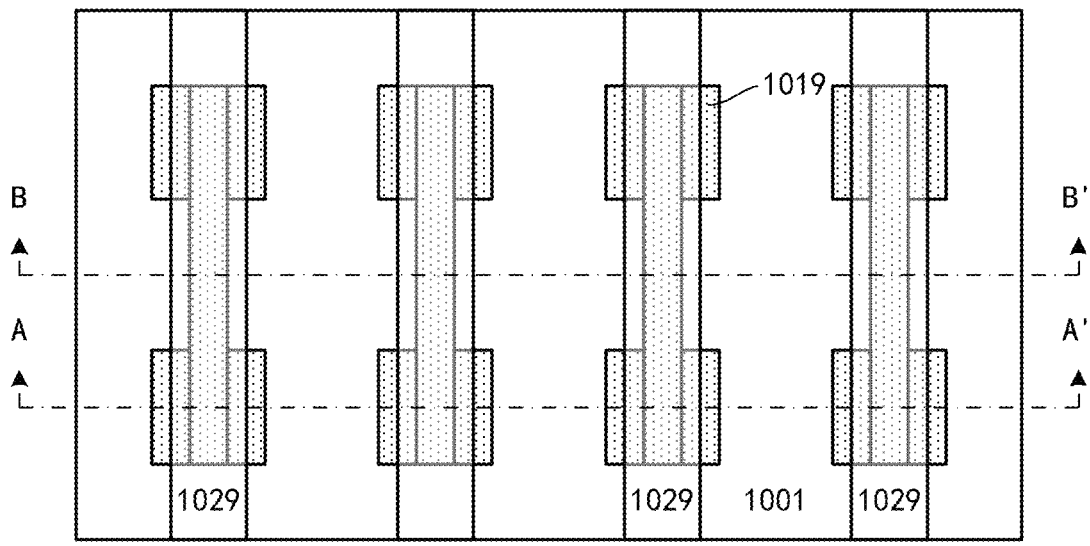

As shown in FIGS. 11(a), 11(b) and 11(c) (FIGS. 11(a) and 11(b) are sectional views, and FIG. 11(c) is a top view with line AA' indicating a position where the sectional view in FIG. 11(a) is taken and line BB' indicating a position where the sectional view in FIG. 11(b) is taken), a mask layer 1029 of, for example, photoresist, may be formed (for example, deposited) on the structure shown in FIGS. 10(a), 10(b) and 10(c), and may be patterned (by, for example, photolithography) into strips extending in the first direction, in other words, the column direction. The strip-shaped photoresist extends above the respective columns of memory cells. Further, for the purpose of self-alignment, the respective strip-shaped photoresist may expose portions of sidewalls of the hard mask layer 1011 in the respective columns. Thus, in a subsequent patterning or etching process, the hard mask layer 1011 may function as a mask together with the photoresist 1029.

Here, in order to reduce resistance of the bit lines, the bit lines may be formed to be relatively thick. Thus, the photoresist 1029 may be thicker than the bridge portions at the bridge portions.

Then, the first source/drain layer 1005 may be selectively etched by, for example, RIE (in, for example, the direction substantially perpendicular to the substrate surface) by using the photoresist 1029 and the hard mask layer 1011 (including the second spacers 1019 on the top thereof) as a mask. Thus, the first source/drain layer 1005 is separated into strip portions extending in the column direction, and these strip portions are located below the respective columns of memory cells. Due to the definition function of the hard mask layer 1011, these strip portions (and the bit lines which are subsequently formed thereby) may be self-aligned below the respective memory cells at the positions of the respective memory cells.

In addition, the sacrificial layer 1003 may be removed in order to facilitate silicidation of the first source/drain layer 1005. To this end, paths to the sacrificial layer 1003 may be opened. For example, the sacrificial layer 1003 may continue to be selectively etched by, for example, RIE (in the direction substantially perpendicular to the substrate surface) by using the photoresist 1029 and the hard mask layer 1011 (including the second spacers 1019 on the top thereof) as a mask. The RIE may be performed into the substrate

1001. Thus, a series of openings are formed in the sacrificial layer 1003, and the sacrificial layer 1003 may then be removed through these openings. Then, the photoresist 1029 may be removed.

In order to hold the array of active regions (to prevent collapse) when the sacrificial layer 1003 is removed, a hold layer may be provided. The same hold layer may be shared between two adjacent columns. Then, every two adjacent columns may be taken as a group. A hold layer may be formed between two columns in each group, so that the hold layer may hold the two columns. There may be no hold layer formed between two groups to expose the sacrificial layer.

Figure 12A:
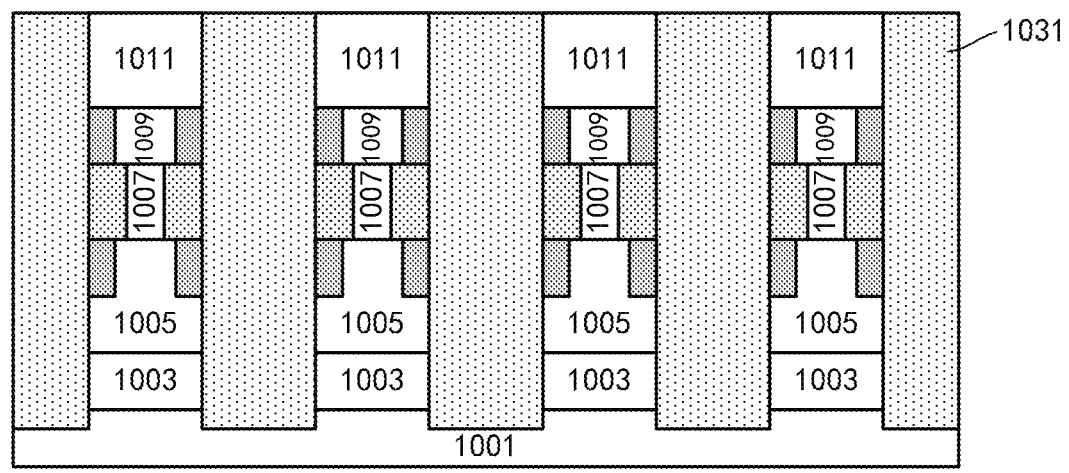
Figure 12B:
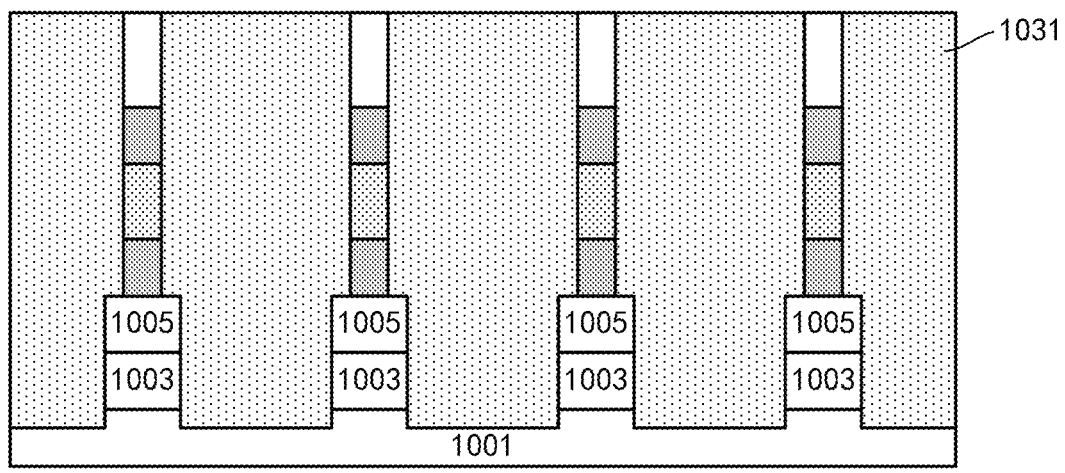

To this end, as shown in FIGS. 12(*a*) and 12(*b*) (FIGS. 12(*a*) and 12(*b*) are sectional views taken along lines AA' and BB' respectively), a material 1031 of a hold layer may be filled in gaps in the structure (from which the photoresist 1029 is removed) shown in FIGS. 11(*a*), 11(*b*) and 11(*c*). For example, the hold layer material 1031 may be filled by depositing a dielectric such as oxide and planarizing the deposited oxide by, for example, CM' (which may be stopped at the hard mask layer 1011). Due to a planarization process, residual portions of the etching stop layer 1013 and the second spacers 1019 above the hard mask layer 1011 may be removed.

The material 1031 of the hold layer thus filled is formed in a strip shape to extend between respective columns of memory cells. Every other strip portion may be removed from these strip portions to form a hold layer.

Figure 13A:
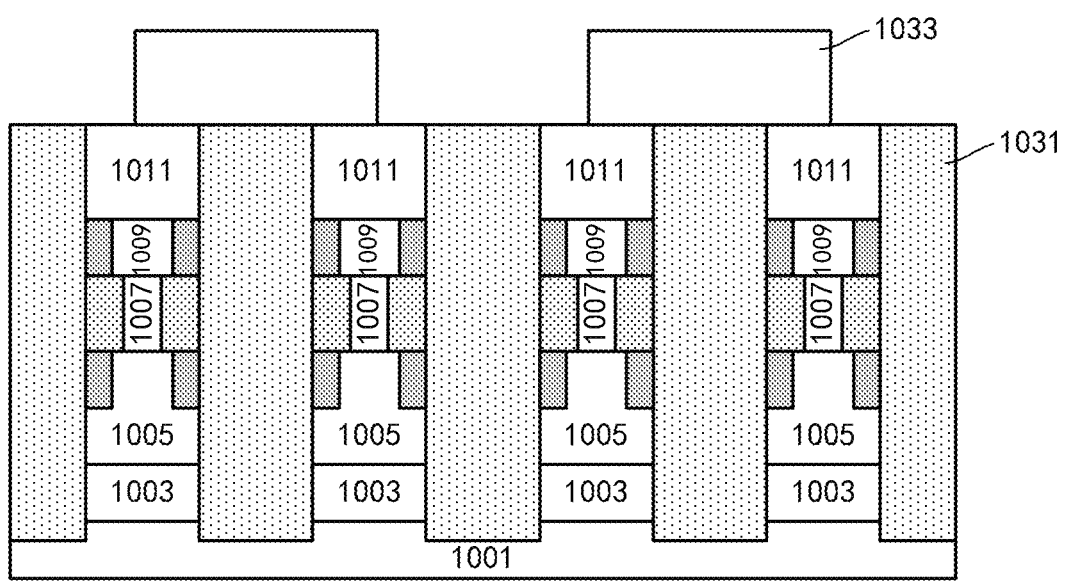
Figure 13B:
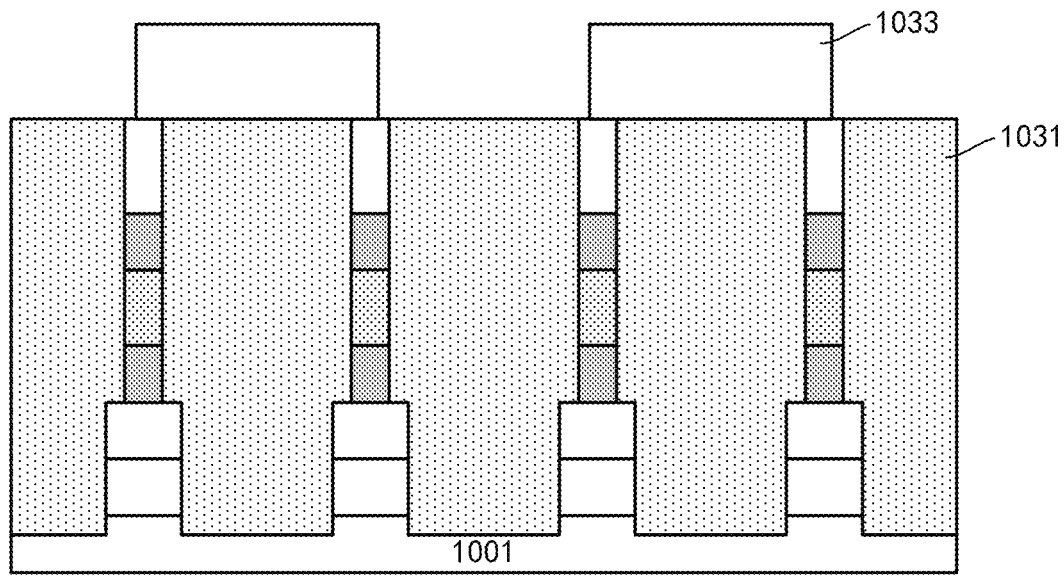
Figure 13C:
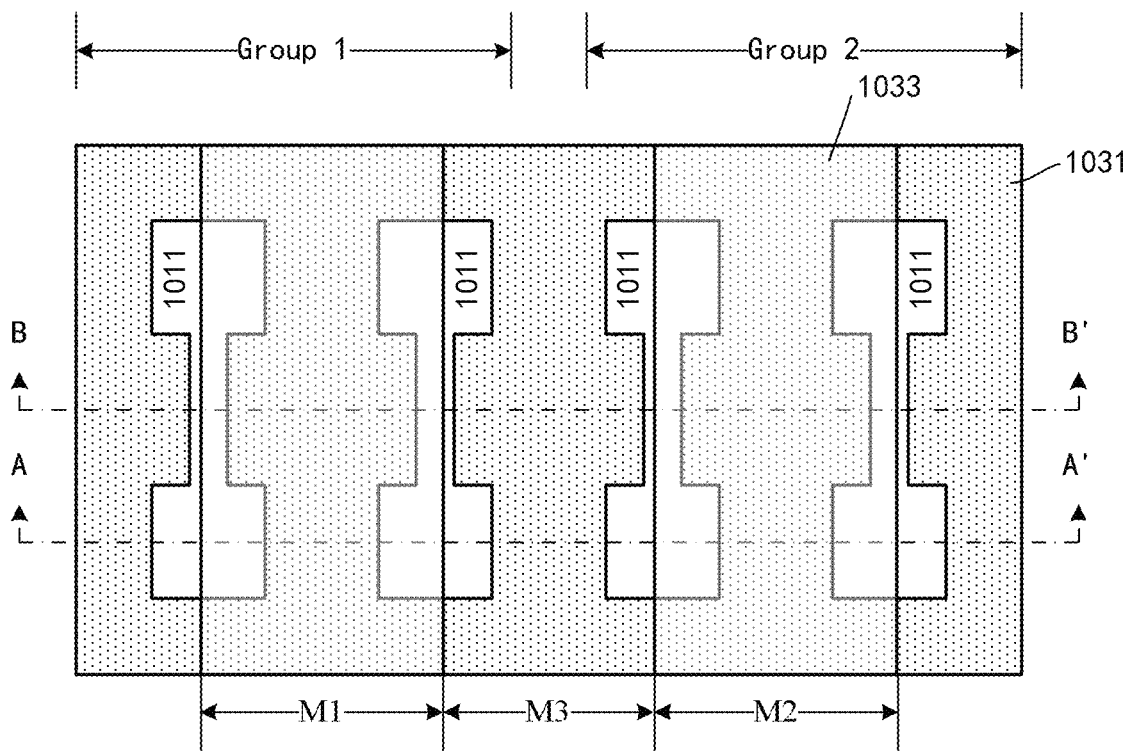

As shown in FIGS. 13(*a*), 13(*b*) and 13(*c*) (FIGS. 13(*a*) and 13(*b*) are sectional views, and FIG. 13(*c*) is a top view with line AA' indicating a position where the sectional view in FIG. 13(*a*) is taken and line BB' indicating a position where the sectional view in FIG. 13(*b*) is taken), photoresist 1033 may be formed on the structure shown in FIGS. 12(*a*) and 12(*b*) and is patterned (by, for example, photolithography) into strips extending in the first direction or the column direction. The strip-shaped photoresist covers positions between two columns in each group, for example, a position M1 between two columns in group 1 and a position M2 between two columns in group 2, and exposes positions between the groups, for example, a position M3 between the group 1 and the group 2. In addition, at the position M3 between the groups, sidewalls of the hard mask layer 1011 at this position may be at least partially or even completely exposed, so that the sacrificial layer may be exposed.

Figure 14A:
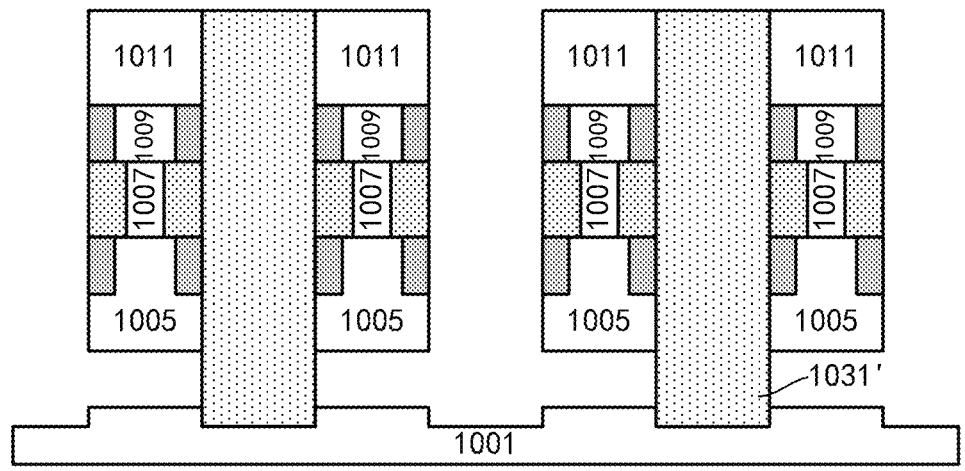
Figure 14B:
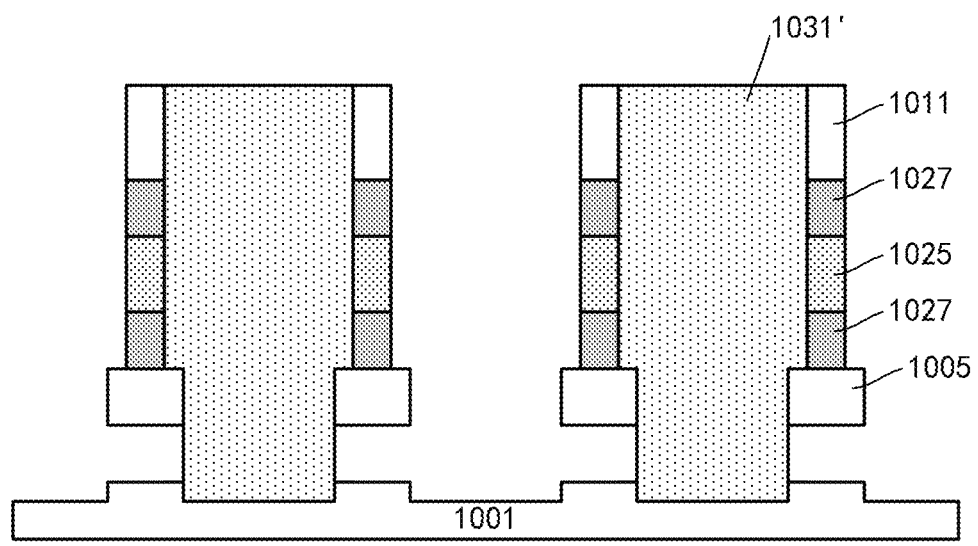
Figure 14C:
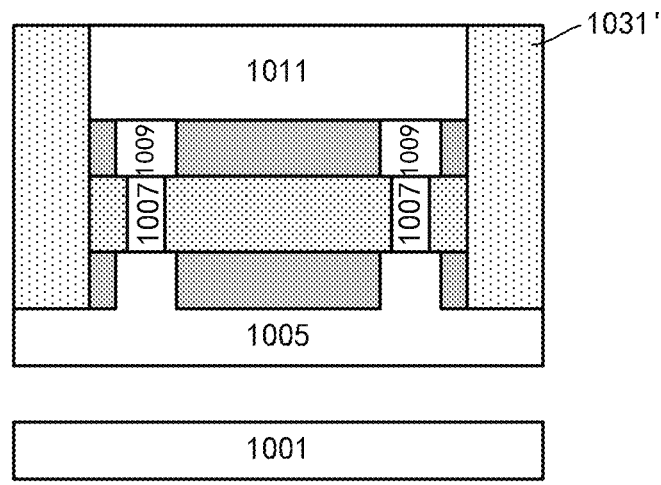

After that, as shown in FIGS. 14(*a*), 14(*b*), and 14(*c*) (FIGS. 14(*a*), 14(*b*), and 14(*c*) are sectional views taken along lines AA', BB' and CC' respectively), the material 1031 of the hold layer may be selectively etched by, for example, RIE (in, for example, the direction substantially perpendicular to the substrate surface) by using the photoresist 1033 and the hard mask layer 1011 as a mask. Thus, remaining portions of the material of the hold layer constitute a hold layer 1031'. It may be seen that the hold layer 1031' is connected to the respective active regions and is connected to the substrate 1001. Thereby, the active regions may be held during subsequent processes to avoid collapse.

The sacrificial layer 1003 (of SiGe here) may be removed by selective etching such as RIE with respect to the substrate 1001 and the first source/drain layer 1005 (both of Si here) through gaps between the respective groups. Then, a bottom surface of the first source/drain layer 1005 is exposed. Due to the presence of the hold layer 1031', the active regions may be supported.

Figure 15A:
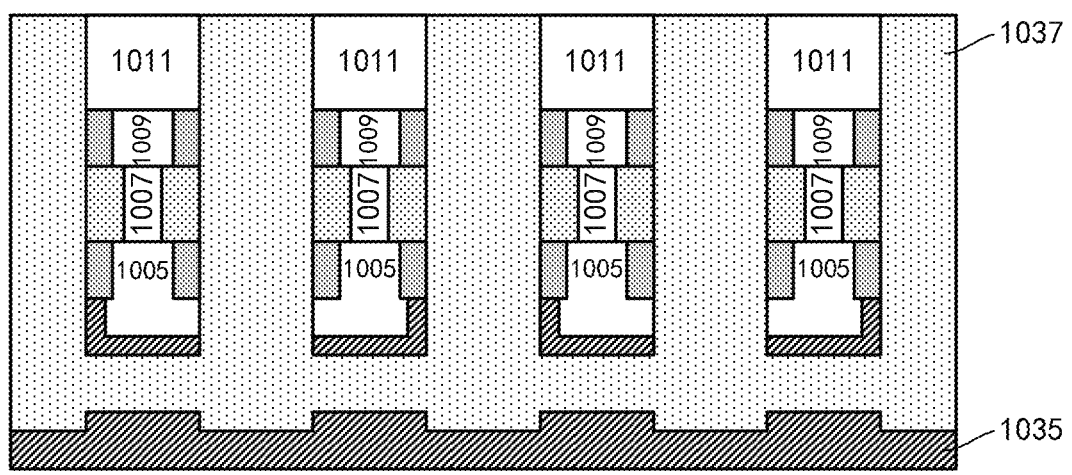
Figure 15B:
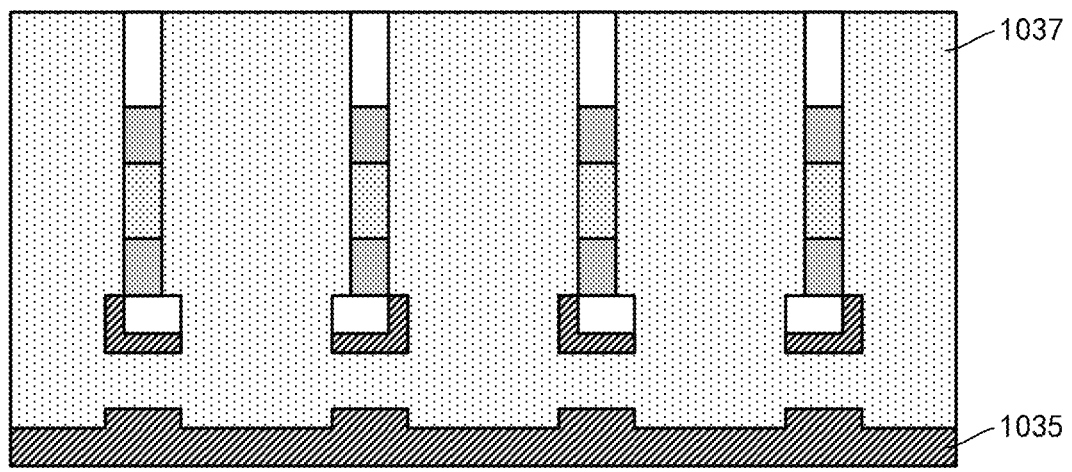
Figure 15C:
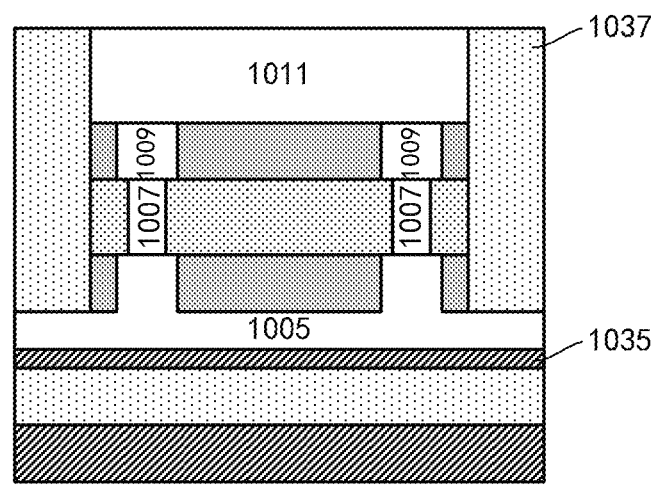

Then, as shown in FIGS. 15(*a*), 15(*b*) and 15(*c*) (FIGS. 15(*a*), 15(*b*) and 15(*c*) are sectional views taken along lines AA', BB' and CC' respectively), the first source/drain layer 1005 may undergo silicidation reaction through the gaps between the respective groups and gaps left due to the removal of the sacrificial layer 1003. For example, metal such as Ni may be deposited by, for example, ALD through these gaps and may be annealed at a temperature of, for example, 200-600° C., so that the deposited metal reacts with a semiconductor material in the first source/drain layer 1005 to produce metal silicide 1035 on the exposed bottom surface and sidewalls of the first source/drain layer 1005. The metal silicide 1035 forms bit lines. Then, unreacted excess metal may be removed by selective etching. The bit lines 1035 thus formed are self-aligned below the first source/drain layer 1005. As shown in FIG. 15(*c*), the bit lines 1035 extend continuously below the columns of memory cells.

Here, the substrate 1001 may also undergo silicidation reaction. It should be noted that in the examples shown in FIGS. 15(*a*), 15(*b*), and 15(*c*), the substrate 1001 is completely converted into silicide, however the present disclosure is not limited thereto. For example, only an upper portion of the substrate 1001 is converted into silicide.

Although the formation of the bit lines is described here by taking the silicidation reaction of a silicon element with a metal element as an example, the present disclosure is not limited thereto. Depending on the semiconductor element included in the first source/drain layer, it is also possible to produce a metal semiconductor compound which results from a reaction of another semiconductor element such as Ge or the like with one or more of metal elements such as Ni, Pt, Co, Ti, Si, Ge, or the like.

In addition, the bit lines are formed in a manner which is not limited to the silicidation reaction. For example, the bit lines may be formed by filling a conductive material such as metal below the lower first source/drain layer 1005 through the above gaps.

Then, the bit lines 1035 buried below the respective active regions are formed.

For the purpose of electrical isolation, a dielectric may be filled in the above gaps. In this example, the dielectric may have the same material, such as oxide, as the hold layer 1031', and therefore they are collectively shown as 1037. This may be done by, for example, depositing oxide and performing a planarization process such as CMP (which is stopped at the hard mask layer 1011).

Next, gate stacks and word lines electrically connected thereto may be formed.

Figure 16A:
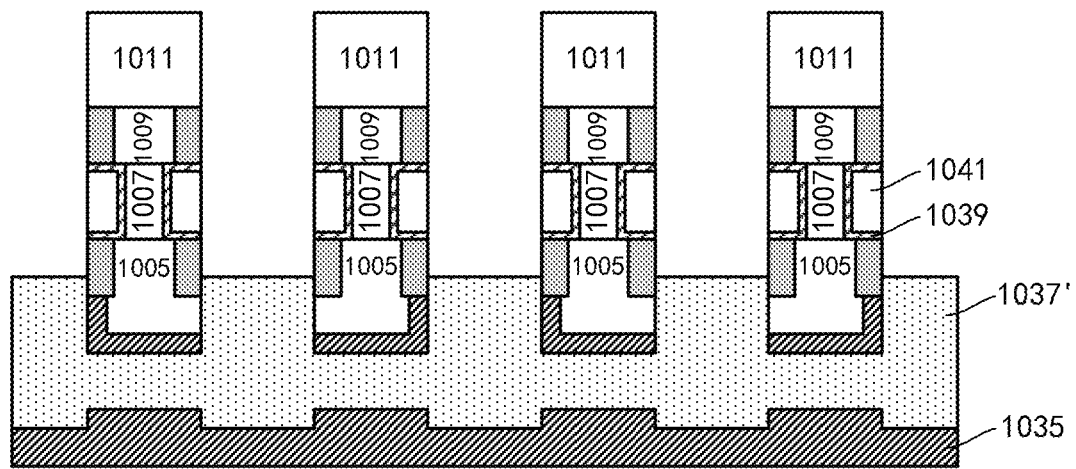
Figure 16B:
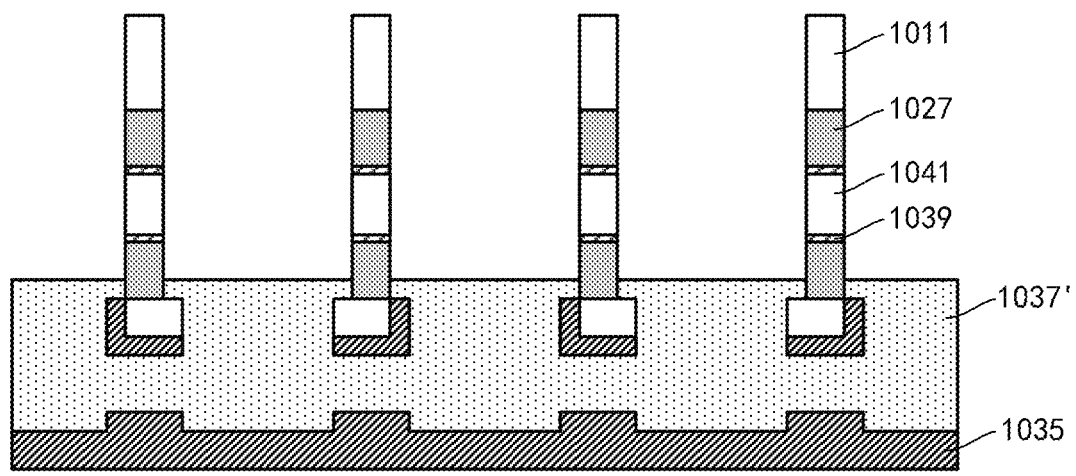
Figure 16C:
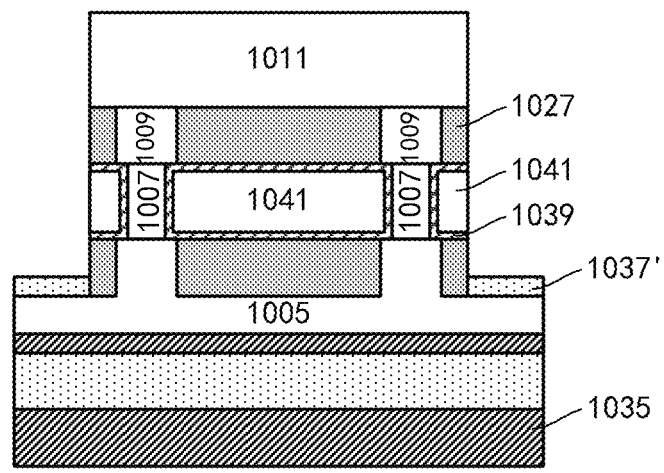
Figure 17A:
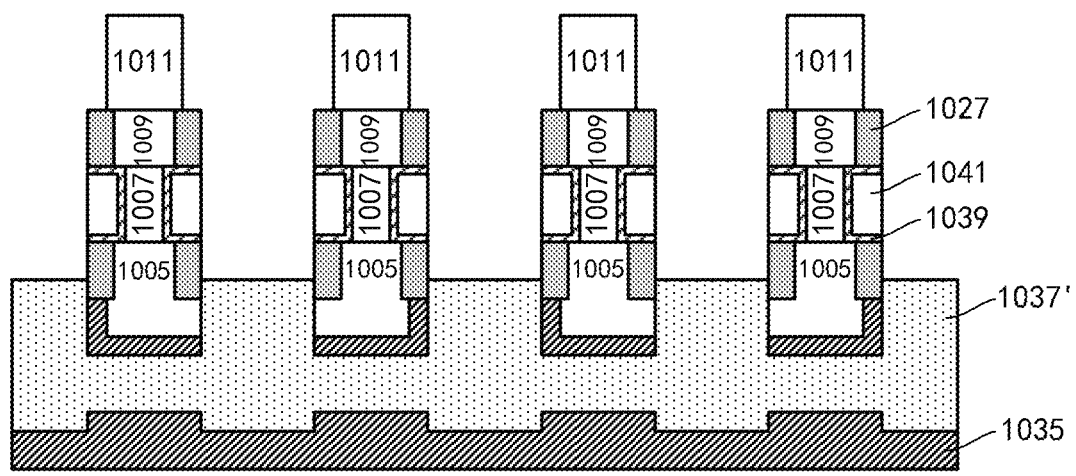
Figure 17B:
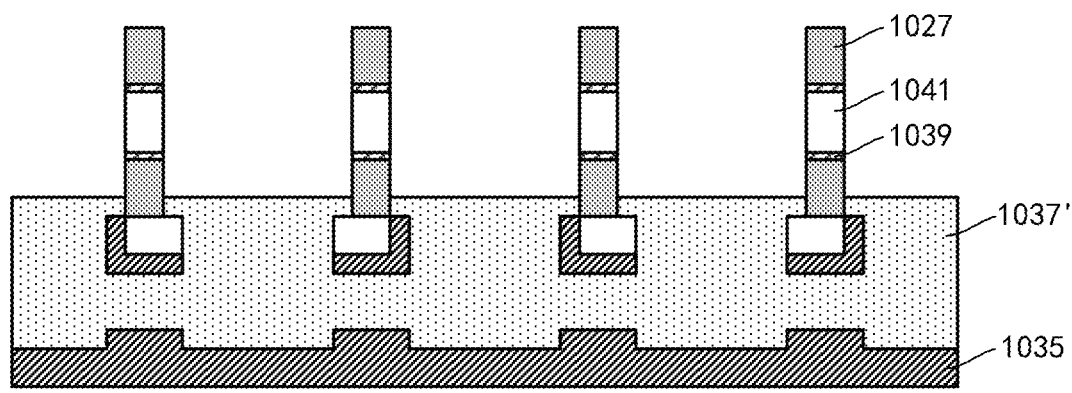
Figure 17C:
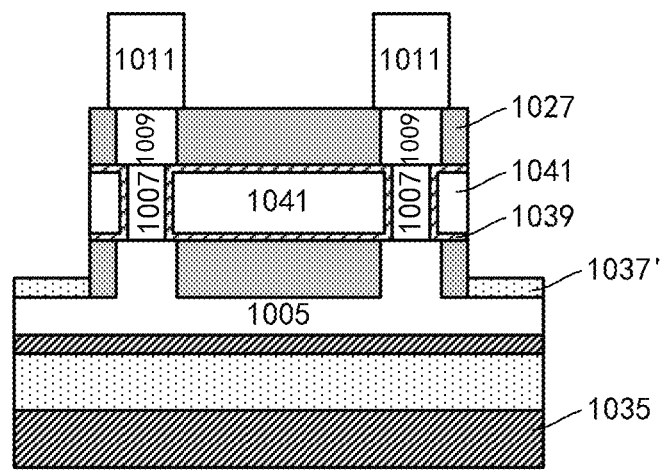
Figure 17D:
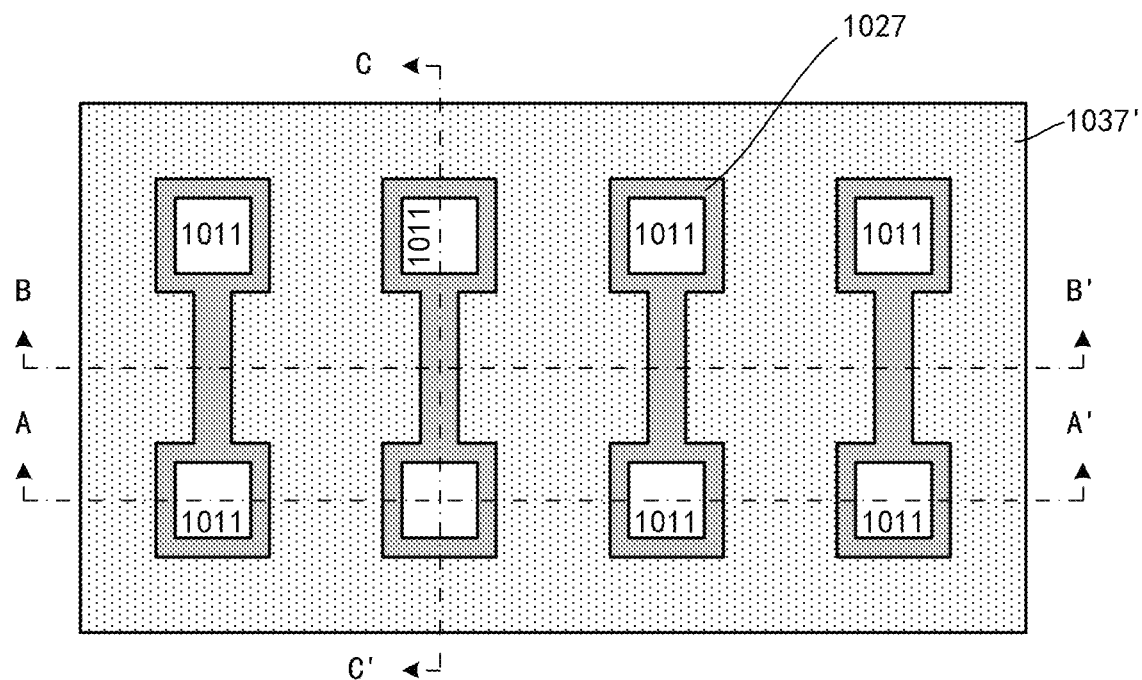
Figure 18A:
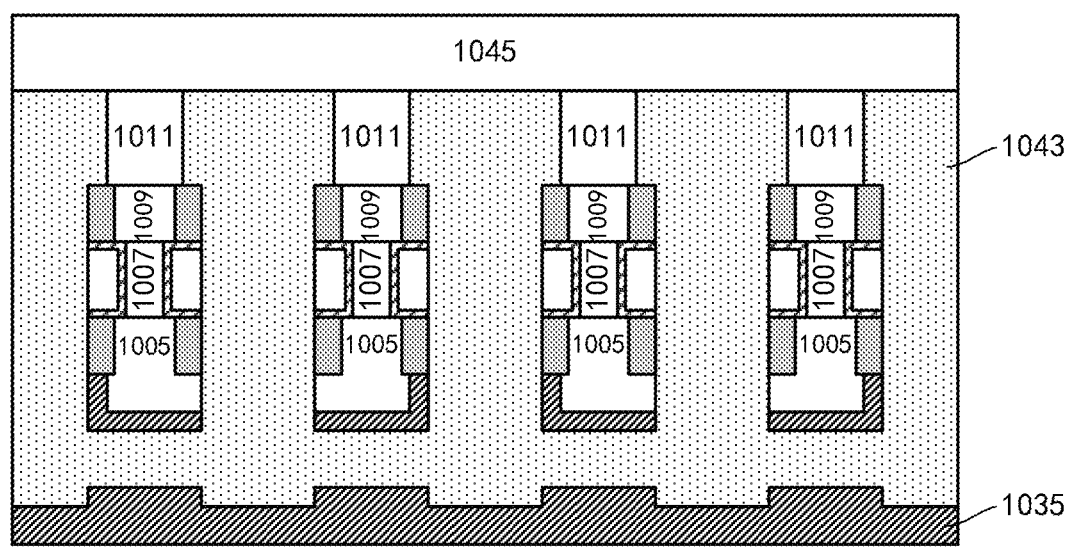
Figure 18B:
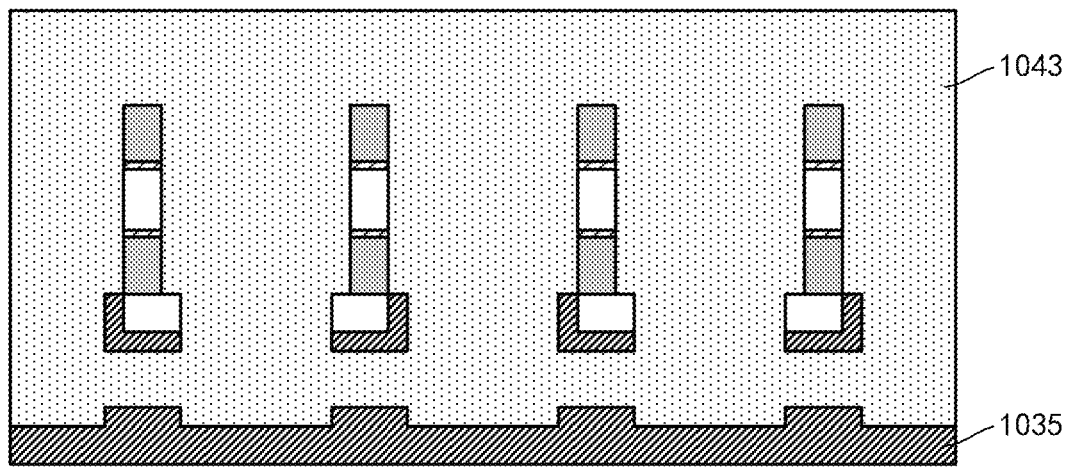
Figure 18C:
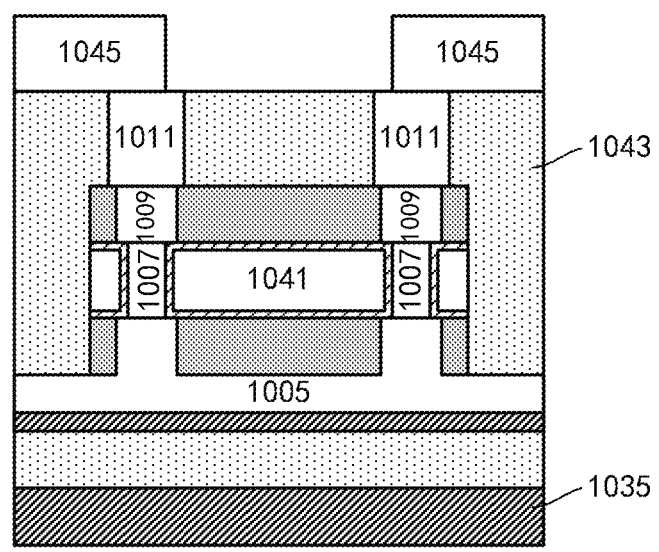
Figure 18D:
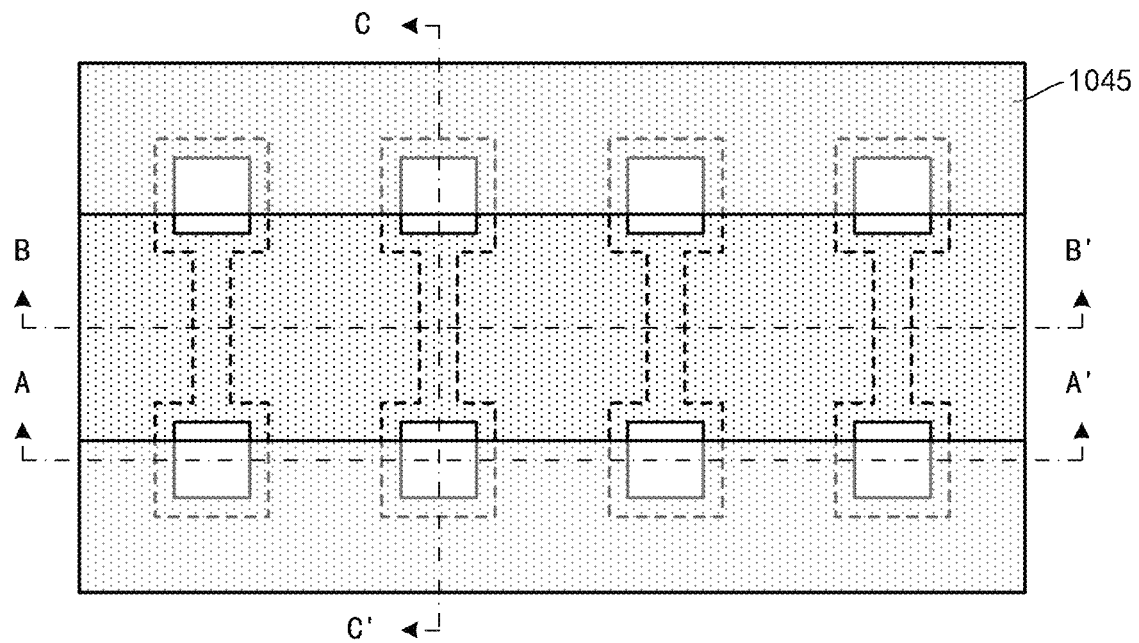

In order to form the gate stacks, the sacrificial gate needs to be exposed. Therefore, as shown in FIGS. 16(*a*), 16(*b*) and 16(*c*) (FIGS. 16(*a*), 16(*b*) and 16(*c*) are sectional views taken along lines AA', BB' and CC' respectively), the dielectric layer 1037 may be etched back so that the dielectric layer 1037 has its top surface lowered to a level below, for example, the bottom surface of the channel layer 1007 to expose the sacrificial gate 1025. The dielectric layer 1037 after being etched back is labeled as 1037'. Certainly, in order to avoid possible influence on the source/drain layers and the bit lines, the dielectric layer 1037' preferably has its top surface at a level above the bottom surface of the protection layer 1027.

The sacrificial gate 1025 (of nitrogen oxide here) may be removed by selective etching with respect to the protection layer 1027 (of SiC here), the hard mask layer 1011 (of nitride here), and the dielectric layer 1037' (of oxide here). Due to the removal of the sacrificial gate 1025, gaps are left below the hard mask layer 1011. Gate stacks may be formed in the gaps. For example, a gate dielectric layer 1039 and a gate conductor layer 1041 may be sequentially deposited, and the deposited gate conductor layer 1041 (and optionally gate dielectric layer 1039) may be selectively etched by, for example, RIE (in, for example, the direction substantially perpendicular to the substrate surface) to fill the gate stacks in the gaps below the hard mask layer. For example, the gate dielectric layer 1039 may include a high-k gate dielectric such as $HfO_2$ with a thickness of about 1-5 nm; and the gate conductor layer 1041 may include a metal gate conductor. In addition, a work function adjustment layer may further be formed between the gate dielectric layer 1039 and the gate conductor layer 1041. An interface layer of, for example, oxide may further be formed before the gate dielectric layer 1039 is formed.

According to another embodiment, the gate stacks may form a storage configuration. For example, a floating gate layer or a charge trapping layer or a ferro-electric material or the like may be deposited before the gate conductor layer 1041 is deposited.

As described above, the sacrificial gate 1025 is self-aligned with the channel layer 1007, and therefore the gate stacks 1039/1041 with which the sacrificial layer 1025 is replaced are also self-aligned with the channel layer 1007. In addition, the gate stacks also have bridge portions corresponding to those of the hard mask layer 1011.

According to an embodiment of the present disclosure, contact plugs which are self-aligned may further be formed using the hard mask layer 1011. To this end, as shown in FIGS. 17(*a*), 17(*b*), 17(*c*) and 17(*d*) (FIGS. 17(*a*), 17(*b*) and 17(*c*) are sectional views, and FIG. 17(*d*) is a top view with line AA' indicating a position where the sectional view in FIG. 17(*a*) is taken, line BB' indicating a position where the sectional view in FIG. 17(*b*) is taken, and line CC' indicating a position where the sectional view in FIG. 17(*c*) is taken), as in the above processing of the channel layer and the source/drain layers, the hard mask layer 1011 may be selectively etched, particularly isotropically etched, to remove the bridge portions thereof, so that the hard mask layer 1011 is separated into portions at the respective memory cells. In order to control an amount of etching, ALE or digital etching may be used. Since the processing is performed in the same manner, the separated portions of the hard mask layer 1011 are self-aligned with the active regions of the respective memory cells.

Then, word lines electrically connected to the respective gate stacks may be formed. According to an embodiment of the present disclosure, the word lines may also be manufactured in a self-alignment manner. The word lines may be formed at positions between the respective rows of active regions, and extend in a direction of the rows of active regions.

As shown in FIGS. 18(*a*), 18(*b*), 18(*c*) and 18(*d*) (FIGS. 18(*a*), 18(*b*), and 18(*c*) are sectional views, and FIG. 18(*d*) is a top view with line AA' indicating a position where the sectional view in FIG. 18(*a*) is taken, line BB' indicating a position where the sectional view in FIG. 18(*b*) is taken, and line CC' indicating a position where the sectional view in FIG. 18(*c*) is taken), a dielectric may be filled in gaps of the stacks for electrical isolation. Here, the filled dielectric is also oxide and is therefore shown as 1043 together with the dielectric layer 1037' described above. For example, oxide may be deposited on the structure shown in FIGS. 17(*a*), 17(*b*), 17(*c*) and 17(*d*), and may be planarized by, for example, CMP (which is stopped at the hard mask layer 1011) to form a dielectric layer 1043.

Then, positions where the word lines are formed may be defined in the dielectric layer 1043. For example, a mask layer such as photoresist 1045 may be formed on the dielectric layer 1043 and may be patterned (by, for example, photolithography) into strips which extend in the second direction or the row direction and expose positions between two rows where bridge portions exist. In addition, for the purpose of self-alignment, the strip-shaped photoresist 1045 may expose a portion of the sidewalls of the hard mask layer 1011 on a side close to the bridge portions.

Figure 19A:
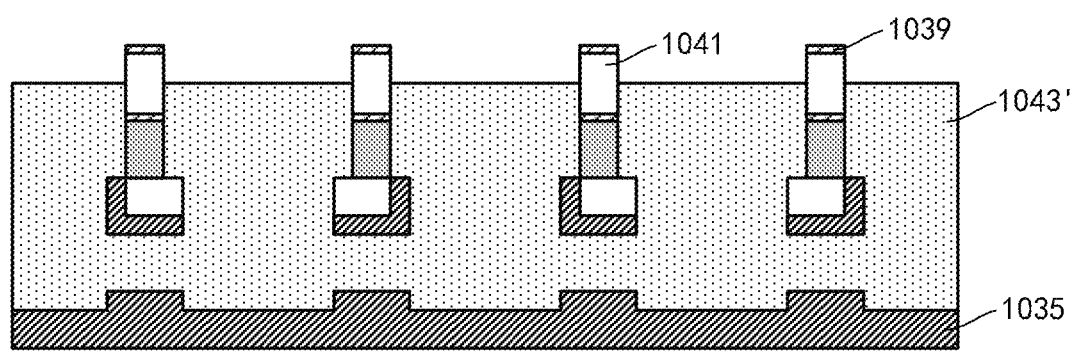
Figure 19B:
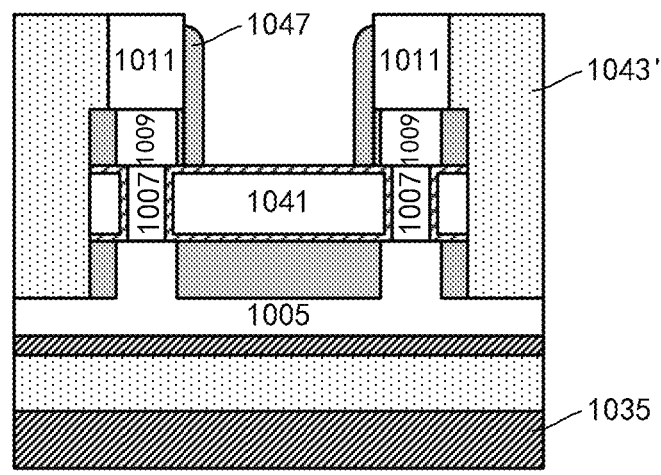

As shown in FIGS. 19(*a*) and 19(*b*) (FIGS. 19(*a*) and 19(*b*) are sectional views taken along lines BB' and CC' respectively), the dielectric layer 1043 and the protection layer 1027 may be selectively etched by, for example, RIE (which is, for example, stopped at the gate dielectric layer 1039) (in, for example, the direction substantially perpendicular to the substrate surface) using the photoresist 1045 as a mask to expose the gate stacks, particularly bridged portions thereof, so that the word lines may then be connected to the gate stacks, particularly the gate conductor layer 1041. The etched dielectric layer is labeled as 1043'. After that, the photoresist 1045 may be removed.

In this embodiment, the hard mask layer 1011 may then be replaced with contact plugs. To avoid electrical contact between the contact plugs (and possibly the second source/drain layer 1009) and the word lines, isolation layers 1047 may be formed on the exposed sidewalls of the hard mask layer 1011. For example, the isolation layers 1047 may include low-k silicon carbide. Here, the isolation layers 1047 may be formed using a spacer formation process. Certainly, due to the characteristics of the spacer formation process, the isolation layers 1047 may also be formed on vertical sidewalls of the dielectric layer 1043' which extend in the row direction. Then, as shown in FIG. 20(*c*), the isolation layers 1047 continuously extend in the row direction, and portions of the isolation layers which extend around the hard mask layer 1011 remain substantially conformal with the hard mask layer 1011.

Figure 20A:
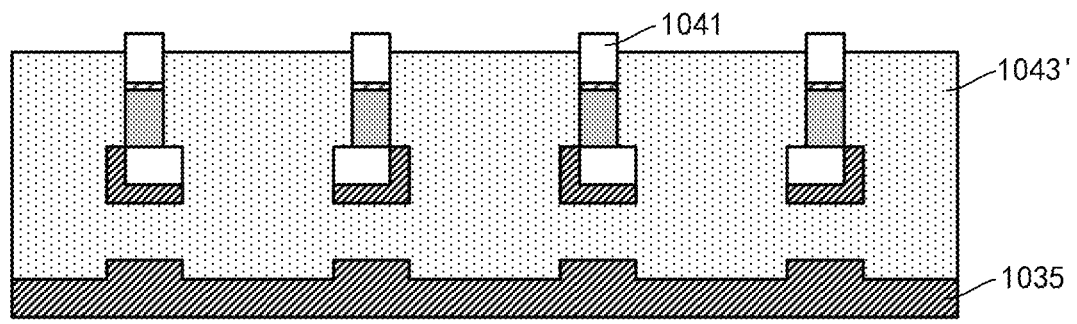
Figure 20B:
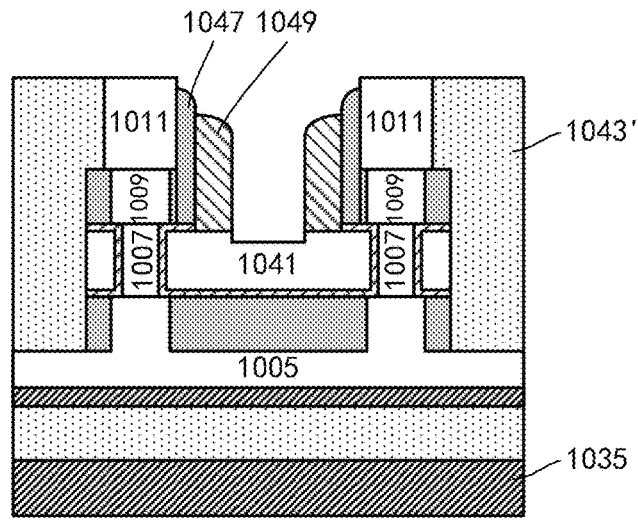
Figure 20C:
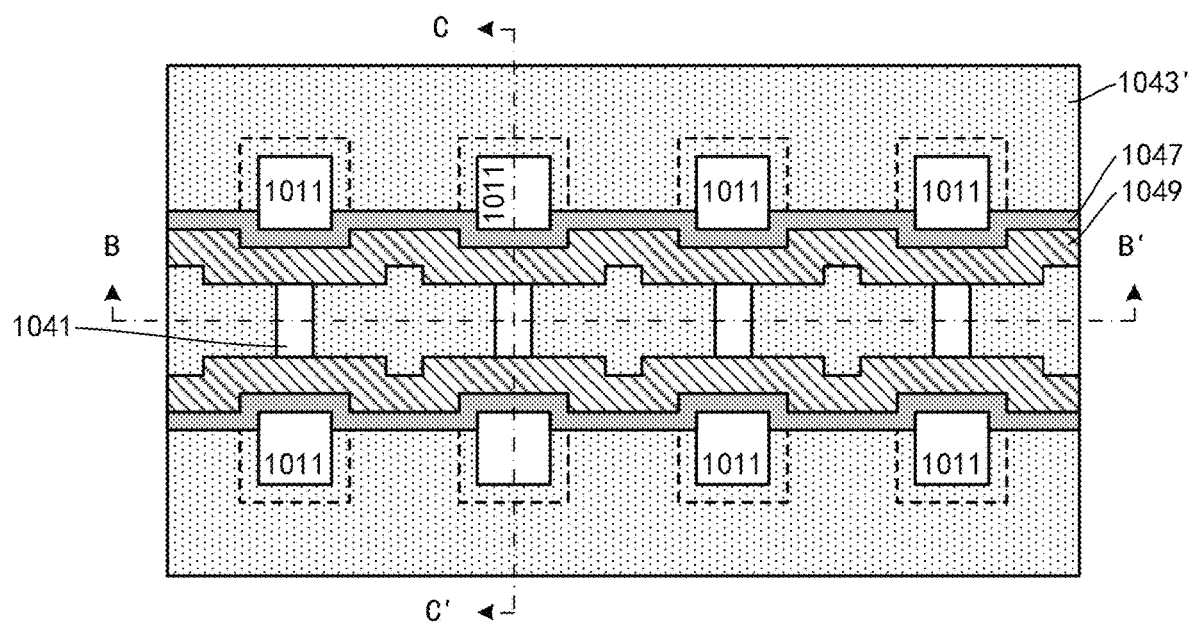
Figure 21A:
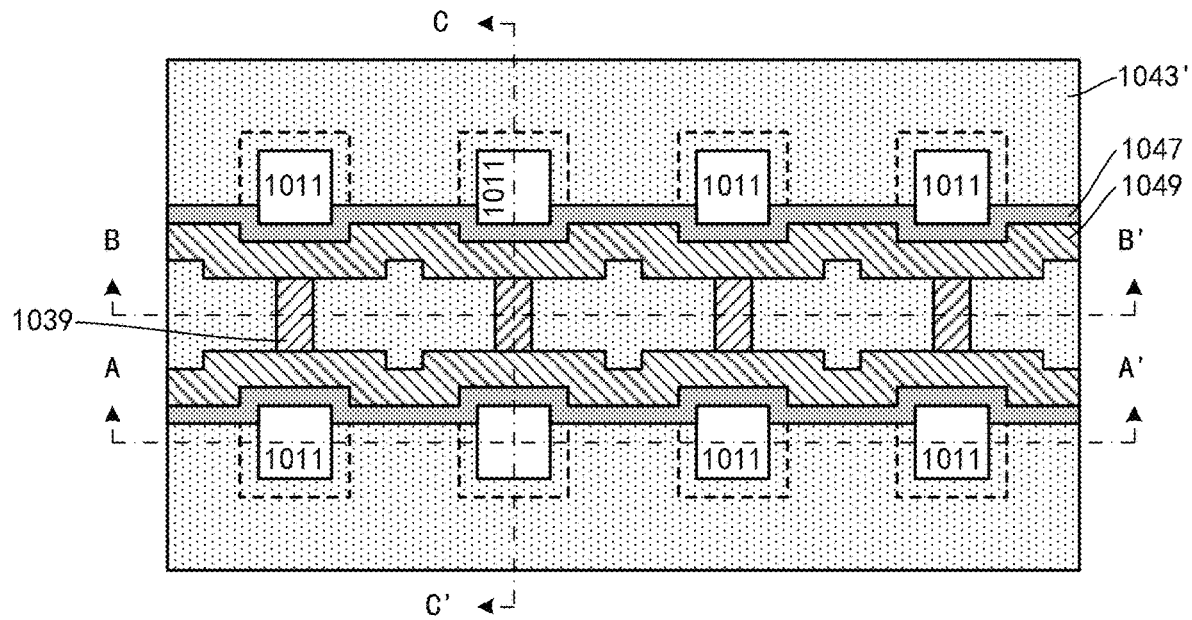
Figure 21B:
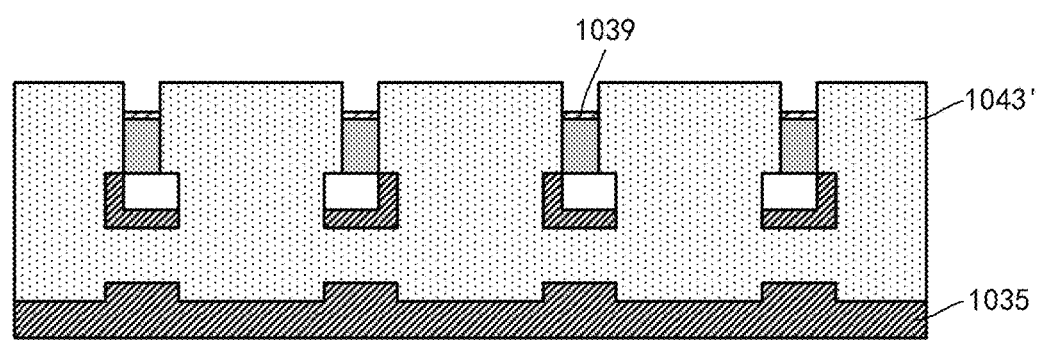
Figure 21C:
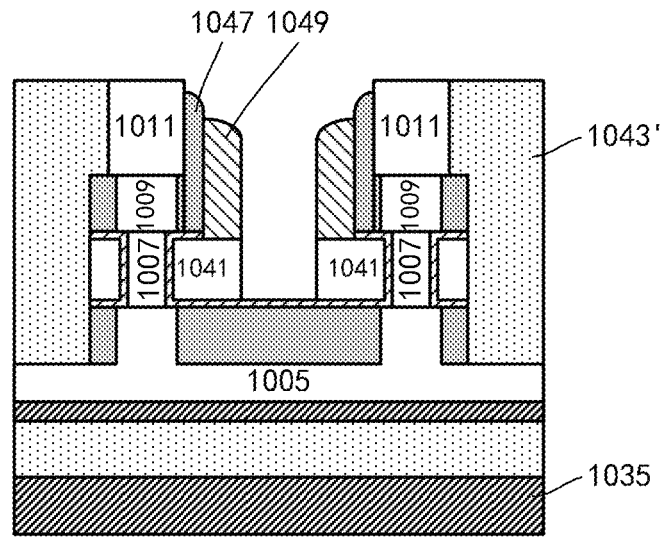

As shown in FIGS. 20(*a*), 20(*b*) and 20(*c*) (FIGS. 20(*a*) and 20(*b*) are sectional views, and FIG. 20(*c*) is a top view with line BB' indicating a position where the sectional view in FIG. 20(*a*) is taken, and line CC' indicating a position where the sectional view in FIG. 20(*b*) is taken), the exposed portions of the gate dielectric layer 1039 may be selectively etched by, for example, RIE, to expose the gate conductor layer 1041. After that, word lines 1049 which are in contact with the gate conductor may be formed. For example, conductive spacers may be formed on the sidewalls of the dielectric spacers 1047 as the word lines 1049 using the spacer formation process as well. The conductive spacers 1049 may include a conductive material, for example metal such as tungsten (W). The bottom of the word lines 1049 is in contact with the gate conductor layer 1041 (so as to be electrically connected to each other). Due to the characteristics of the spacer formation process, the word lines 1049 extend continuously in the row direction and remain substantially conformal with the isolation layers 1047.

Two adjacent rows of memory cells are still connected to each other due to the bridge portions of the gate conductor layer. As shown in FIGS. 21(*a*), 21(*b*) and 21(*c*) (FIG. 21(*a*) is a top view and FIGS. 21(*b*) and 21(*c*) are sectional views taken along lines BB' and CC' in FIG. 21(*a*) respectively), the exposed portions of the gate conductor layer may be selectively etched by, for example, RIE, to isolate the gate stacks between different memory cells from each other. Thus, extensions of the gate conductor layer which extend outwards from the beneath of the hard mask layer are self-aligned below the bit lines.

According to another embodiment, instead of directly forming the conductive spacers as the word lines, a dummy word line spacer (of, for example, polysilicon) is formed firstly. The dummy word line spacer is used to perform RIE on the gate conductor layer using the operations described in conjunction with FIGS. 21(a), 21(b), and 21(c) to isolate the respective memory cells. Spaces in the gate stacks which are left due to the etching of the gate conductor layer may be filled with a dielectric such as oxide. Then, the dummy word line spacer may be removed and conductive spacers may be formed as the word lines.

In the above embodiments, a double-spacer structure is formed, but the present disclosure is not limited thereto. For example, if through holes are etched in the hard mask layer 1011 and are filled with a conductive material to form conductive vias (and the second source/drain layer 1009 is recessed with respect to the hard mask layer 1011), instead of replacing the hard mask layer 1011 with the contact plugs, the isolation layers 1047 may not be formed. Certainly, the isolation layers 1047 are useful to ensure electrical isolation.

In addition, the isolation layers 1047 and the word lines 1049 are not limited to be in a form of spacers. For example, a conductive material may be formed in all the gaps between the isolation layers 1047 (in, for example, a conformal manner), and the conductive material may be cut off in the middle in the row direction to form two word lines respectively.

Then, the respective contacts of the device may be formed.

Figure 22A:
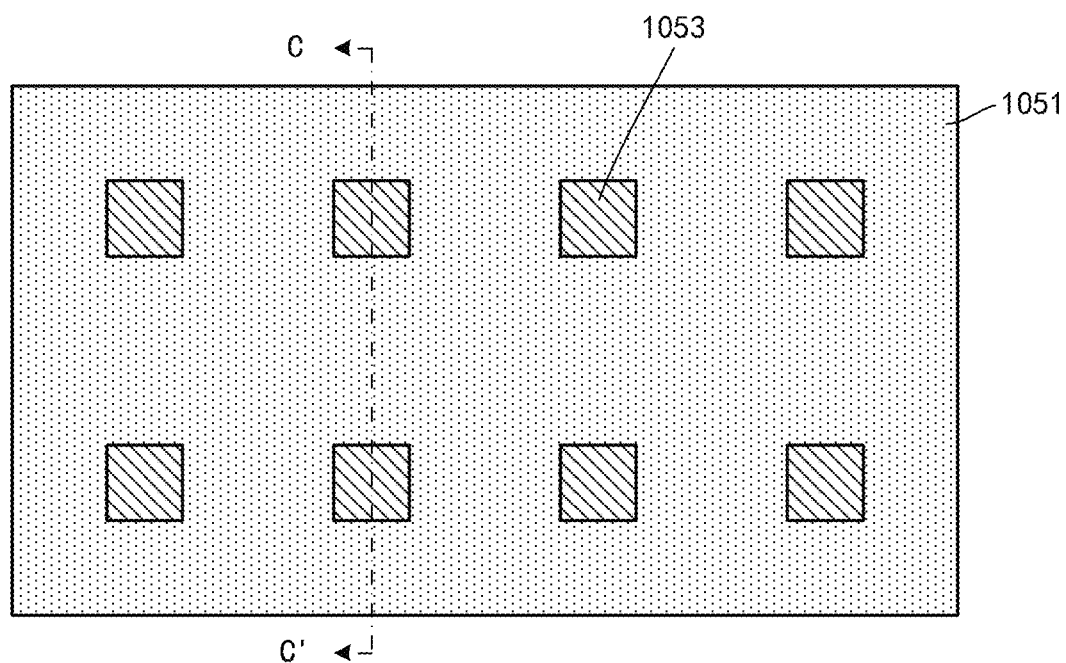
Figure 22B:
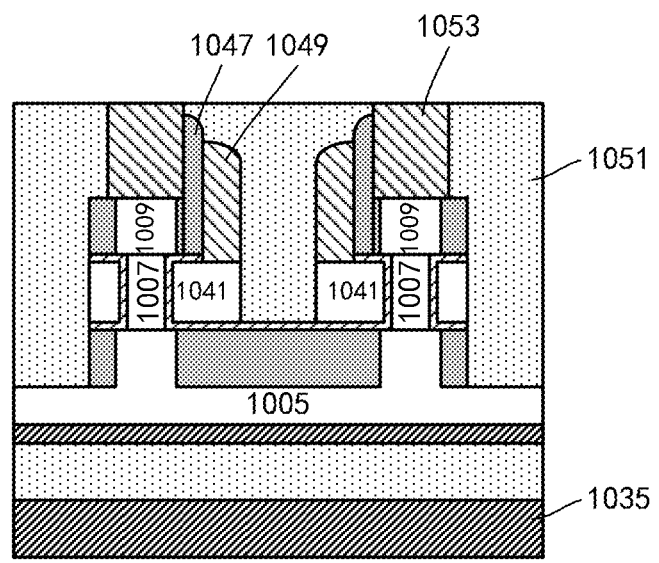

For example, as shown in FIGS. 22(a) and 22(b) (FIG. 22(a) is a top view, and FIG. 22(b) is a sectional view taken along line CC in FIG. 22(a)), a dielectric may be filled in the gaps of the stacks for electrical isolation. Here, the filled dielectric is still oxide and is thus shown as 1051 along with the previous dielectric layer 1043'. For example, oxide may be deposited on the structure shown in FIGS. 21(a), 21(b) and 21(c) and the oxide may be planarized by, for example, CMP (which is stopped at the hard mask layer 1011) to form the dielectric layer 1051.

The hard mask layer 1011 may be removed by selective etching such as wet etching or RIE. A conductive material, for example, metal such as W, may be filled in the spaces left due to the removal of the hard mask layer 1011, so as to form contact plugs 1053. Since the hard mask layer 1011 is self-aligned with the underlying active regions, the contact plugs 1053 are also self-aligned with the respective active regions, particularly the second source/drain layer 1009.

Figure 23A:
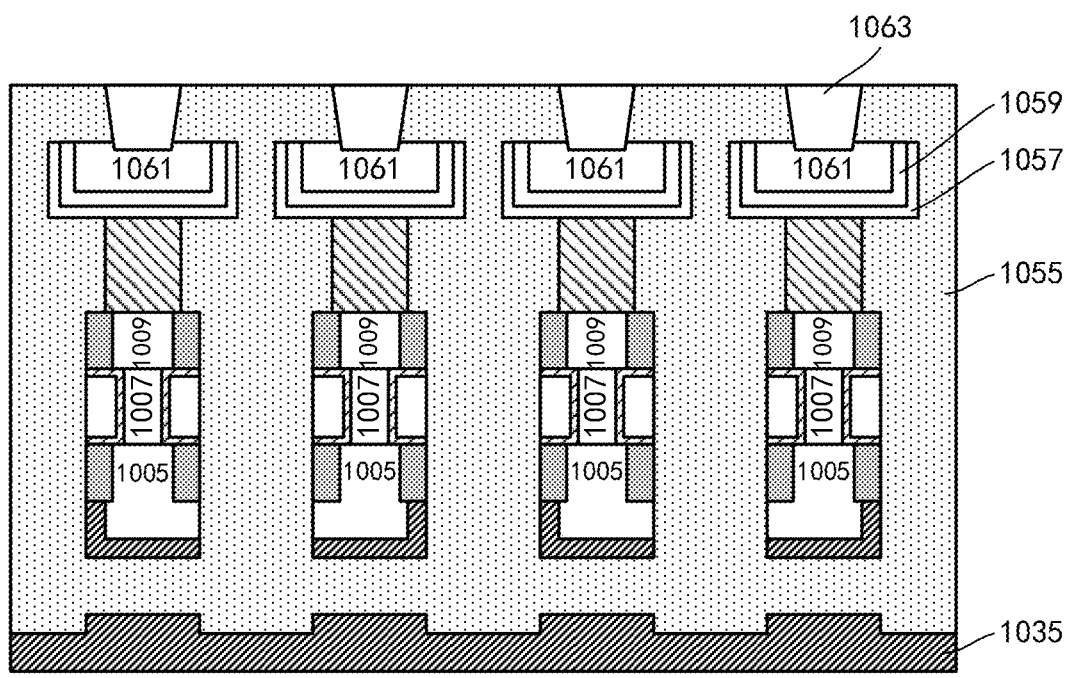
Figure 23B:
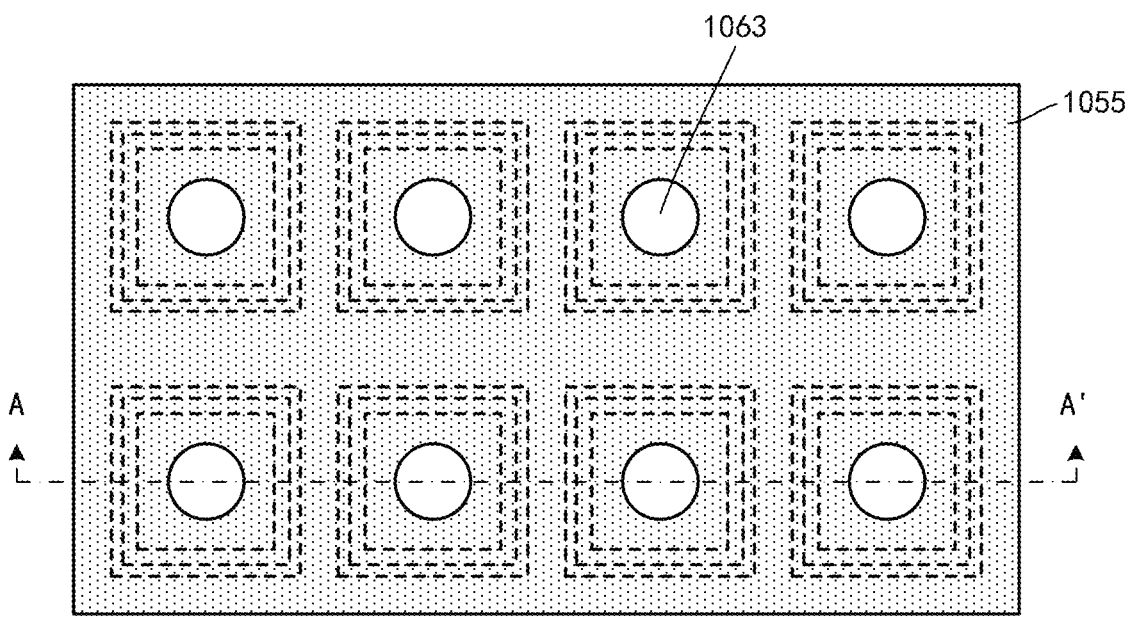

In an example in which a 1T1C configuration is formed, storage elements such as capacitors may further be formed. For example, as shown in FIGS. 23(a) and 23(b) (FIG. 23(a) is a sectional view, and FIG. 23(b) is a top view with line AA' indicating a position where the sectional view in FIG. 23(a) is taken), an interlayer dielectric layer of, for example, oxide, with a first thickness, is formed on the dielectric layer 1051, and storage elements corresponding to the respective vertical devices may be formed in the interlayer dielectric layer with the first thickness. For example, holes corresponding to the respective vertical devices may be etched, and a first plate layer 1057, a capacitive dielectric layer 1059, and a second plate layer 1061 are sequentially filled in the holes to form capacitors as storage elements. For example, the first plate layer 1057 and the second plate layer 1061 may include metal, and the capacitive dielectric layer 1059 may include a high k dielectric. The capacitors may be electrically connected to upper source/drain regions of the respective vertical devices through the respective contact plugs 1053.

Then, an interlayer dielectric layer of, for example, oxide, with a second thickness, may further be formed. The interlayer dielectric layer with the second thickness is shown as 1055 along with the interlayer dielectric layer with the first thickness and the dielectric layer 1051. Electrical contacts 1063 to the second plate layer 1061 of the respective capacitors may be formed in the interlayer dielectric layer with the second thickness. These contacts may be formed by etching holes in the interlayer dielectric layer and filling a conductive material, for example, metal such as W therein. A diffusion barrier layer of, for example, TiN, may further be formed on sidewalls of the holes before the metal is filled.

In the above embodiments, one word line is formed for each row of memory cells. However, the present disclosure is not limited thereto. According to an embodiment of the present disclosure, a pair of word lines extending on opposite sides of each row of memory cells may be formed.

Figure 24:
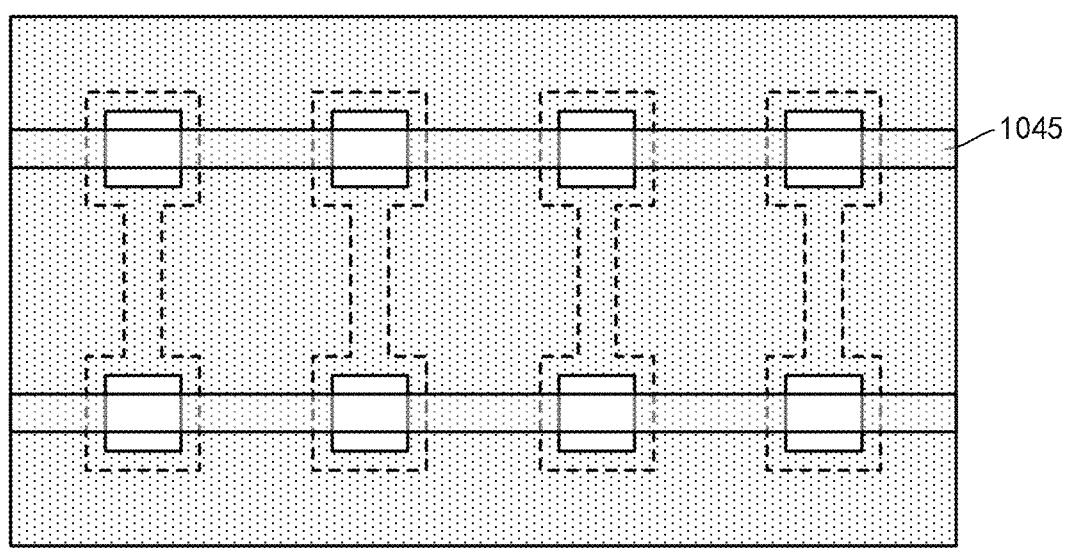
FIGS. 24 and 25 are schematic views showing a configuration of bit lines according to another embodiment of the present disclosure.
Figure 25:
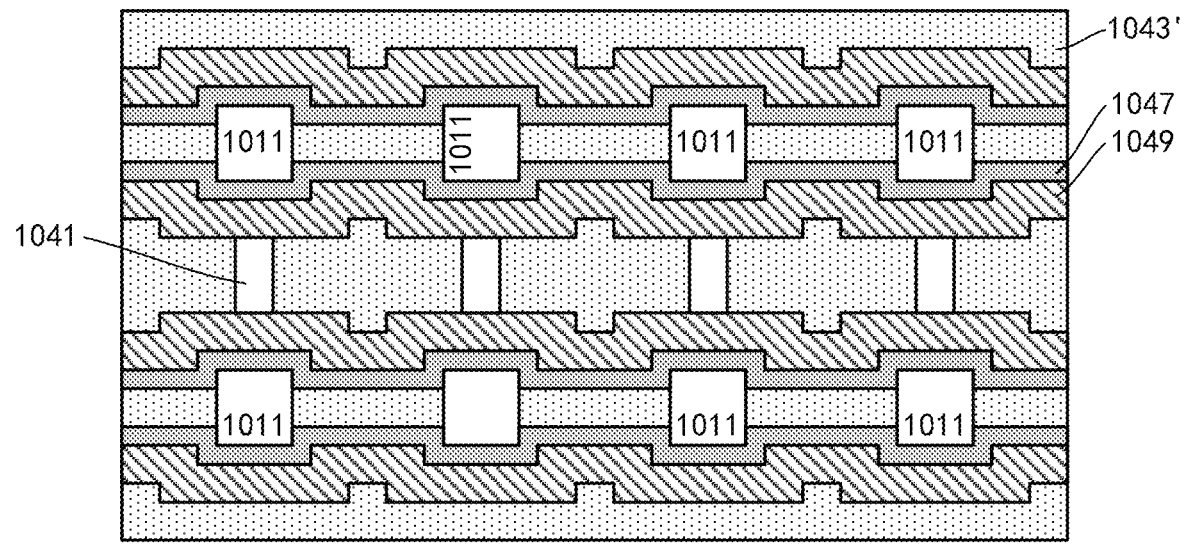

FIGS. 24 and 25 are schematic views showing configuration of bit lines according to another embodiment of the present disclosure.

As shown in FIG. 24, in the operations described above in conjunction with FIGS. 18(a), 18(b), 18(c), and 18(d), the photoresist 1045 may be patterned into a series of strips, which extend above the respective rows of memory cells, and expose a portion of the sidewalls of the mask layer 1011 on opposite sides. Thus, when the word lines are formed according to the operations described above in connection with FIGS. 19(a) to 20(c), word lines may be formed on opposite sides of each row of memory cells. The two word lines for each row of memory cells may be electrically connected to each other (through, for example, a word line contact formed later).

Figure 26:
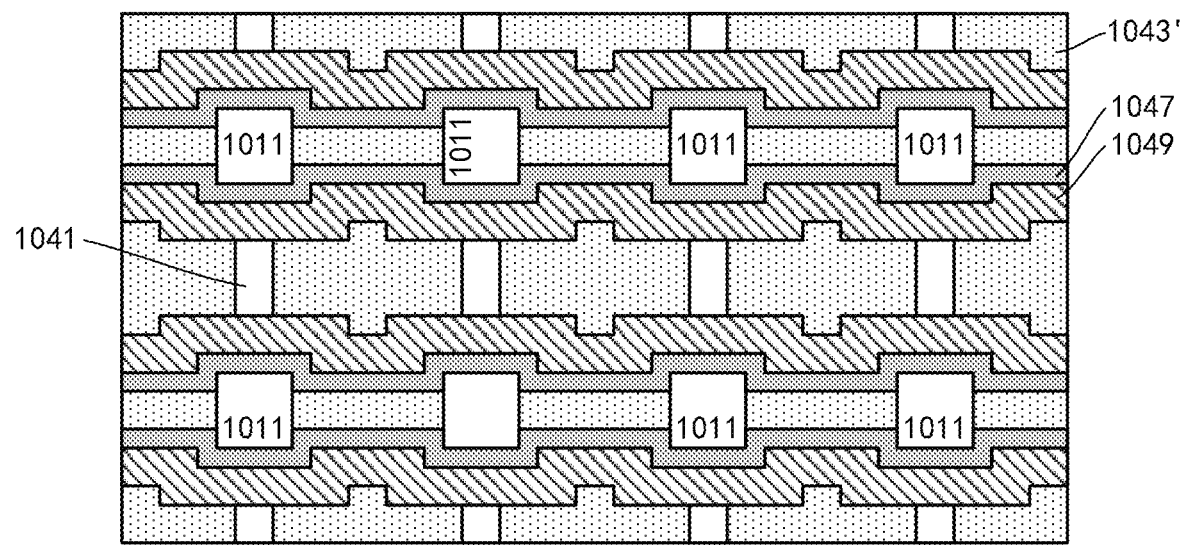
FIG. 26 is a schematic view showing a configuration of bridge portions according to another embodiment of the present disclosure.

In addition, when word lines are formed on opposite sides of a row of memory cells, bridge portions may also be formed on the opposite sides of the row of memory cells, instead of being formed on only one side as in the above embodiments. FIG. 26 is a schematic view showing configuration of bridge portions according to another embodiment of the present disclosure. As shown in FIG. 26, bridge portions extending in a column direction may be formed on opposite sides of each row of memory cells. As described above, this can be done by omitting the operation of selectively etching the first spacers 1017 described above in conjunction with FIGS. 5(a) and 5(b). In this case, each word line may extend vertically downwards to be in contact with bridge portions of a corresponding gate conductor.

It should be noted that the configuration of the word lines and the bridge portions may not be completely consistent across the substrate. For example, in some regions, word lines and bridge portions may be provided on one side, while in other regions, word lines and bridge portions may be provided on opposite sides.

Figure 27:
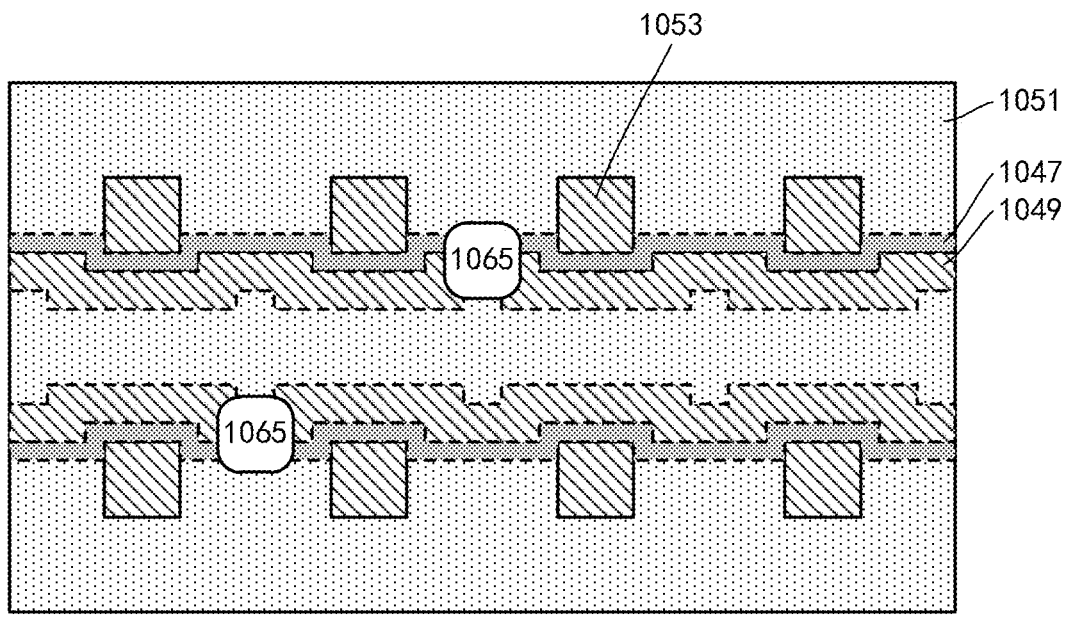
FIG. 27 is a schematic view showing an arrangement of word line contacts according to an embodiment of the present disclosure.

FIG. 27 is a schematic view showing an arrangement of word line contacts according to an embodiment of the present disclosure. As shown in FIG. 27, after the dielectric layer 1051 (which covers the word lines) is formed in the operation described above in conjunction with FIGS. 22(a) and 22(b), word line contacts 1065 may be formed therein for manufacturing interconnections to the word lines 1049 later. Such word line contacts 1065 may be manufactured using the contact manufacturing process described above. The word line contacts 1065 may be arranged between adjacent columns of memory cells. To this end, a spacing between the respective columns of memory cells may be appropriately increased at positions where the word line contacts 1065 need to be formed.

FIG. 27 shows a case where word line contacts to word lines of adjacent rows of memory cells are located between different pairs of adjacent columns of memory cells. In this case, mutual interference between adjacent word line contacts may be avoided.

Figure 28:
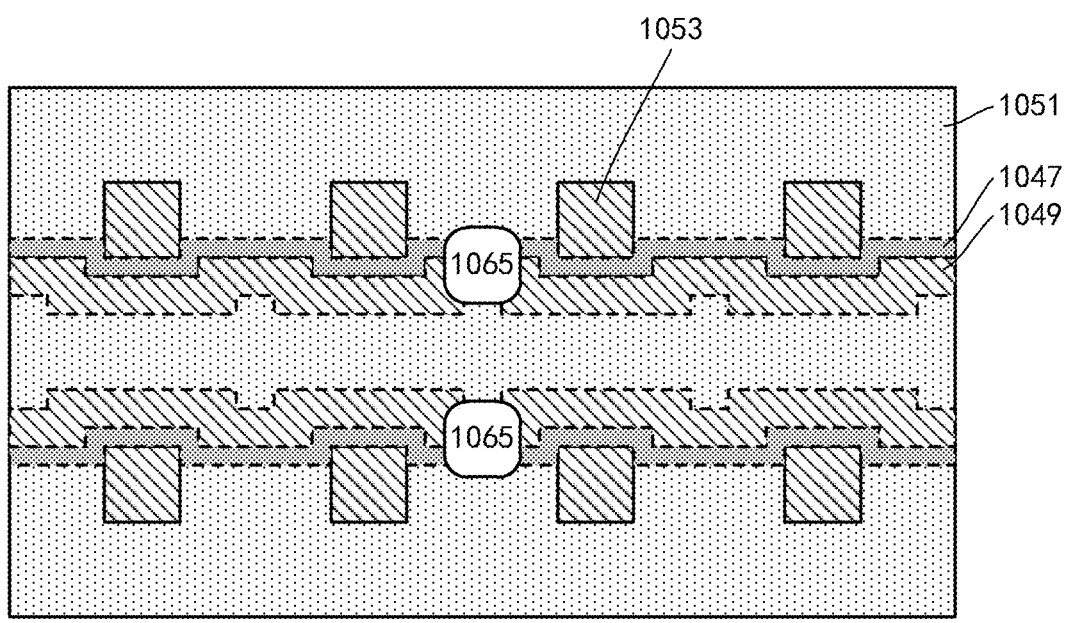
FIG. 28 is a schematic view showing an arrangement of word line contacts according to another embodiment of the present disclosure.

FIG. 28 is a schematic view showing arrangement of word line contacts according to another embodiment of the present disclosure. In the embodiment shown in FIG. 28, word line contacts to word lines of adjacent rows of memory cells are located between the same pair of adjacent columns of memory cells. This may reduce a number of columns of memory cells between which a spacing needs to be increased, so as to save area.

In the above embodiments, a mask is used (for photolithography) when the word lines are formed. According to an embodiment of the present disclosure, the word lines may be formed by only using a self-alignment process without using a mask.

FIGS. 29(a)-34 are schematic views showing some stages of a flow of manufacturing a semiconductor memory device according to another embodiment of the present disclosure.

Figure 29A:
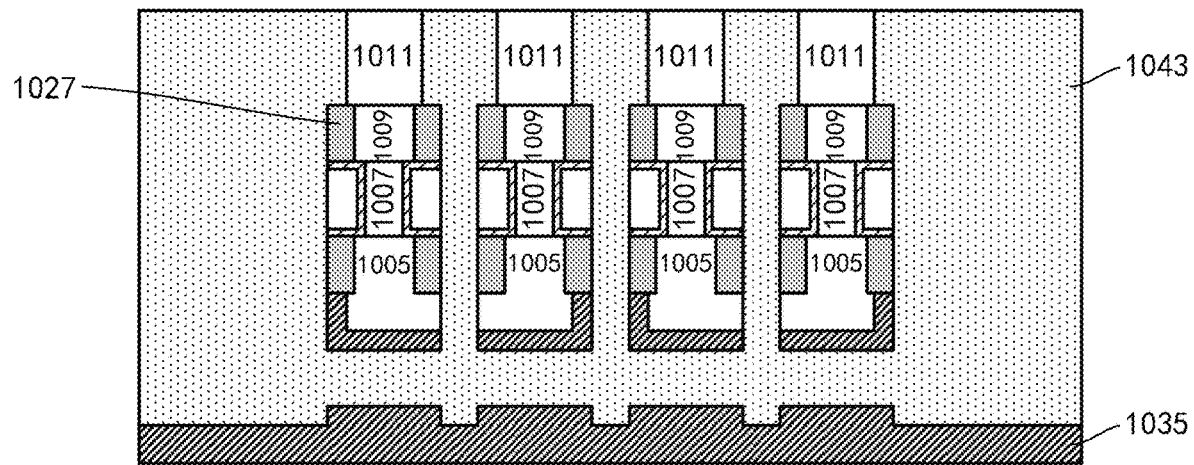
FIGS. 29(a)-34 are schematic views showing some stages of a flow of manufacturing a semiconductor memory device according to another embodiment of the present disclosure.
Figure 29B:
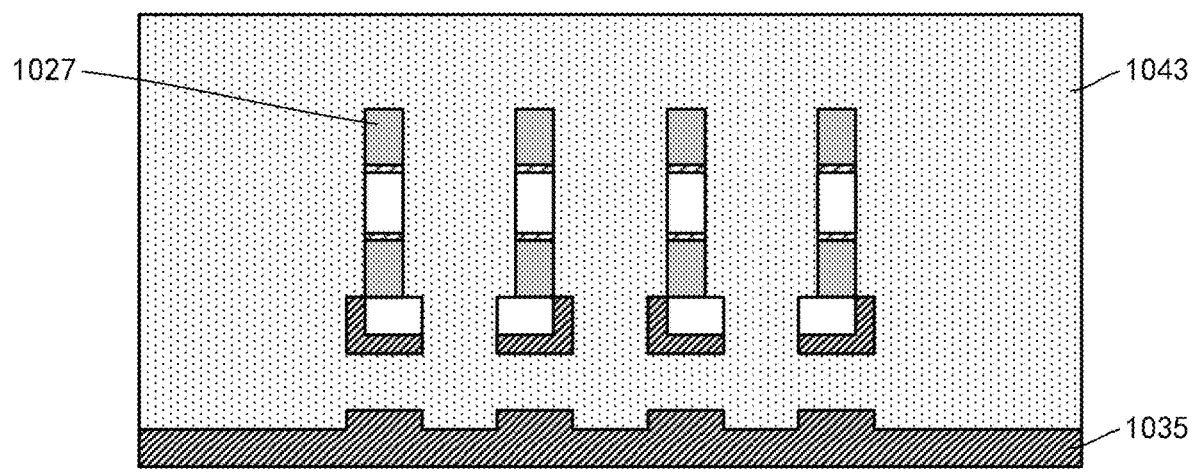
Figure 29C:
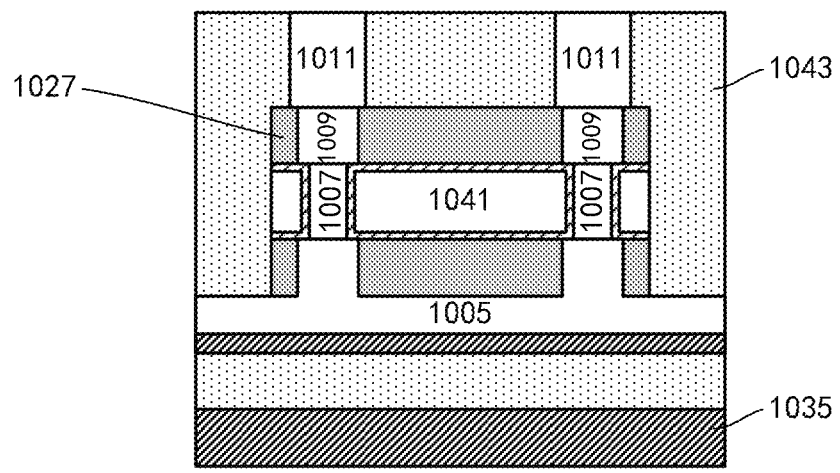
Figure 29D:
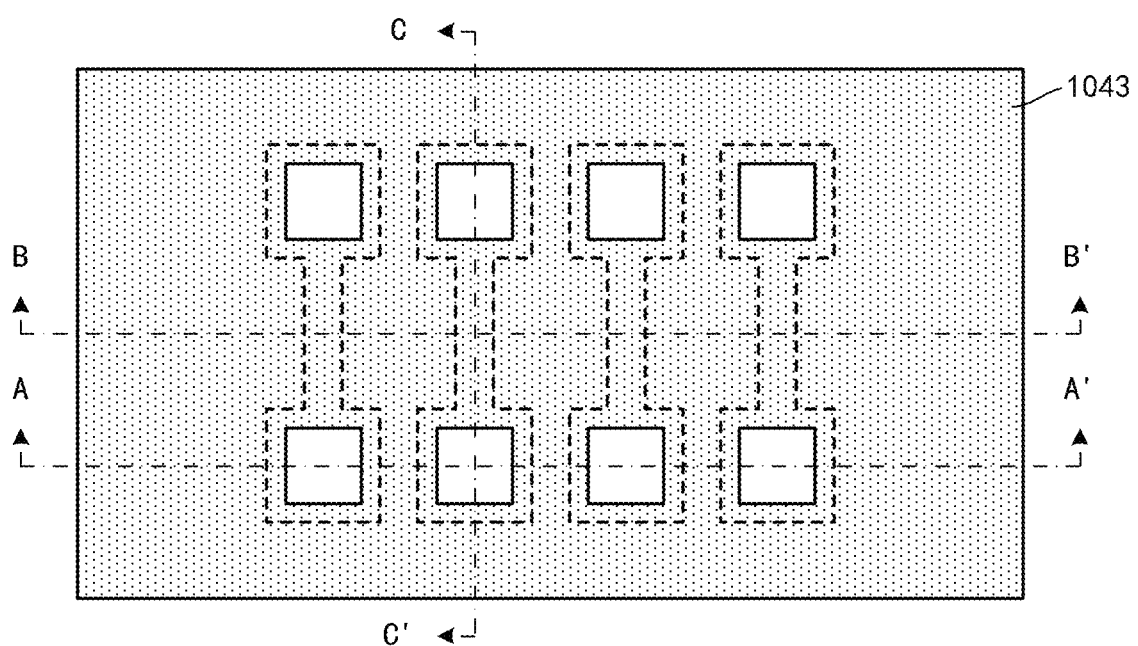

As shown in FIGS. 29(a), 29(b), 29(c), and 29(d) (FIGS. 29(a), 29(b), and 29(c) are sectional views, and FIG. 29(d) is a top view with line AA' indicating a position where the sectional view in FIG. 29(a) is taken, line BB' indicating a position where the sectional view in FIG. 29(b) is taken, and line CC' indicating a position where the sectional view in FIG. 29(c) is taken), the processes same as described above in connection with FIGS. 1 to 17(d) are performed, and then the dielectric layer 1043 is formed as described in conjunction with FIGS. 18(a), 18(b), 18(c) and 18(d). However, in this embodiment, the photoresist 1045 is not formed.

In addition, in this embodiment, a spacing between the columns of memory cells is less than that between the rows of memory cells. This can be done by appropriately setting a spacing between the spacers in the pattern transfer technique (in which a size of the sacrificial layer for forming the spacers may be adjusted).

Figure 30A:
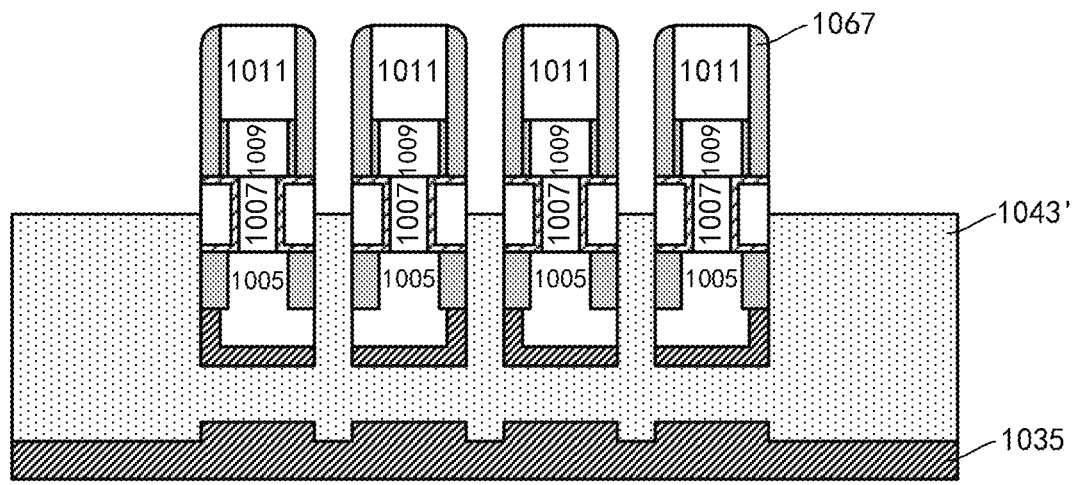
Figure 30B:
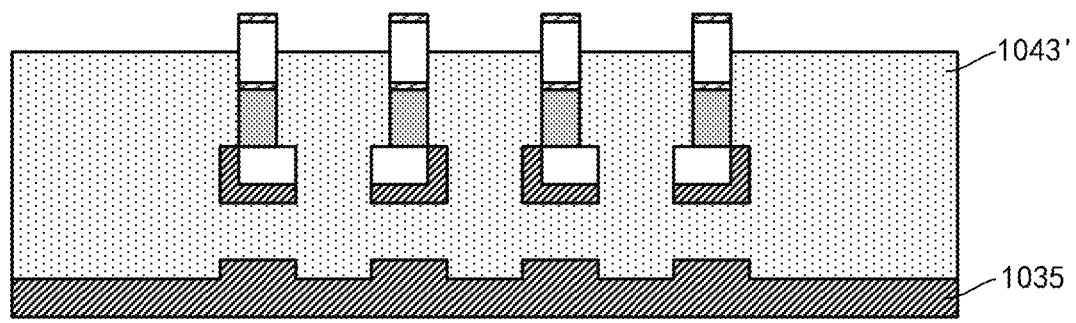
Figure 30C:
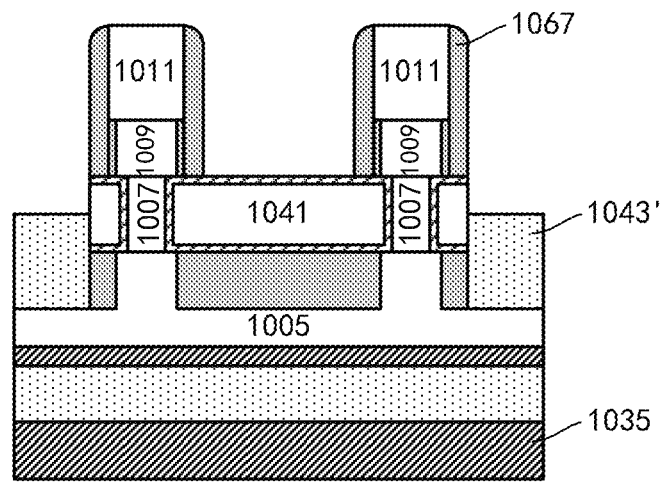

Then, as shown in FIGS. 30(a), 30(b), and 30(c) (FIGS. 30(a), 30(b), and 30(c) are sectional views taken along lines AA', BB', and CC' respectively), the dielectric layer 1043 may be etched back (the dielectric layer after being etched back is labeled as 1043'). The dielectric layer 1043' after being etched back may have a top surface lower than those of the gate stacks, so as to expose at least the top surfaces of the gate stacks (or a portion of the sidewalls of the gate stacks), so that the word lines formed later may be in contact with the gate stacks, particularly the gate conductor layers therein.

Thus, a series of vertical sidewalls (for example, the sidewalls of the hard mask layer 1011, the sidewalls of the gate stacks, and the sidewalls of the source/drain protection layer) are provided above the top surface of the dielectric layer 1043'. Conformal word lines may be formed on these vertical sidewalls.

Then, as described above, the protection layer 1027 may be selectively etched by, for example, RIE (which is, for example, stopped at the gate dielectric layer 1039) (in, for example, the direction substantially perpendicular to the substrate surface) so as to expose the gate stacks, particularly the bridge portions therein, so that the word lines may then be connected to the gate stacks, particularly the gate conductor layer 1041.

Likewise, to avoid unwanted electrical contact, isolation layers 1067 may be formed firstly on these sidewalls. As described above, the isolation layers 1067 may include low-k silicon carbide, and may be formed using the spacer formation process. In the examples of FIGS. 30(a), 30(b), and 30(c), the isolation layers 1067 in a form of spacers are not shown on the vertical sidewalls of the gate stacks, since, for example, a portion of the vertical sidewalls of the gate stacks which is exposed by the top surface of the dielectric layer 1043' is relatively low, and the isolation layers 1067 may not remain on these vertical sidewalls in the spacer formation process.

Figure 31A:
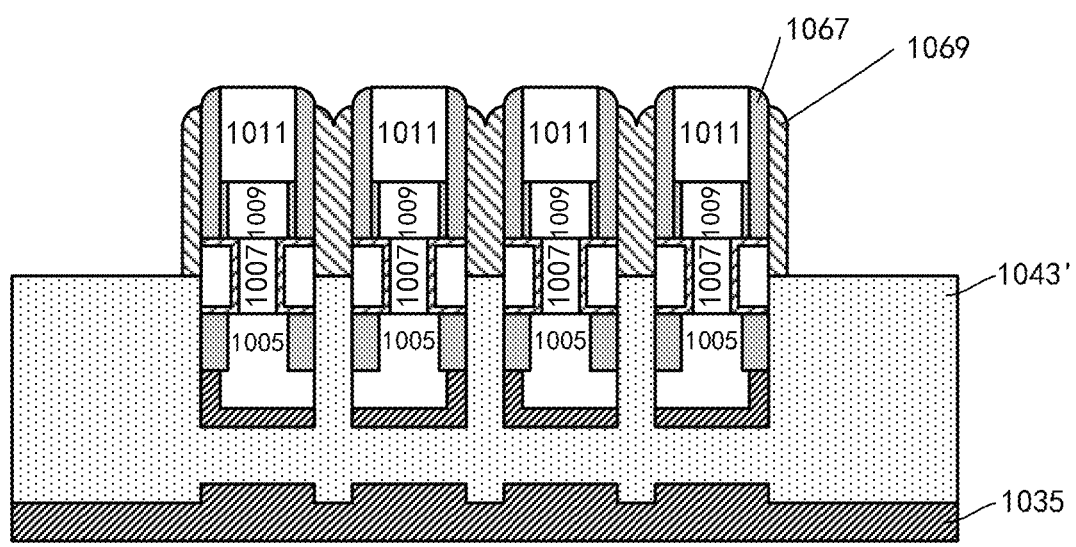
Figure 31B:
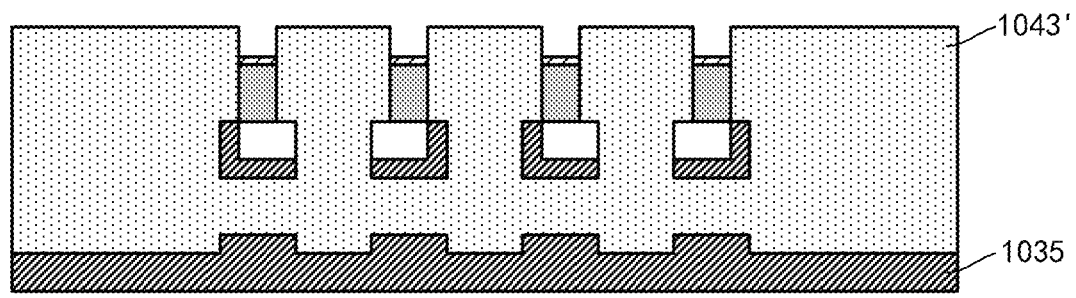
Figure 31C:
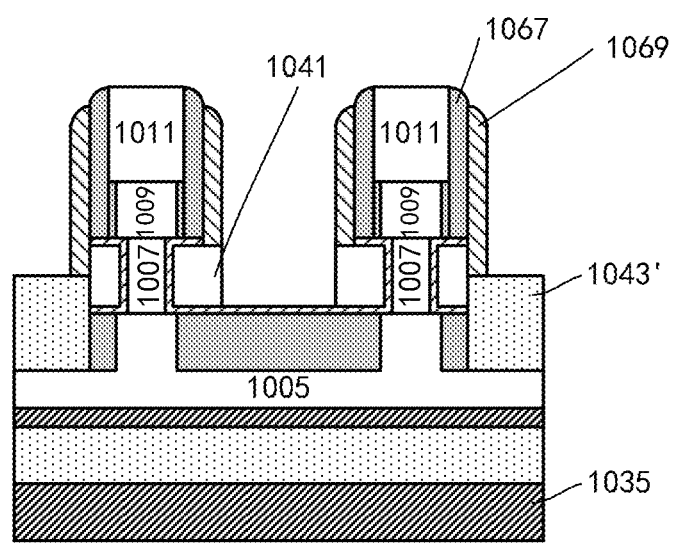
Figure 31D:
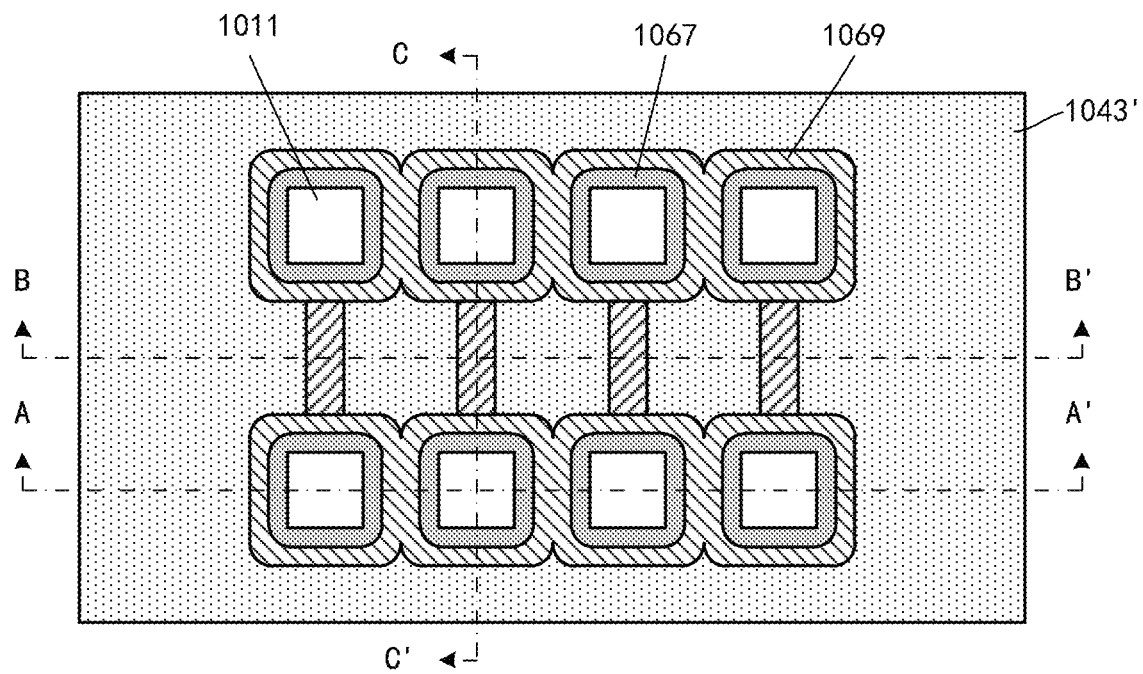

As shown in FIGS. 31(a), 31(b), 31(c), and 31(d) (FIGS. 31(a), 31(b), and 31(c) are sectional views, and FIG. 31(d) is a top view with line AA' indicating a position where the sectional view in FIG. 31(a) is taken, line BB' indicating a position where the sectional view in FIG. 31(b) is taken, and line CC' indicating a position where the sectional view in FIG. 31(c) is taken), the exposed portions of the gate dielectric layer 1039 may be selectively etched by, for example, RIE, to expose the gate conductor layer 1041. After that, word lines 1069 which are in contact with the gate conductor may be formed. For example, conductive spacers may be formed on the sidewalls of the dielectric spacers 1067 as the word lines 1069 using the spacer formation process as well.

Here, a thickness of the conductive spacers 1069 may be selected, so that the thickness is greater than ½ of a spacing between adjacent isolation layers 1067 in the row direction, but less than ½ of a spacing between the adjacent isolation layers 1067 in the column direction. Thus, in the row direction, the conductive spacers 1069 may be aggregated between adjacent memory cells to form the word lines extending in the row direction. Such word lines completely surround the respective memory cells.

In addition, the exposed portions of the gate conductor layer may be selectively etched by, for example, RIE, to isolate the gate stacks between different memory cells from each other. Thus, extensions of the gate conductor layer which extend outwards from the beneath of the hard mask layer are self-aligned below the bit lines.

In addition, it may be seen from FIG. 31(a) that the conductive spacers 1069 may also be formed to be in electrical contact with the vertical sidewalls of the gate stacks 1041. Therefore, according to another embodiment, even if the gate stacks, particularly the gate conductor layer 1041, do not have a portion which extends beyond the isolation layers 1067 as shown in FIG. 31(c), the conductive spacers 1069 may still be formed to be in electrical contact with the gate stacks 1041. Therefore, the above bridge portions may not be formed. For example, in the process of forming the hard mask layer 1011, portions of the first spacers 1017 which extend between the rows and portions of the etching stop layer 1013 which are located below the portions of the first spacers 1017 may also be etched away as shown in FIG. 6(a) and FIG. 6(b).

Figure 32A:
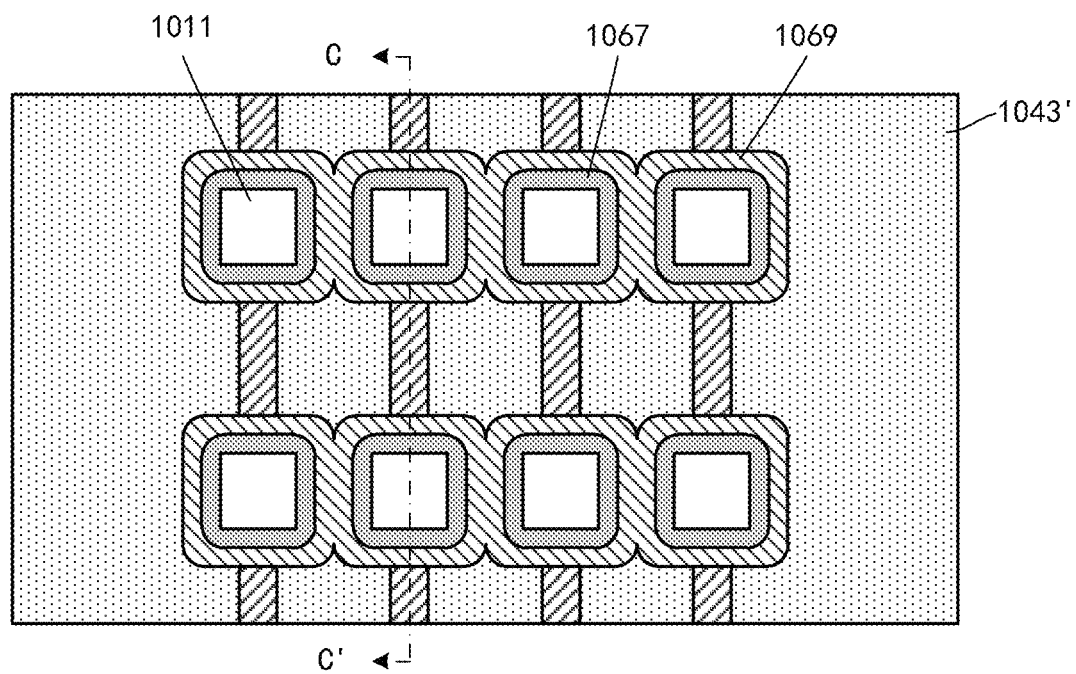
Figure 32B:
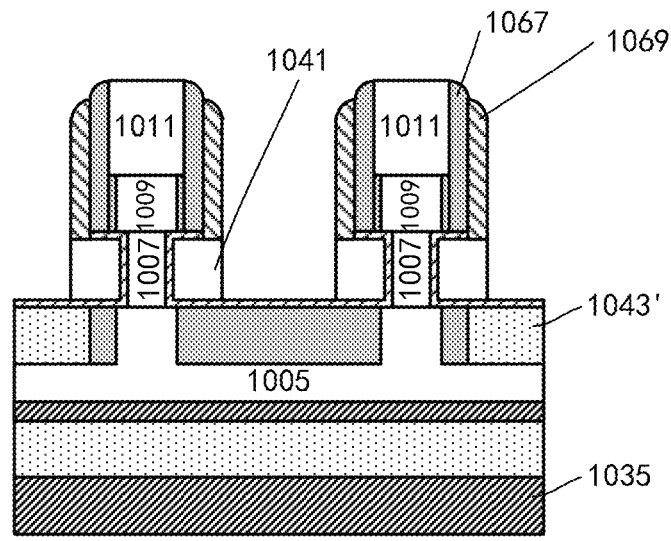

FIGS. 32(a) and 32(b) (FIG. 32(a) is a top view, and FIG. 32(b) is a sectional view taken along line CC' in FIG. 32(a)) shows an example in which bridge portions are formed on opposite sides of each row of memory cells. As shown in FIGS. 32(a) and 32(b), opposite sides of each of the word lines 1069 is, at a bottom surface, in contact with bridge portions of the gate conductor layer 1041, so that contact resistance between the word lines and the gate conductor layer may be reduced.

Figure 33A:
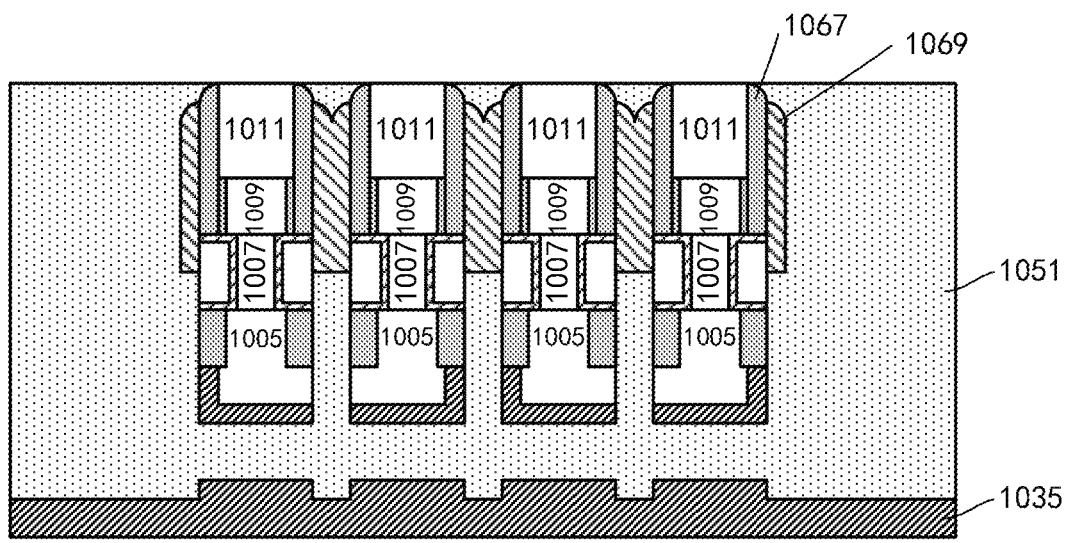
Figure 33B:
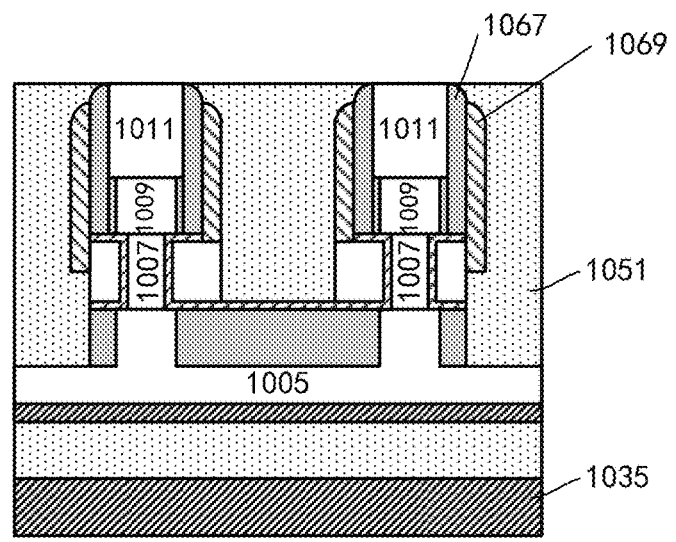

After that, various contacts of the device may be formed. For example, as shown in FIGS. 33(a) and 33(b) (FIGS. 33(a) and 33(b) are sectional views taken along lines AA' and CC' respectively), the gaps in the stacks may be filled with a dielectric for electrical isolation. Here, the filled dielectric is still oxide and is therefore shown as 1051 together with the above dielectric layer 1043'. In this regard, reference may be made to the above description in conjunction with FIGS. 22(*a*) and 22(*b*), for example.

Figure 34:
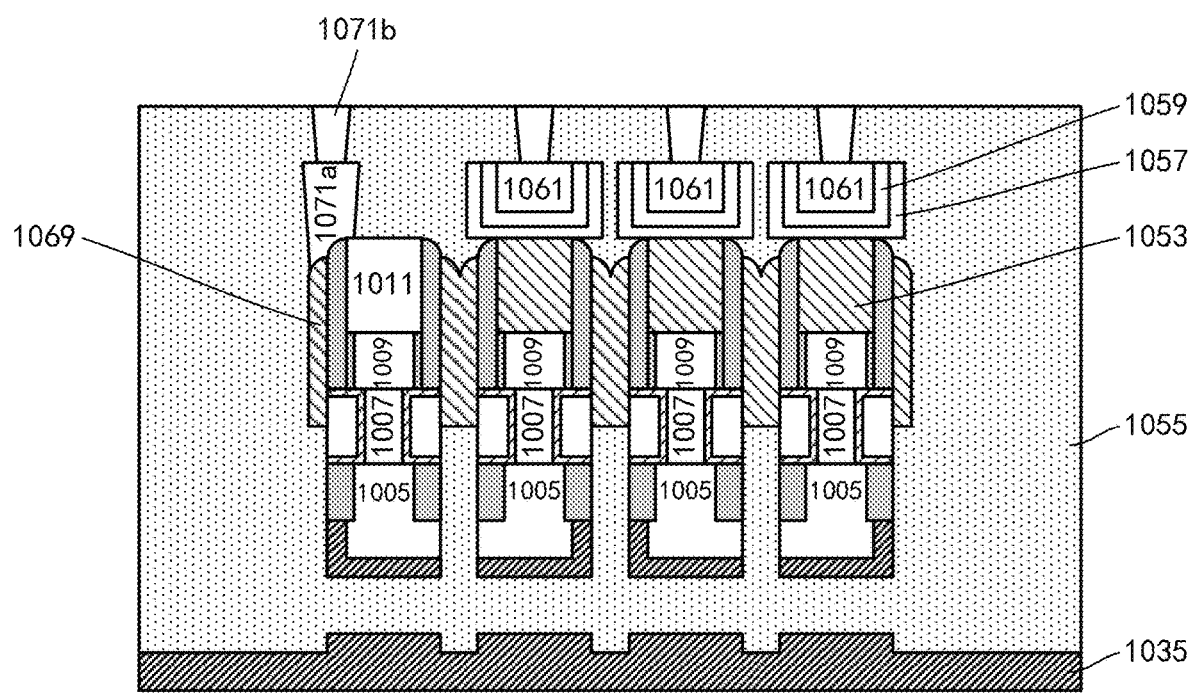

In addition, as shown in FIG. 34 (FIG. 34 is a sectional view taken along line AA'), memory elements such as capacitors and various contacts may be further formed. In this regard, for example, reference may be made to the above description in conjunction with FIGS. 23(*a*) and 23(*b*). In order to form word line contacts to the word lines, for the same row of memory cells, the hard mask layer 1011 in one or more of the memory cells may not be replaced (by, for example, covering the one or more memory cells when the hard mask layer 1011 is replaced), and then contacts 1071*a* and 1071*b* to the word lines 1069 surrounding the memory cells are formed at corresponding positions.

The semiconductor memory devices according to the embodiments of the present disclosure are applicable to various electronic devices. For example, the electronic device may include such a memory device and a processor, the processor may read/write data from/to the semiconductor memory device. The electronic device may further comprise components such as a display and a wireless transceiver or the like operatively coupled to the processor. Such an electronic device may be, for example, a smart phone, a computer, a tablet Personal Computer (PC), an artificial intelligence, a wearable device, a mobile power supply, or the like.

In the above descriptions, techniques such as patterning, etching or the like of various layers are not described in detail. It is to be understood by those skilled in the art that various technical measures may be utilized to form the layers, regions or the like in desired shapes. Further, in order to form the same structure, those skilled in the art can devise processes not completely the same as those described above. Although various embodiments are described respectively above, it does not mean that measures in various embodiments cannot be used in combination advantageously.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

I claim:

1. A semiconductor memory device, comprising:
a substrate;
an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region between the source/drain regions, and each of the memory cells further comprises a gate stack formed around a corresponding channel region;
a plurality of bit lines formed on the substrate, wherein each of the bit lines is located below a corresponding one of the columns of memory cells and is electrically connected to the lower source/drain regions of the respective memory cells in the corresponding column; and
a plurality of word lines formed on the substrate, wherein each of the word lines extends in a row direction and is electrically connected to gate conductors in the gate stacks of the respective memory cells in a corresponding row of memory cells, wherein each of the word lines comprises first portions extending along peripheries of the respective memory cells in the corresponding row of memory cells and second portions extending between the respective first portions, wherein the first portions of the word line extend in a substantially conformal manner with at least a portion of sidewalls of at least the upper source/drain regions of the respective memory cells.

2. The semiconductor memory device of claim 1, further comprising:
isolation layers provided between the respective word lines and the memory cells in the corresponding rows of memory cells, to electrically isolate the word lines from at least the upper source/drain regions of the respective memory cells,
wherein each of the word lines at least partially extends in a conformal manner with a corresponding one of the isolation layers.

3. The semiconductor memory device of claim 1, wherein the first portions of each of the word lines extend in a substantially conformal manner around a portion of sidewalls of at least the upper source/drain regions of the respective memory cells.

4. The semiconductor memory device of claim 3, wherein each of the word lines completely surrounds the sidewalls of at least the upper source/drain regions of the respective memory cells.

5. The semiconductor memory device of claim 2, wherein either one or both of the word lines and the isolation layers are in a form of a spacer.

6. The semiconductor memory device of claim 1, wherein between at least one pair of two adjacent rows of memory cells, there are provided two word lines corresponding to the two rows of memory cells in the at least one pair, respectively.

7. The semiconductor memory device of claim 6, wherein in each pair of the at least one pair of rows of memory cells, gate conductors of a first row of memory cells and gate conductors of a second row of memory cells each comprises extensions which extend towards each other in a direction towards positions between the two rows of memory cells to extend to potions under the corresponding word lines.

8. The semiconductor memory device of claim 7, wherein the extensions of the gate conductors of the respective memory cells in the same column of memory cells extend along the same straight line.

9. The semiconductor memory device of claim 1, wherein at least one row of memory cells has one corresponding word line at each of opposite sides thereof.

10. The semiconductor memory device of claim 9, wherein the gate conductors of memory cells in each of the at least one row of memory cells each comprises extensions which extend towards positions at opposite sides of the row of memory cells to extend to positions under the corresponding word lines.

11. The semiconductor memory device of claim 7, wherein end portions of the extensions of the gate conductors of the memory cells are aligned with vertical sidewalls of the respective word lines in a vertical direction.

12. The semiconductor memory device of claim 1, wherein each of the bit lines comprises a metal-semiconductor compound formed on surfaces of corresponding lower source/drain regions.

13. The semiconductor memory device of claim 12, wherein the metal-semiconductor compound comprises a metal element including Ni, Pt, Co, Ti, Si, Ge, or a combination thereof.

14. The semiconductor memory device of claim 12, wherein the metal-semiconductor compound is aligned with the lower source/drain regions of the respective memory cells in a corresponding column of memory cells.

15. The semiconductor memory device of claim 1, wherein lower portions of the lower source/drain regions of the respective memory cells in the same column of memory cells extend integrally.

16. The semiconductor memory device of claim 1, wherein the gate stacks of the respective memory cells are separated from each other and are substantially coplanar.

17. The semiconductor memory device of claim 1, wherein in the respective memory cells, the channel region and at least one of the source/drain regions have a crystal interface and/or a doping concentration interface therebetween.

18. The semiconductor memory device of claim 1, wherein the source/drain regions and the channel region comprise different semiconductor material layers.

19. The semiconductor memory device of claim 1, further comprising:
storage elements formed above the respective pillar-shaped active regions and are electrically connected to the respective source/drain regions at upper ends of the respective active regions.

20. The semiconductor memory device of claim 19, wherein the storage elements comprise capacitors.

21. The semiconductor memory device of claim 19, further comprising conductive plugs provided between the respective storage elements and the respective source/drain regions at upper ends of the respective active regions for electrically connecting the respective storage elements with the respective source/drain regions, wherein the respective conductive plugs are substantially centrally aligned with the respective source/drain regions at upper ends of the respective active regions.

22. The semiconductor memory device of claim 21, wherein the isolation layers are formed on sidewalls of the conductive plugs, and the word lines are formed on sidewalls of the isolation layers.

23. The semiconductor memory device of claim 1, wherein the gate stacks of the memory cells each comprise a floating gate configuration or a charge trapping layer or a ferro-electric material.

24. The semiconductor memory device of claim 1, wherein the channel regions comprise a single-crystalline semiconductor material.

25. The semiconductor memory device of claim 1, further comprising word line contacts to the respective word lines, wherein each of the word line contacts is provided between adjacent columns of memory cells.

26. The semiconductor memory device of claim 25, wherein the word line contacts to respective word lines of adjacent rows of memory cells are located between different pairs of adjacent columns of memory cells.

27. The semiconductor memory device of claim 25, wherein the word line contacts to respective word lines of adjacent rows of memory cells are located between the same pair of adjacent columns of memory cells.

28. A method of manufacturing a semiconductor memory device, comprising:
providing a stack of a sacrificial layer, a first source/drain layer, a channel layer, a second source/drain layer and a hard mask layer on a substrate;
patterning the stack to define a plurality of pillar-shaped active regions arranged in rows and columns in the first source/drain layer, the channel layer and the second source/drain layer;
removing the sacrificial layer and forming a plurality of bit lines extending below respective columns of active regions in a space left due to the removal of the sacrificial layer;
forming gate stacks around a periphery of the channel layer;
forming a dielectric layer on the substrate to fill gaps in the stack; and
forming a plurality of word lines in the dielectric layer, wherein each of the word lines extends in a row direction and is electrically connected to gate conductors in gate stacks of respective memory cells in a corresponding row of memory cells, wherein each of the word lines comprises first portions extending along peripheries of the respective memory cells in the corresponding row of memory cells and second portions extending between the respective first portions, wherein the first portions of the word line extend in a substantially conformal manner with at least a portion of sidewalls of at least the upper source/drain regions of the respective memory cells.

29. The method of claim 28, wherein the forming the word lines in the dielectric layer comprises:
forming trenches extending in the row direction between respective rows of the active regions in the dielectric layer, wherein sidewalls of the trenches comprise first portions extending between respective rows of the active regions and defined by the dielectric layer and second portions surrounding peripheries of the respective active regions in the respective rows and extending in a substantially conformal manner with at least a portion of sidewalls of the second source/drain layer, and the gate stacks in the respective rows are exposed in the trenches; and
forming the word lines in the trenches in a conformal manner with the sidewalls of the trenches, wherein each of the word lines is electrically connected to gate conductors in gate stacks of respective memory cells in a corresponding row.

30. The method of claim 29, wherein the word lines are formed in a form of conductive spacers.

31. The method of claim 28, wherein a spacing between respective columns of memory cells is less than a spacing between respective rows of memory cells, and the forming the word lines in the dielectric comprises:
etching back the dielectric layer so that the dielectric layer has its top surface below a top surface of the gate stacks so as to expose at least the top surface of the gate stacks;
forming the word lines in a form of conductive spacers on vertical sidewalls above the top surface of the dielectric layer, wherein the conductive spacers are aggregated with each other between adjacent memory cells in a column direction.

32. The method of claim 30, further comprising:
forming isolation spacers on the sidewalls of the trenches or the vertical sidewalls before the conductive spacers are formed.

33. The method of claim 28, wherein the patterning the stack further comprises:

forming, between at least one pair of adjacent rows of the active regions, bridge portions extending in the column direction between opposite active regions.

34. The method of claim 33, wherein for groups of every two adjacent rows of active regions, the bridge portions are formed between two rows of active regions in each group, and the bridge portions are not formed between adjacent groups.

35. The method of claim 33, wherein the bridge portions are formed at opposite sides of at least one row of the memory cells.

36. The method of claim 33, wherein the patterning the stack comprises:
forming a first sacrificial layer on the stack, wherein the first sacrificial layer comprises opposite sidewalls extending in the column direction;
forming a first spacer extending in the column direction on the sidewalls of the first sacrificial layer;
removing the first sacrificial layer;
forming a second spacer extending in the column direction on sidewalls at opposite sides of the first spacer;
forming a second sacrificial layer on the stack on which the first spacer and the second spacer are formed, wherein the second sacrificial layer comprises opposite sidewalls extending in a row direction;
forming a third spacer extending in the row direction on sidewalls of the second sacrificial layer;
retaining a portion of the second sacrificial layer between the at least one pair of adjacent rows of active regions, and removing remaining portions of the second sacrificial layer;
patterning the first spacer using the third spacer and the second sacrificial layer as a mask;
removing the remaining portions of the second sacrificial layer;
patterning the second spacer using the third spacer as a mask; and
removing the third spacer,
wherein the patterned second spacer and the patterned first spacer constitute a mask for patterning the stack.

37. The method of claim 33, wherein during the patterning process, the patterning of the first source/drain layer is stopped before reaching the bottom thereof, so that lower portions of the first source/drain layer remain extending continuously in the column direction, and
wherein the forming the bit lines comprises causing a surface portion of the first source/drain layer to react with a metal element to produce a conductive metal-semiconductor compound.

38. The method of claim 37, wherein the forming the bit lines comprises:
selectively etching the channel layer to remove bridge portions of the channel layer, so that vertical sidewalls of the channel layer are recessed with respect to vertical sidewalls of the hard mask layer, and forming a sacrificial gate in the recess and a space left due to the removal of the bridge portions;
selectively etching the first source/drain layer and the second source/drain layer to remove their respective bridge portions, so that vertical sidewalls of the second source/drain layer and the first source/drain layer are recessed with respect to the vertical sidewalls of the hard mask layer, and forming a source/drain protection layer in the recess and a space left due to the removal of the bridge portions;
cutting off the first source/drain layer and the sacrificial layer at positions between the respective columns of active regions;
for groups of every two adjacent columns of active regions, forming, between two columns of active regions in each group, a hold layer on the substrate to hold the two columns of active regions in the group and expose the sacrificial layer between the respective groups;
selectively etching the sacrificial layer to remove the sacrificial layer; and
causing an exposed surface of the first source/drain layer to react with a metal element in a space left due to the removal of the sacrificial layer to form the bit lines.

39. The method of claim 38, wherein the cutting off of the first source/drain layer and the sacrificial layer is performed in a self-alignment manner with respect to the active regions.

40. The method of claim 39, wherein the cutting off the first source/drain layer and the sacrificial layer comprises:
forming a mask layer on the stack, wherein the mask layer comprises a plurality of openings extending in the column direction, each of which exposes a position between respective columns of active regions, and exposes a portion of opposite sidewalls of the hard mask layer on active regions in adjacent columns of active regions; and
selectively etching the first source/drain layer and the sacrificial layer using the mask layer and the hard mask layer as a mask to cut off the first source/drain layer and the sacrificial layer.

41. The method of claim 40, wherein the mask layer comprises strip patterns extending above the respective columns of active regions, wherein each of the strip patterns exposes, on opposite sides thereof, a portion of sidewalls of the hard mask layer on active regions in a corresponding column, respectively.

42. The method of claim 33, wherein the forming the gate stacks comprises:
selectively etching the channel layer, so that sidewalls of portions of the channel layer in the respective active regions are recessed with respect to sidewalls of the hard mask layer, and portions of the channel layer at respective bridge portions are removed; and
forming the gate stacks in respective recesses which are formed by the sidewalls of the portions of the channel layer in the respective active regions with respect to the sidewalls of the hard mask layer and a space, in the bridge portions, left due to the removal of the channel layer.

43. The method of claim 42, wherein the word lines are formed in a form of conductive spacers, and the method further comprises:
cutting off the gate conductors in the gate stacks at the bridge portions using the conductive spacers as a mask.

44. The method of claim 33, further comprising:
selectively etching the hard mask layer to remove the bridge portions thereof; and
replacing the hard mask layer with conductive plugs.

45. The method of claim 44, further comprising:
forming a dielectric layer to cover the stack and the word lines; and
forming, in the dielectric layer, storage elements which are electrically connected to the conductive plugs respectively.

46. The method of claim 28, wherein the providing the stack comprises epitaxially growing the first source/drain layer, the channel layer, and the second source/drain layer respectively.

47. The method of claim 28, further comprising:
   forming word line contacts to the respective word lines at positions between adjacent columns of memory cells.

48. The method of claim 47, wherein the word line contacts to the respective word lines of adjacent rows of memory cells are formed between different pairs of adjacent columns of memory cells respectively.

49. The method of claim 47, wherein the word line contacts to the respective word lines of adjacent rows of memory cells are formed between the same pair of adjacent columns of memory cells.

50. An electronic device comprising the semiconductor memory device of claim 1.

51. The electronic device of claim 50, further comprising:
   a processor configured to read/write data from/to the semiconductor memory device; and
   a display and a wireless transceiver operatively coupled to the processor.

52. The electronic device of claim 50, wherein the electronic device comprises a smart phone, a computer, a tablet computer, an artificial intelligence device, a wearable device, or a mobile power supply.

* * * * *